(12) United States Patent
Pagani

(10) Patent No.: US 9,881,911 B2
(45) Date of Patent: Jan. 30, 2018

(54) ELECTRONIC SYSTEM HAVING INCREASED COUPLING BY USING HORIZONTAL AND VERTICAL COMMUNICATION CHANNELS

(71) Applicant: STMicroelectronics S.r.l., Agrate Brianza (IT)

(72) Inventor: Alberto Pagani, Nova Milanese (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 403 days.

(21) Appl. No.: 13/801,354

(22) Filed: Mar. 13, 2013

(65) Prior Publication Data

US 2013/0241025 A1    Sep. 19, 2013

(30) Foreign Application Priority Data

Mar. 19, 2012   (IT) ............... VI2012A0060

(51) Int. Cl.
*H01L 23/48* (2006.01)
*H01L 21/60* (2006.01)
(Continued)

(52) U.S. Cl.
CPC ...... *H01L 27/0203* (2013.01); *H01L 21/6835* (2013.01); *H01L 21/768* (2013.01); *H01L 23/3128* (2013.01); *H01L 23/48* (2013.01); *H01L 23/66* (2013.01); *H01L 24/06* (2013.01); *H01L 24/08* (2013.01); *H01L 24/09* (2013.01); *H01L 24/14* (2013.01); *H01L 24/19* (2013.01); *H01L 24/20* (2013.01); *H01L 24/30* (2013.01); *H01L 24/73* (2013.01); *H01L 24/94* (2013.01);
(Continued)

(58) Field of Classification Search
CPC ........ H01L 25/0652–25/0657; H01L 27/0203; H01L 24/09; H01L 24/06; H01L 24/73; H01L 23/48; H01L 23/3128; H01L 23/66; H01L 24/08; H01L 24/14; H01L 24/19; H01L 24/20; H01L 24/30; H01L 21/6835; H01L 24/94; H05K 1/181
USPC .................................. 257/495–505; 438/584
See application file for complete search history.

(56) References Cited

U.S. PATENT DOCUMENTS 5,646,446 A      7/1997  Nicewarner, Jr. et al.
6,172,874 B1 *   1/2001  Bartilson ...................... 257/686
(Continued)

OTHER PUBLICATIONS

Search Report for Italian application serial No. VI2012000060; Ministero Dello Sviluppo Economico, Munich, May 31, 2012, 2 pages.

*Primary Examiner* — Marcos D Pizarro
*Assistant Examiner* — Nelson Garces
(74) *Attorney, Agent, or Firm* — Gardere Wynne Sewell LLP

(57) ABSTRACT

An embodiment of an electronic system may be provided so as to have superior coupling by implementing a communication mechanism that provides at least for horizontal communication for example, on the basis of wired and/or wireless communication channels, in the system. Hence, by enhancing vertical and horizontal communication capabilities in the electronic system, a reduced overall size may be achieved, while nevertheless reducing complexity in PCBs coupled to the electronic system. In this manner, overall manufacturing costs and reliability of complex electronic systems may be enhanced.

4 Claims, 35 Drawing Sheets

(51) Int. Cl.
*H05K 7/20* (2006.01)
*H05K 1/00* (2006.01)
*H01L 25/11* (2006.01)
*H01L 27/02* (2006.01)
*H01L 21/768* (2006.01)
*H01L 25/065* (2006.01)
*H01L 23/31* (2006.01)
*H01L 23/66* (2006.01)
*H01L 23/00* (2006.01)
*H01L 21/683* (2006.01)
*H01L 25/10* (2006.01)
*H05K 1/18* (2006.01)
*H01L 21/66* (2006.01)
*H01L 21/56* (2006.01)
*H01L 23/498* (2006.01)

(52) U.S. Cl.
CPC .......... *H01L 24/95* (2013.01); *H01L 25/0657* (2013.01); *H01L 25/105* (2013.01); *H05K 1/181* (2013.01); *H01L 21/561* (2013.01); *H01L 21/568* (2013.01); *H01L 22/22* (2013.01); *H01L 23/49833* (2013.01); *H01L 24/05* (2013.01); *H01L 24/13* (2013.01); *H01L 24/16* (2013.01); *H01L 24/29* (2013.01); *H01L 24/32* (2013.01); *H01L 24/48* (2013.01); *H01L 2221/68304* (2013.01); *H01L 2223/6677* (2013.01); *H01L 2224/02313* (2013.01); *H01L 2224/02319* (2013.01); *H01L 2224/02321* (2013.01); *H01L 2224/02371* (2013.01); *H01L 2224/0401* (2013.01); *H01L 2224/04105* (2013.01); *H01L 2224/05569* (2013.01); *H01L 2224/06187* (2013.01); *H01L 2224/08137* (2013.01); *H01L 2224/08146* (2013.01); *H01L 2224/12105* (2013.01); *H01L 2224/13024* (2013.01); *H01L 2224/14183* (2013.01); *H01L 2224/16145* (2013.01); *H01L 2224/16225* (2013.01); *H01L 2224/16227* (2013.01); *H01L 2224/211* (2013.01); *H01L 2224/2105* (2013.01); *H01L 2224/28105* (2013.01); *H01L 2224/29024* (2013.01); *H01L 2224/30183* (2013.01); *H01L 2224/32145* (2013.01); *H01L 2224/32227* (2013.01); *H01L 2224/48091* (2013.01); *H01L 2224/48175* (2013.01); *H01L 2224/73207* (2013.01); *H01L 2224/73215* (2013.01); *H01L 2224/73251* (2013.01); *H01L 2224/82106* (2013.01); *H01L 2224/94* (2013.01); *H01L 2224/95* (2013.01); *H01L 2225/06531* (2013.01); *H01L 2225/06541* (2013.01); *H01L 2225/06555* (2013.01); *H01L 2225/06565* (2013.01); *H01L 2225/06568* (2013.01); *H01L 2225/06572* (2013.01); *H01L 2225/06596* (2013.01); *H01L 2225/107* (2013.01); *H01L 2225/1023* (2013.01); *H01L 2225/1064* (2013.01); *H01L 2924/00014* (2013.01); *H01L 2924/12042* (2013.01); *H01L 2924/15159* (2013.01); *H05K 1/189* (2013.01); *H05K 2201/10515* (2013.01); *Y02P 70/611* (2015.11)

(56) References Cited

U.S. PATENT DOCUMENTS

| | | | |
|---|---|---|---|
| 6,450,704 B1* | 9/2002 | O'Connor et al. | 385/92 |
| 6,473,308 B2* | 10/2002 | Forthun | 361/749 |
| 6,815,254 B2 | 11/2004 | Mistry et al. | |
| 7,923,290 B2 | 4/2011 | Ko et al. | |
| 8,008,121 B2* | 8/2011 | Choi et al. | 438/107 |
| 2005/0040508 A1 | 2/2005 | Lee | |
| 2010/0038765 A1* | 2/2010 | Byun et al. | 257/686 |
| 2010/0018767 A1 | 7/2010 | Suh et al. | |
| 2011/0115078 A1* | 5/2011 | Jeong et al. | 257/737 |
| 2012/0153450 A1* | 6/2012 | Kim | 257/686 |

* cited by examiner

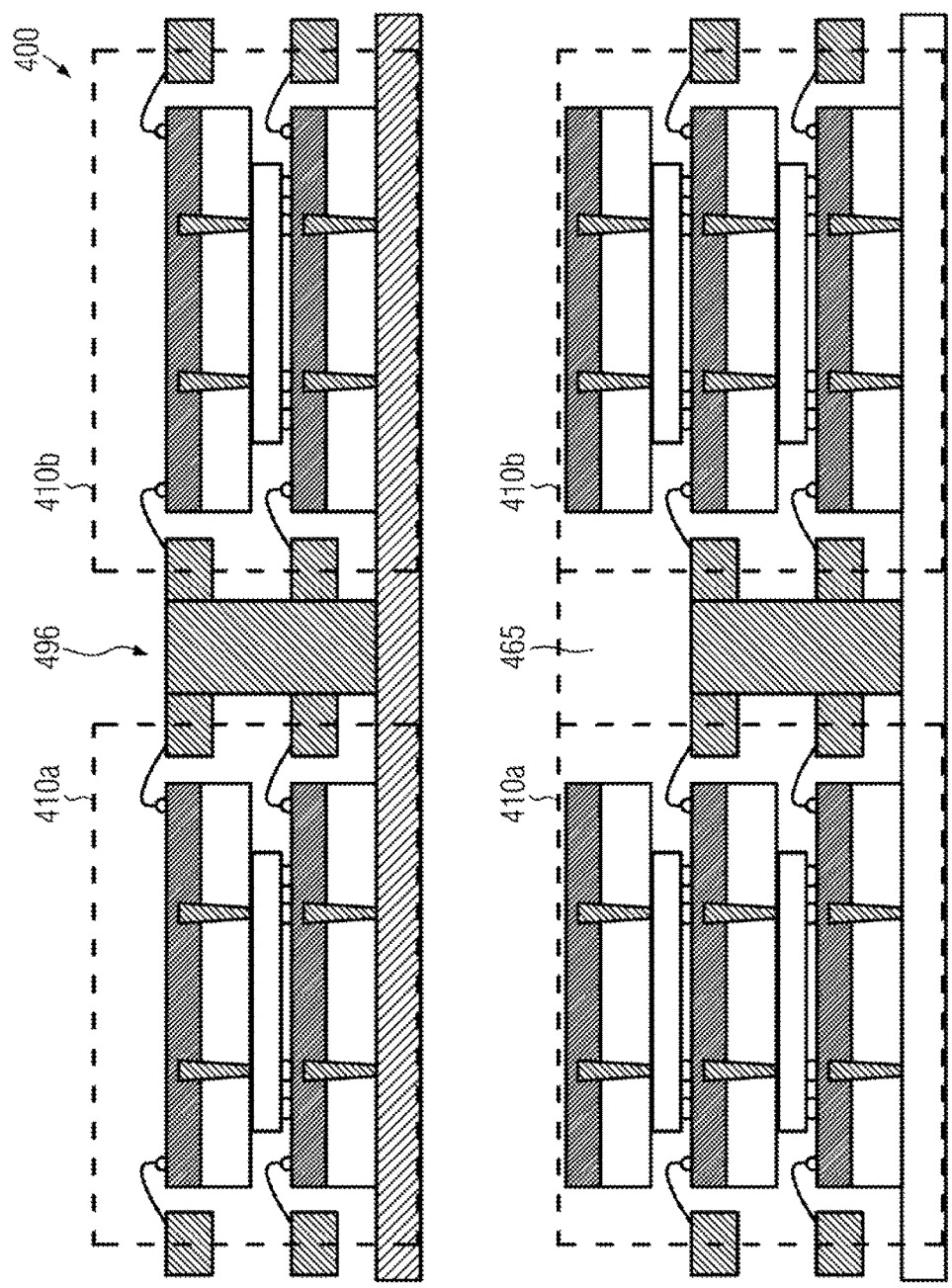

ELECTRONIC SYSTEM HAVING INCREASED COUPLING BY USING HORIZONTAL AND VERTICAL COMMUNICATION CHANNELS

PRIORITY CLAIM

The instant application claims priority to Italian Patent Application No. VI2012A000060, filed Mar. 19, 2012, which application is incorporated herein by reference in its entirety.

TECHNICAL FIELD

Generally, an embodiment relates to packaging and assembly processes of electronic systems that include one or more integrated circuits (ICs).

SUMMARY

Immense progress has been made in the field of semiconductor production techniques by steadily reducing the critical dimensions of circuit elements, such as transistors, in highly complex integrated circuits. For example, critical dimensions of 30 nm or less have been implemented in highly complex logic circuitry and memory devices, thereby achieving high integration and packing density. Consequently, more and more functions may be integrated into a single semiconductor chip, thereby providing the possibility of forming entire systems on chip so that highly complex electronic circuits may be formed on the basis of a common manufacturing process.

Typically, upon increasing the complexity of an integrated circuit provided on a single semiconductor chip, the input/output (IO) capabilities also are increased in order to address the demands for communication with peripheral circuits in complex electronic systems. Typically, a semiconductor chip is coupled to an appropriate substrate, which belongs to a container or package, which may impart superior thermal and mechanical integrity to the semiconductor chip and which may also represent an appropriate interface so as to provide an electrical coupling from the integrated circuit to a peripheral electronic component, such as a printed circuit board (PCB), which in turn may have any appropriate configuration so as to represent a part of an overall complex electronic system. Frequently used contact technologies for coupling the semiconductor chip with a package include wire bonding or direct electrical coupling of appropriately designed contact structures provided on the semiconductor chip and the package substrate. For example, in the case of direct contact, solder balls, solder bumps, contact pads, or any other appropriate contact elements in the form of metal pillars and the like may be provided in appropriate metallization systems of the semiconductor chip and the package in order to establish a reliable electrical and mechanical coupling upon attaching the semiconductor chip to the package substrate.

Although the packing density of complex integrated circuits has been significantly increased due to the reduction of the critical dimensions, as discussed above, the volumetric packing density of packages has not been increased in a similar proportion, since for higher complexity of the integrated circuits, in which basically a two dimensional complex arrangement of circuit elements is provided, a correspondingly highly complex routing system is used in the package so as to finally appropriately couple to a PCB in order to combine the various components of a complex electronic system. To increase the volumetric packing density of a package, it has been proposed to provide three-dimensional chip systems, in which two or more semiconductor chips may be provided in a stacked configuration within a single package, thereby significantly increasing the volumetric packing density for a given dimension of the package.

The three-dimensional configuration of the semiconductor chips, however, may require appropriate routing strategies in order to establish electric communication between the individual electronic circuits provided in the various semiconductor chips. Furthermore, generally the complexity of the routing arrangement in the package may also increase in order to provide the required input/output capabilities for coupling the package to other components, such as other packages and external electronic components of the electronic system under consideration. Typically the configuration of the contact structure of integrated circuits, which is designed for being implemented into a three-dimensional package configuration, may also significantly affect the entire design of the semiconductor chip as well as any related processes, such as the electrical test of individual semiconductor chips. Furthermore, overall functionality of semiconductor chips may depend on the characteristics of a three-dimensional package configuration, since, for instance, generally an increased length of electrical couplings may affect the high frequency behavior of complex systems, while also the thermal and mechanical constraints may have an influence on the finally obtained performance characteristics of a three-dimensional electronic system.

As shown in FIG. 1a integrated circuits (IC) 102a, . . . , 102d are typically formed on the basis of an appropriate semiconductor substrate 101, such as a silicon substrate, or any other appropriate carrier material. Each of the ICs 102a, . . . , 102d may include at least one electronic circuit, such as complex digital circuitry, possibly in combination with memory areas, analog circuitry, power circuitry, or any combination and the like. The individual portion 102 of the semiconductor substrate may include a plurality of integrated circuits, which will be referred to as semiconductor chips 102a, . . . , 102d after dicing the substrate 101, and are provided in array form on the carrier material with appropriately dimensioned scribe lines 104 separating the individual semiconductor die, which in turn may be enclosed by a metal region 103, usually referred to as seal ring or guard ring. The seal ring may provide for mechanical integrity during the separation of the semiconductor substrate 101. The scribe lines 104 may include appropriate test structures 105, which may be used for controlling and monitoring the overall process quality of the various manufacturing processes involved. Consequently, at a final stage of processing the semiconductor die disposed on a wafer, electrical tests may be performed by using the test structures 105 (TEG: Test Element Group) provided in the scribe lines 104 and also electrical tests may be performed with the individual semiconductor die prior to separating the carrier material into individual semiconductor chips.

As a consequence, the integrated circuits 102 are designed so as to achieve the required functionality in combination with a high die-internal integration density, thereby reducing the overall dimension of the semiconductor die and allowing the fabrication of an increased number of integrated circuits on a single substrate. Furthermore, the design and manufacturing flow for fabricating the integrated circuits on the semiconductor substrate 101 are optimized such that the final electrical tests on a wafer basis may be performed with a desired high efficiency and fault coverage prior to incorporating the individual semiconductor chips into an appropriate package.

As is well-known, a general electronic system is coupled to the outside world by means of couplings/wired channels, such as cables or wires, optical fibers, etc., or by means of wireless channels of an electromagnetic type. Such couplings allow for exchanging information signals and/or supplying power/energy.

At the lowest level of an electronic system, couplings of circuit elements within a single semiconductor chip are established by providing conductive lines and an appropriate metallization system including vertical couplings or vias and horizontal metal lines, wherein in complex integrated circuits a plurality of metallization layers are stacked in order to provide the required electrical couplings between the individual circuit elements. The intercoupling of different semiconductor chips and of semiconductor chips within a package is typically accomplished by providing appropriately dimensioned and positioned contact pads, for instance, at the last the metallization layer of the metallization system of a semiconductor device. Hence, such contact pads represent terminals or interfaces, which may couple to any other electronic components, such as a package substrate, on the one hand, and may couple to metal lines and vias of the metallization system so as to finally couple to the individual circuit elements according to the required circuit layout.

The electrical coupling between a contact pad of the device and a system component may be implemented by wire bonding or bumps, i.e., protruding conductive elements used for contact, which are directly coupled to the pad.

In the case of the SiPs (System in package), extremely complex configurations may arise due to the complexity of the electrical couplings of the various parts, i.e., ICs, passive components, PCB, etc., of the system. Consequently, great efforts are being made for obtaining a compact contact structure in order to reduce the overall size of packages that may include one or more individual semiconductor chips.

For example, U.S. Pat. No. 6,815,254, which is incorporated by reference, refers to the general issue of packaging complex semiconductor devices. In this document it is considered an important problem that packages of semiconductor devices generally allow access to the internal semiconductor chip only from a bottom side of the package. In particular when providing stacked semiconductor chips in a package, appropriately designed contact structures are provided. Furthermore, due to the sophisticated manufacturing techniques and test procedures performed on a wafer basis, generally high-production yield may be obtained, wherein, however, upon packaging two or more semiconductor chips into a single package, any rework or modification of the packaged semiconductor device is typically not possible, thereby increasing the probability of obtaining reduced production yield in a very late stage of the overall fabrication process.

In order to address the above-identified problems, it is suggested in this document to provide a package assembly that includes an intervening package that may be coupled to a first package from a first substrate on the first side of the package and may be coupled to a second package from a second substrate on a second opposing side of the package. The electrical contact from one side of the intervening package to the other side may be established by bypassing the semiconductor chip. That is, an appropriate contact structure is provided within the package that allows electrical coupling between two opposite sides of the semiconductor package without contacting the semiconductor chip.

Although this concept may provide for superior coupling within the semiconductor package, it appears, however, that the coupling is only enhanced in the vertical direction at the cost of horizontally increasing the dimensions of the first and second substrates in order to allow wire bonding for coupling the semiconductor chip within the package to a package substrate and to accommodate the additional vertical couplings, which provide for the direct electrical coupling between the first and second substrates without contacting the semiconductor chip. Furthermore, a further area may be required for the routing within the first and second substrates.

The U.S. Pat. No. 7,923,290 B2, which is incorporated by reference, relates to manufacturing techniques that address the demands for increased miniaturization of components, greater packaging density of integrated circuits, superior performance, and reduced costs for complex electronic devices, in particular with respect to portable information and communication devices, such as cellular phones, personal data assistants (PDAs), camcorders, notebook computers, and the like. As stated in this document, new solutions may be required with respect to conventional semiconductor packages, in which a semiconductor die is molded into a package with resin, wherein numerous package approaches have been proposed, such as a stacked configuration of multiple integrated circuit die, package in package (PIP), stacked package configurations, or package on package (POP), or any combinations thereof.

Basically, this document proposes a solution in which an integrated-circuit packaging system is formed by providing a pre-formed interposer with a through-hole via above a semiconductor chip and a support structure in order to couple the semiconductor chip with a substrate positioned below the semiconductor chip and with a further package provided above the interposer. On the other hand, the additional support structure provides for direct contact between the bottom substrate and the additional package without requiring direct contact of the semiconductor chip. This is a configuration of the type PoP (Package on Package) and, thus, the area occupied by the package is dominated by the chip with the largest dimensions. The presence of the support structure increases the dimensions of the package. Moreover, in this concept all intercouplings are finally rooted to the bottom surface of the lower package for being coupled to a PCB. Furthermore, the routing within the semiconductor chip is implemented on the basis of a TSV (through-silicon via or through substrate via) approach of the "via last" type, which, thus, requires the formation of the vias through the entire IC.

The U.S. Pat. No. 5,646,446, which is incorporated by reference, aims at improving density in packaging so as to allow full performance potential of intercoupled chips. As stated in this document, typical integrated-circuit packages may contain only one chip, wherein the package is substantially larger than the chip, thereby significantly restricting the overall packaging density. These conventional packaging systems based on a printed circuit board with single chip packages are inappropriate to provide a desired high number of chips within a volume and weight compatible with the demands of advanced circuit applications. In order to address these problems, it is suggested in this document to provide a three-dimensional flexible assembly of integrated circuits, wherein a folded flexible substrate with integrated-circuit chips is provided. According to the proposed solution, mechanically and electrically functional attachment of integrated-circuit chips to one or both sides of the flexible substrates is accomplished by using a flip chip technique.

Hence, in this approach, a flexible printed circuit is used for coupling the various ICs in a vertically stacked configuration. Moreover, in this approach, all intercouplings are finally rooted to the bottom surface of the package for being coupled to a PCB.

In patent application US 2010/0187676, which is incorporated by reference, the problem of reduced coupling in semiconductor packages is addressed by providing a cube semiconductor package. The package includes a semiconductor-chip module including a semiconductor chip having a first surface, a second surface opposite to the first surface, and side surfaces, wherein bond pads are placed on the first surface, and through-electrodes are provided, which pass through the first and second surfaces. Moreover, redistribution lines are placed at least on the first and/or second surface and are electrically coupled with the through-electrodes and the bond pads. End portions of the redistribution lines are flush with the side surfaces.

Furthermore, coupling members, such as solder bumps, are placed on the side surfaces and are electrically coupled with the ends of the redistribution lines. In this document are described, with reference to FIGS. 1 to 4, various examples of a cube semiconductor package, in which a side surface of the semiconductor chip is used as a contact area coupled to the chip internal circuit elements by the redistribution lines, which in turn are formed on an insulation layer that is provided on a top surface of the semiconductor chip.

In some examples as described with reference to FIGS. 1 and 2, the solder bumps at the side surface turn out to be very small due to the thickness of the metal of the redistribution lines. In addition, the semiconductor chip is separated from the semiconductor substrate, as also discussed above, so that typically a non-perfect side surface is generated during the dicing of the semiconductor substrate, thereby also restricting the degree of alignment of the solder bump formed on the side surface. That is, the solder bumps formed on the side surface may not be appropriately aligned with each other. It is, therefore, very difficult to assemble and laterally couple two ICs lying on the same plane, and such a coupling turns out to be barely reliable, and may carry low levels of current.

Furthermore, the through-electrodes are made of a conducting material and extend through the semiconductor chip, without addressing the problem of an insulation between the through-electrodes and the substrate of the semiconductor chip, which is generally conductive with a resistivity of fractions of ohm*cm or more. Therefore, the through-electrodes may form short-circuits or leakage paths to the substrate of the semiconductor chip.

In other embodiments described in this document with reference to FIGS. 3 and 4, the contact area between the solder bumps and the redistribution lines at the side surface may be enhanced by providing extension parts of the redistribution lines. That is, the extension parts are provided on the side surface of the semiconductor chip in order to increase the dimensions of the contact area between the solder bump and the metal of the redistribution layer. However, no electrical insulation between the extension part and the side surface of the semiconductor chip is provided. It appears that the insulation layer is only present on top of the surface of the semiconductor chip.

As known, the semiconductor chip may have test structures (TEG) in the scribe lines, as discussed above with reference to FIG. 1a of the present patent application. For this purpose, some metal regions may be exposed laterally at the semiconductor chip after the dicing of the wafer. Consequently, such laterally exposed metal regions may come into contact with the extension parts, thereby possibly forming short-circuits and/or leakage paths.

Furthermore, such test structures (TEG) are typically formed on the substrate of the semiconductor chip, which, as said before, is usually conducting and is usually grounded.

Consequently, since a proper lateral insulation between the extension parts and the side surface of the semiconductor chip is lacking, the system is unreliable and short circuits may arise with the substrate or leakage paths may form with the substrate or other circuits (portions of TEGs circuits) or between the different extension parts. Therefore, the system may not work correctly, or may exhibit reduced reliability. Moreover, any technical advice as to how the extension parts could be formed on the side surface is not provided in this reference. Hence, also coupling between a semiconductor chip and a package extended to the side surface of the semiconductor chip, the solution proposed in this reference may result in reduced reliability.

Furthermore, in very complex electronic systems including a plurality of packages, each of which may include one or more semiconductor chips, the couplings of the various packages are distributed in the horizontal direction due to the required routing layout for the various components on one PCB. The various PCBs are then coupled to each other.

FIG. 1b schematically illustrates a cross-sectional view of an electronic system 100, in which semiconductor chips 102a, 102b and 102c are disposed in corresponding packages 110a, 110b, 110c, wherein coupling of the semiconductor chips with the corresponding packages is established by means of a corresponding contact structure 106a, 106b, 106c, which is shown in the form of a direct coupling, while in other cases, alternatively or additionally a wire-bond contact structure may be provided. On the other hand, the various packages communicate with a respective PCB, such as PCBs 130a, 130b by means of the corresponding package substrates 111a, 111b, 111c in combination with a corresponding contact structure 112a, 112b, 112c. As discussed above, in the corresponding PCBs, appropriate horizontal wiring networks, which are generally indicated as 131a, 131b, are provided so as to couple the various components of the electronic system 100. In the example shown, the PCB 130b provides the wiring network 131b so as to appropriately couple to the packages 110b, 110c. On the other hand, the PCB 130a provides the lateral routing so as to couple to the package 110a. Furthermore, both PCBs 130a, 130b additionally include horizontal routing resources so as to couple to a vertical coupling 132, which is configured to enable the coupling of the individual PCBs 130a, 130b.

Increasing the number of semiconductor chips in the package helps to reduce the dimension of the whole system. However, the substrate of the package couples the various ICs in the package to the other system components external to the package. This makes the routing extremely complicated, which often requires increasing the number of layers of the PCB and of the package substrate besides requiring an increase of the area occupied by the package substrate.

FIG. 1c schematically illustrates a cross-sectional view of the electronic system, wherein the package 110a includes two integrated circuit chips, thereby requiring a more complex contact structure 106 a so as to couple to the package substrate. Furthermore, the complexity of the contact structure 112a also increases, thereby also requiring a more complex horizontal wiring network 131a in the bottom PCB 130a. Although the overall size of the electronic system 100 in FIG. 1c may be reduced compared to the system 100 of FIG. 1b, increased complexity of the PCB 130a may render this solution less attractive.

Current packaging architectures are limited due to the fact that the coupling of the ICs and the package develops in the vertical direction, and this often requires the routing between the various packages to increase in a substantially horizontal direction. Indeed, all intercouplings are brought to the bottom surface of the package for being coupled to a PCB and, when necessary, a part of intercouplings is also routed to the top surface for being coupled to an upper package (PoP).

Furthermore, for coupling the various PCBs, couplers and cables are used which increase the volume of the total system. Hence, with increasing complexity of the electronic system, the volume of the system may increase even in an over-proportional manner.

Also in the case of 3D integration in semiconductor chips by means of TSV, the coupling of the various ICs is extended in a vertical direction.

FIG. 1d schematically illustrates a cross-sectional view of an electronic system 100, in which a plurality of semiconductor die 102a, 102b, 102c are directly coupled by forming a vertically arranged stack of semiconductor chips, which may bonded to each other face to face or face to back or back to back, and the like. In the example shown, the semiconductor chip 102a includes a substrate 108a, above which is provided an appropriate multilevel metallization system which is bonded to the semiconductor chip 102b, i.e., to the metallization system of the semiconductor chip, thereby establishing a face to face coupling. On the other hand, the substrate 108b of the semiconductor chip 102b includes an appropriate contact structure coupling to the metallization system and also to the bottom of the thinned substrate 108b so as to couple to the metallization system of the semiconductor chip 102c, thereby implementing a face-to-back coupling. On the other hand, an appropriate contact structure on the basis of through-hole vias 106v may also be present at the back side of the thinned substrate 108 of the semiconductor chip 102c, thereby enabling coupling to a corresponding package substrate.

Summarizing the above-described approaches that may be encountered in conventional electronic systems, it may be pointed out that generally, coupling in the packaging develops in a vertical direction, whereas in the PCBs the coupling increases in complexity in a horizontal direction, while in some cases the coupling provided on the basis of a side surface of an IC may suffer from reduced production yield and reliability.

An embodiment further reduces the dimensions of a generic, in particular, of complex electronic, system by increasing the coupling of the ICs and/or of the packages.

Generally, an embodiment provides electronic systems and corresponding manufacturing techniques, in which coupling of integrated circuits (ICs) and/or packages used for accommodating the integrated circuits is increased by designing the components such that coupling is imparted both in the vertical direction and in the horizontal direction, thereby realizing communication between integrated-circuit chips, between integrated-circuit chips and a package, and between a plurality of packages in a three-dimensional configuration.

Currently, coupling of ICs and packages develops on major surfaces with some less reliable approaches using a side surface of a semiconductor chip, as discussed above, while an embodiment relates to systems and techniques in which the other surfaces of the IC and the package are involved.

Thus, ICs and packages are provided which are able to communicate with each other by means of wired lines and/or electromagnetic waves, i.e., wireless links, and such ICs and the package will be arranged above, below, and laterally next to each other. In this manner, the whole electronic system is to be imagined in three dimensions. Therefore, coupling of ICs and packages will evolve from 2d to 3d, i.e., from a basically planar configuration to a volumetric configuration. Consequently, the ICs and the package(s) will be able to couple to other ICs and packages while taking advantage, in addition of the conventionally used bottom surface and top surface, of their entire side surfaces or, at least, a part of them.

In particular, an embodiment of an electronic system includes an integrated-circuit chip including a substrate and having a chip top surface, an oppositely arranged chip bottom surface, and a chip side surface. Furthermore, the electronic system includes a package accommodating the integrated-circuit chip and includes a package top surface, a package bottom surface, and a package side surface. Moreover, the electronic system includes a communication mechanism including a communication pad formed in an insulating material above the chip side surface and/or the package side surface, wherein the communication pad is electrically insulated from at least the substrate by the insulating material. The communication mechanism further includes a communication structure so as to communicatively couple to the communication pad.

According to an embodiment, the side surface of an integrated-circuit chip and/or of a package accommodating one or more integrated-circuit chips is used as a communication interface in a system internal communication mechanism for communicating with other semiconductor chips and/or packages. Contrary to conventional approaches discussed above, the communication pad and the associated communication structure are appropriately formed in the insulating material in order to ensure reliable insulation of the communication pad and the communication structure at least from the substrate of the integrated-circuit chip. In this manner, signal exchange and/or power exchange with a metallization system of the IC may be established on the basis of the communication structure so that the communication pad formed above the side surface of the semiconductor chip and/or the package may be used as a terminal of a signal path or a power line, which is able to provide a coupling to a further IC and/or a further package. In one illustrative embodiment, the insulating material is formed on the chip top surface and/or the chip bottom surface and extends above at least a portion of the chip side surface. In this configuration the insulating material is, for instance, in direct contact with a metallization system of the IC, for instance provided on the front side or at the back side of the IC, thereby ensuring a reliable contact with at least a part of circuitry provided in the IC. The communication structure provided in the insulating material may thus communicate with any chip internal circuitry by means of direct contact, using any appropriate contact structure in the metallization system together with appropriately sized and positioned contact pads in the insulating material, or by means of wireless communication channels, such as capacitive or inductive coupling, by means of radio frequency (RF) signals, or by means of optical signals.

In some illustrative embodiments, the insulating material may be provided in the form of a flexible material, such as appropriate polymer materials, in which conductive regions may be incorporated so as to define conductors and appropriate contact or communication pads in order to couple to the metallization system of the IC on the one hand and couple to at least the communication pad provided above the side surface of the IC on the other hand. For example, the insulating material may be formed as an appropriate layer stack including conductive regions in order to provide the communication structure and the communication pad, thereby allowing the application of well-established semiconductor manufacturing techniques. The final geometric configuration may then be established after separating the semiconductor substrate into individual semiconductor chips, while preserving electrical and mechanical integrity of the communication pad and the communication structure. In other cases, any other appropriate insulating material may be used, which may be brought into a desired geometric configuration after providing the individual semiconductor chips, for instance by applying heat-forming techniques, and the like, thereby also ensuring integrity of the basic semiconductor chip while enabling a reliable and approximately exact positioning of the communication pad above the side surface of the IC.

In still other illustrative embodiments, the insulating material may include optically active channels, such as waveguides and associated optical components in order to guide optical signals from dedicated locations within the IC to the communication pad via the communication structure. In this case, the insulating material may preserve mechanical integrity of the IC and may also ensure optical and mechanical characteristics for reliably exchanging optical signals between the communication pad and the IC.

In an illustrative embodiment, the communication structure in the insulating material includes a conductive line extending from a contact pad formed above the chip bottom surface or the chip top surface to the communication pad. Hence, a reliable electrical coupling is established in the communication structure between a contact pad, which may thus allow efficient electrical contact to the IC, for instance to a front-side metallization or a back-side metallization, and the communication pad.

In an illustrative embodiment, the communication pad has formed thereon a conductive contact material configured to enable direct electrical and mechanical contact to the package. In this embodiment, the conductive contact material may be provided in the form of a ball-shaped solder material, a conductive adhesive, and the like, thereby realizing a direct mechanical and electrical contact with the package. In other cases, any other appropriate configuration of the conductive material is provided, for instance in the form of a bump or pillar or wire so as to establish an electrical contact by soldering and the like.

In an embodiment, the electronic system further includes a second integrated-circuit chip including a second communication pad formed above a chip side surface of the second integrated-circuit chip, wherein the integrated-circuit chip and the second integrated-circuit chip are arranged to communicate with each other. An advantageous concept of providing a reliable communication by means of the communication pad formed above the side surface may thus be used in more complex electronic systems, thereby reducing the overall volume of the electronic system without compromising the inter-chip communication and/or the chip-package communication, while also reducing complexity of the routing of any PCBs, which may couple to the one or more packages of the electronic system.

In an illustrative embodiment, the substrate of the integrated-circuit chip is bonded to a substrate of the second integrated-circuit chip so as to establish the communication. In this case, the chip-to-chip communication is established on the basis of any appropriate contact structure provided on the respective back side of the integrated-circuit chips, for instance using appropriate back-side metallization systems in combination with TSV, while the communication pads provided above the side surfaces are available for chip-to-chip communication with other ICs or are available for chip-package communication.

In a further illustrative embodiment, the integrated-circuit chip is positioned above the second integrated-circuit chip so as to establish the communication through a substrate of the integrated-circuit chip and a horizontal communication pad formed above a chip top surface of the second integrated-circuit chip.

Generally, a concept of providing the insulating material having incorporated therein the communication structure and at least one communication pad positioned above the side surface of the integrated-circuit chip offers a high degree of freedom in combining two or more integrated-circuit chips within a single package, while nevertheless allowing superior coupling between the individual semiconductor chips and between the semiconductor chips and the package. In the above-described embodiments, basically a stacked configuration is formed, wherein the chip-to-chip communication is accomplished through the major surface areas of the chips, while still providing for enhanced coupling on the basis of the communication pad positioned above a side surface of at least the integrated-circuit chip.

In a further illustrative embodiment, the integrated-circuit chip and the second integrated-circuit chip are laterally arranged side by side and the insulating material is formed above the integrated-circuit chip and the second integrated-circuit chip so as to establish the communication. In this case, the insulating material may be provided commonly for the integrated-circuit chip and the second chip so that the communication structure provided in the insulating material may appropriately couple to respective metallization systems of both integrated-circuit chips, while at least some of the side surfaces of the integrated-circuit chip and the second chip are still available for positioning one or more communication pads in order to increase coupling with respect to other integrated-circuit chips and/or with respect to the package.

In a further illustrative embodiment, the integrated-circuit chip and the second integrated-circuit chip are laterally arranged side by side, wherein the second communication pad of the second integrated-circuit chip is formed in a second insulating material and the communication is established via the communication pad and the second communication pad. That is, both integrated-circuit chips, arranged in a laterally adjacent configuration, may individually be provided with an insulating material having formed therein a communication structure and one or more communication pads provided above side surfaces of the integrated-circuit chips, wherein at least one communication pad of each chip is used for the chip-to-chip communication. In this manner, the corresponding insulating materials and the respective communication structures incorporated therein, as well as the communication pads, may be formed on the basis of design criteria that are specifically selected with respect to each individual integrated-circuit chip, thereby providing for superior flexibility in organizing the manufacturing process. For example, as already discussed above, the insulating material including the communication structure and the communication pad may be formed on a wafer basis, thereby providing for a highly efficient overall manufacturing flow. In other cases, the insulating material may be provided for a plurality of individual circuit chips of the same type after the circuit chips have been separated, thereby also ensuring a highly efficient manufacturing flow, since the layout of the communication structure and the communication pads is typically adapted only to one specific type of integrated-circuit chip.

It should be appreciated that generally, different concepts may be applied for the electronic system with respect to providing the insulating material having incorporated therein the appropriate communication structure and the communication pad. For example, two or more integrated-circuit chips may be positioned laterally next to each other, wherein the chip-to-chip communication may be established on the basis of a commonly provided insulating material and the corresponding communication structure formed therein, which may thus appropriately couple to the respective metallization systems provided in the individual integrated-circuit chips. In other cases, one or more of the laterally adjacently positioned semiconductor chips may be provided with individual communication mechanisms, wherein the chip-to-chip communication is established by the respective communication pads provided above the respective side surfaces of the one or more semiconductor chips. Furthermore, additionally a stacked configuration may be provided, wherein one or more laterally adjacently positioned integrated-circuit chips may be provided per each "level" of the stacked configuration, wherein the vertical communication as well as the lateral communication may be established by means of the respective communication mechanisms including the insulating materials and the communication structures incorporated therein. In still other illustrative embodiments, two or more levels in the stacked configuration may, at least partly, communicate on the basis of a direct chip-to-chip coupling, for instance by bonding particularly stacked chips face to face or back to back or face to back, depending on the overall configuration of the entire electronic system.

It should be appreciated that any difference in height or thickness of individual integrated-circuit chips may readily be adapted by appropriately adjusting the thickness of the insulating material for the individual circuit chips. A difference in lateral size of the individual integrated-circuit chips may be taken into consideration by providing any appropriate fill material directly between laterally positioned integrated-circuit chips, if, for instance, a common insulating material including the communication structure and the communication pad is to be provided. Additionally or alternatively, the fill material may also be provided at the side surfaces of one or more integrated-circuit chips prior to actually forming the insulating material above the top surface or bottom surface and the side surfaces of the integrated-circuit chips.

In a further illustrative embodiment, the electronic system further includes at least one further communication pad formed in the insulating material, wherein at least one of the communication pad and the at least one further communication pad is configured for wireless signal exchange. In this manner of communication, the requirements with respect to establishing a communication between individual circuit chips and/or packages may be reduced, since at least for some of the communication pads a direct contact between different entities in the electronic system is not required. For example, if the second communication pad is provided above a major surface of the integrated-circuit chip, vertical communication may be established on the basis of a wireless communication channel. Furthermore, horizontal communication may be established on the basis of a wireless channel, if the communication pad formed above the side surface is also appropriately configured for the wireless communication.

In an illustrative embodiment, at least one of the communication pad and the at least one further communication pad is configured for capacitive or inductive signal exchange. In this manner, well-established communication technologies may be applied, wherein the configuration of the respective pad is appropriately adapted to promote the respective signal-exchange mechanism. For example, for a capacitive coupling, the communication pad and a corresponding counterpart thereof may have an appropriate conductivity and may be provided with a well-defined lateral size and with a distance that allows efficient and reliable capacitive coupling of signals. If required, an appropriate dielectric material may be provided in a corresponding gap between a capacitive communication pad and its counterpart. Similarly, for inductive coupling, the communication pad may include an appropriate magnetic material so as to create or improve the characteristics of the inductive communication channel.

In a further illustrative embodiment, at least one of the communication pad and the at least one further communication pad is configured for optical signal exchange. In this case, the communication pad represents an optically active area for transmitting and/or receiving optical signals, wherein at least a part of the communication structure provided within the insulating material is appropriately configured, for instance, in the form of a waveguide, in order to transfer the optical signal to any optoelectronic device in the integrated-circuit chip so as to further process any received optical signals and convert electronic signals into optical signals for communication within the optical communication channel.

In an embodiment, the electronic system further includes a configurable circuit portion coupled to the communication mechanism including the communication pad and the communication structure and configured to enable modification of the communication structure. That is, the configurable circuit portion, which may thus represent a programmable circuit portion, provides for a high degree of flexibility in appropriately adapting the configuration of the communication structure with respect to the required communication demands within the electronic system or at least a part thereof. In some illustrative embodiments, the configurable circuit portion may be configured to enable activation and deactivation of certain communication paths within the communication structure so as to re-configure the communication channels within an individual integrated-circuit chip and/or between individual circuit chips and/or between circuit chips and packages of the electronic system.

In other cases, the communication structure may include a certain degree of redundancy with respect to communication channels, wherein the configurable circuit portion may then re-select a redundant communication channel upon detecting a failure in one or more of the previously used communication paths. The programmable circuit portions may include any appropriate circuitry, such as digital circuitry, analog circuitry, RF circuitry, optoelectronic devices, and the like, as may be required for allowing a programmable reconfiguration of the communication structure.

In some illustrative embodiments, the configurable circuit portion is configured to enable modification of the communication between the integrated-circuit chip and the second integrated-circuit chip. In this case, as discussed above, superior flexibility may be obtained with respect to chip-to-chip communication.

In further illustrative embodiments, the communication pad is formed in a package side surface so as to enable wired and/or wireless communication with a second package. As already discussed above, in this case superior flexibility and performance of the package-package communication may be achieved by efficiently using one or more of the site surface areas of the packages as a communication path. In this manner, in highly complex electronic systems including a plurality of packages, a three-dimensional communication may also be established within the electronic system on the basis of the communication pads provided at side surfaces of the packages.

In an illustrative embodiment, the communication pad is coupled to the integrated-circuit chip by a wire-bond structure. In this manner, well-established contact techniques can be applied in order to establish a reliable communication between the circuit chip and the package. That is, a direct contact between the integrated-circuit chip and the side surface of a package may be established on the basis of a wired coupling, thereby providing for superior insulation between the integrated-circuit chip and the package, while communication pads provided in the side surface of the package are isolated from each other on the basis of the dielectric or insulating material of the package. It should be appreciated, however, that the integrated-circuit chip may include additional contact mechanisms, such as solder bumps, metal pillars, and the like, so as to establish direct mechanical and electrical contact to other integrated-circuit chips and/or to other areas of the package, for instance to the bottom surface and top surface of the package, as is well known from conventional package concepts.

In an embodiment, the package includes a flexible substrate including the communication structure. In this case, the flexible substrate provides for a high degree of flexibility in manufacturing the package and contacting the package with the integrated-circuit chip. For example, the flexible substrate may include an appropriate contact structure so as to directly couple to the top surface and/or bottom surface of the integrated-circuit chip, while the communication structure incorporated in the flexible substrate may then provide the required infra-structure so as to couple to the communication pad formed in the flexible substrate and positioned above a side surface of the integrated-circuit chip.

Also in this case the flexible substrate and the communication structure incorporated therein may be configured so as to enable wireless and/or wired communication between the various packages to be implemented into the electronic system. For example, the communication pad may allow RF communication, capacitive coupling, inductive coupling, optical coupling, and the like depending on the overall communication regimes within the electronic system.

In a further embodiment, the electronic system further includes the communication mechanism having a first part formed in the package and a second part extending to the outside of the package and being coupled to the first part, wherein the second part includes at least the communication pad. The communication mechanism is thus appropriately configured so as to communicate with components within the package and to enable communication between different packages of the electronic system. The communication mechanism may be provided in the form of a substrate, for instance formed from a heat-deformable material, a flexible material, and the like, which may be provided within the package with an appropriate contact structure so as to couple to any component within the package, and which extends to the outside of the package so as to be positioned above at least a portion of a side surface of the package. Also in this case superior coupling from package to package may be achieved by efficiently using the communication pad formed in the outer portion of the communication mechanism for establishing a "horizontal" communication within the electronic system. It should be appreciated that any of the above-identified mechanisms for establishing a communication may also be applied, in addition to or alternatively to any of these mechanisms provided in integrated-circuit chips and packages, to the communication mechanism having first and second portions. That is, the communication pad in combination with the communication structure provided in the outer portion of the communication mechanism may allow for wireless and/or wired communication between individual packages of the electronic system.

In a further illustrative embodiment, the electronic system further includes a wireless-communication structure for exchanging at least one of signals and power between the integrated-circuit chip and at least one further integrated-circuit chip by using a first wireless-communication structure, such as a magnetic TSV structure, formed in the integrated-circuit chip, and a second wireless-communication structure, such as a magnetic TSV structure, formed in the at least one further integrated-circuit chip. In this manner, the inter-chip communication or the inter-chip energy transfer may be enhanced, thereby even further improving the system internal communication. For example, by providing appropriate inductive coupling mechanisms within the individual integrated-circuit chips and by appropriately positioning the inductive coupling mechanisms' signals and, in particular, energy, may efficiently be exchanged, thereby significantly reducing requirements with respect to power-line routing and the like. In this manner an increased degree of freedom in selecting an appropriate configuration of a plurality of integrated-circuit chips within the electronic system may be achieved, since at least some power-line couplings may be omitted. In combination with the additional degree of coupling gained by means of using any side surface areas of integrated-circuit chips and/or packages, extremely complex electronic systems may be designed without unduly increasing the overall size, since the volumetric packing density may be significantly enhanced compared to conventional electronic systems.

In an illustrative embodiment, the communication pad and the communication structure are formed as a continuous material. That is, the insulating material may act as a carrier material for receiving appropriate particles, and the like, in order to adjust the overall material characteristics so as to enable "communication" between a communication "terminal" formed in an integrated-circuit chip and/or a package and a further communication "terminal" formed in a further integrated-circuit chip or package, for instance by conveying signal nodes on the basis of inductive coupling, capacitive coupling, and optical coupling, without requiring specifically defined communication channels in the appropriately prepared insulating or carrier material. Thus, the insulating carrier material itself, or at least a significant portion thereof, may act as the communication structure and the communication pad thereby providing communication capabilities across a significant portion of the entire surface of a component within the electronic system. In order to allow communication with different components in the electronic system, the communication may be controlled so as to individually address different communication systems within the electronic system, although the communication channel may concurrently couple to a plurality of communication systems. An appropriate addressing mechanism may readily be implemented on the basis of well-known techniques.

BRIEF DESCRIPTION OF THE DRAWINGS

FIGS. 3-5 to 3-9 schematically illustrate cross-sectional views of components during various manufacturing stages of the fabrication of an insulating material including a communication structure and a communication pad, according to an embodiment, FIG. 3-10 schematically illustrates a top view of an integrated-circuit chip having formed thereon an insulating material including a communication structure and communication pads for communication via a top surface and side surfaces, according to an embodiment.

FIGS. 3-11 to 3-17 schematically illustrate cross-sectional views during various stages in fabricating an insulating material with a communication structure and communication pads, according to an embodiment.

FIGS. 3-18 to 3-21 schematically illustrate cross-sectional views of various configurations of an electronic system, wherein a plurality of integrated-circuit chips are provided with lateral or horizontal communication capabilities on the basis of an insulating material including a communication structure and one or more communication pads, according to an embodiment.

FIGS. 3-22 to 3-23 schematically illustrate cross-sectional views of an electronic system, in which a plurality of packaged integrated-circuit chips couple to PCBs, according to an embodiment.

FIGS. 3-24 to 3-28 schematically illustrate cross-sectional views of electronic systems, in which communication may be established, at least partially, on the basis of wireless communication channels, according to an embodiment.

FIGS. 3-29 to 3-31 schematically illustrate top views of integrated-circuit chips including a configurable/programmable circuit in order to enhance overall communication capabilities within an electronic system, for instance by re-configuring one or more communication paths, according to an embodiment.

FIGS. 3-32 to 3-33 schematically illustrate cross-sectional views of an electronic system, in which wireless communication channels are used in combination with incorporation of "external" electronic components, such as capacitors, inductors, and the like, according to an embodiment.

DETAILED DESCRIPTION

As discussed above, an embodiment increases conductivity within an electronic system by designing integrated-circuit chips (IC) and/or packages such that coupling is established both in the vertical and in the horizontal directions.

It should be appreciated that terms such as "horizontal", "lateral", "vertical", "top, bottom, side", and the like are to be understood as relative terms and not in an absolute sense. Hence, these terms are to be understood with reference to any appropriate reference system, for instance the substrate material of a semiconductor wafer or an individual semiconductor chip may define a "two-dimensional" plane used as a reference plane, above which circuit elements, metallization structures, and the like may be formed. In this sense, the resulting surface of the IC may be indicated as a top surface, while an oppositely arranged surface of the substrate material may be considered as a back side having a bottom surface. Similarly, the IC may have side surfaces, which may be formed upon separating the semiconductor die formed on a semiconductor wafer. Similar considerations may also apply for a package, which may include a top surface and then patterned surface and corresponding side surfaces coupling the bottom surface with the top surface. Typically, the area of the top and bottom surfaces is greater than the area of a single side surface.

Similarly, the term "above, below, on" and similar terms may be understood as position information in relation to a reference, without indicating an absolute position or direction. In particular, an object positioned "above" a specified surface is to be understood as being positioned with orthogonal distance with respect to the specified surface. For example, a communication pad positioned "above" a side surface has at least one point that defines a minimal orthogonal distance between said side surface and said communication pad.

Figure 2A:
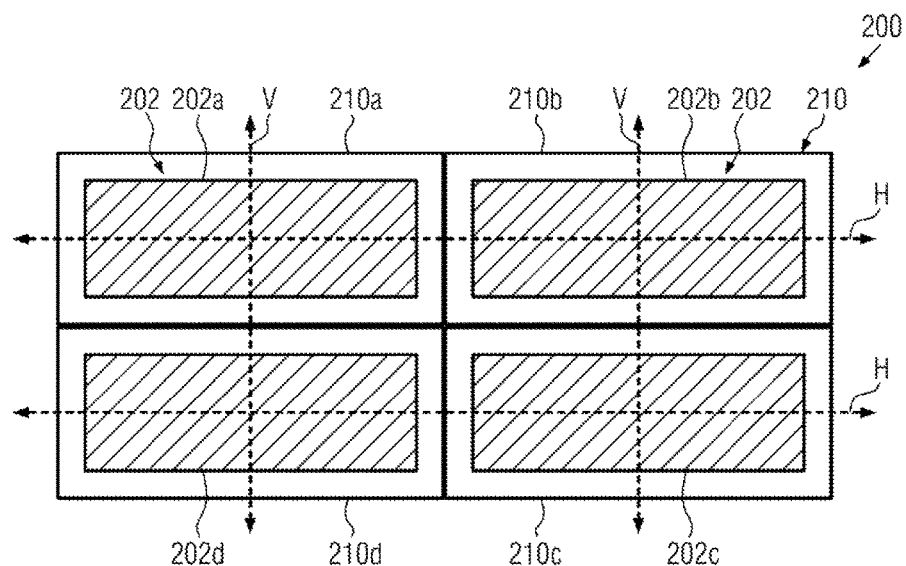
FIG. 2a schematically illustrates a top view of an electronic system including a plurality of integrated-circuit chips and corresponding packages, wherein coupling is established within the electronic system along major surfaces and side surfaces of the individual components, according to an embodiment.

FIG. 2a schematically illustrates an electronic system 200, which may be understood as any appropriate generic electronic system, including a plurality of ICs, generally indicated as 202, such as ICs 202a, 202b, 202c, 202d, which may be appropriately packaged, according to an embodiment. For example, each of the ICs 202 may be enclosed by a corresponding package, collectively indicated as 210, so that packages 210a, 210b, 210c, 210d may be provided. It should be understood, however, that a package may include two or more individual ICs, depending on the overall requirements for combining the various components into the electronic system 200. According to an embodiment, "horizontal" communication, indicated as H, is established within the system 200, while also "vertical" communication is implemented, indicated by V. Thus, contrary to conventional approaches, the side surfaces of packages and ICs may be used for establishing the horizontal communication H, however, without introducing increased yield loss and reduced reliability. The communication may be implemented on the basis of wired couplings and/or wireless communication channels by providing communication mechanisms having appropriate communication endpoints and respective communication structures, which appropriately couple each endpoint with a corresponding communication channel within an IC or a package. In the following, corresponding endpoints may also be referred to as communication pads having any appropriate lateral dimension and configuration so as to allow communication in the horizontal and/or vertical direction with other components, such as other ICs, packages, or PCBs.

Figure 2B:
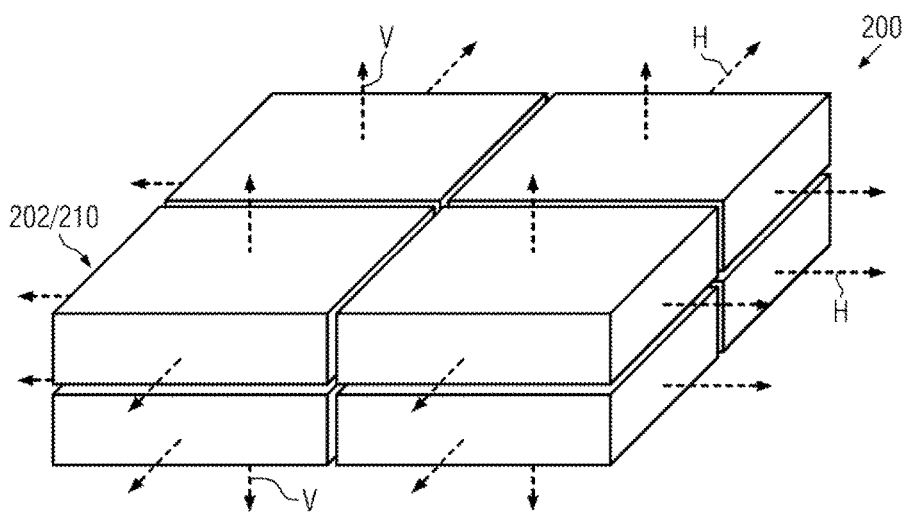
FIG. 2b schematically illustrates the electronic system in a perspective view, thereby more clearly indicating the three-dimensional nature of the communication within the overall electronic system, according to an embodiment.

FIG. 2b schematically illustrates the electronic system 200 in a perspective view, wherein the horizontal and vertical communication paths are established by corresponding configuration of the individual components, such as ICs 202 and packages 210, thereby forming highly complex electronic systems having a high volumetric packing density, according to an embodiment. As discussed above, in order to enable in the horizontal communication H a communication mechanism, at least one communication pad (not shown) may be provided in at least some of the side surfaces of the components 202 or 210, wherein the communication pads and the associated communication structure are provided such that electrical and mechanical integrity of the components 202 and 210 is reliably preserved. For example, the communication pads in combination with the communication structure are provided in such a manner that a reliable electrical insulation at least with respect to the substrate of the ICs is not deteriorated.

With reference to FIGS. 3-1 to 3-33 further embodiments will now be described, in which an IC receives horizontal communication capabilities on the basis of a communication mechanism including a communication pad and a communication structure embedded in an insulating material layer or layer system, which may be applied to the IC disposed in a wafer or after separating the individual ICs, wherein coupling to the IC internal components is established by the communication structure, which in turn couples to at least some communication pads provided in a manner within the insulating material so that these communication pads may finally be positioned above one or more side surfaces of the IC.

Figures 1, 3:
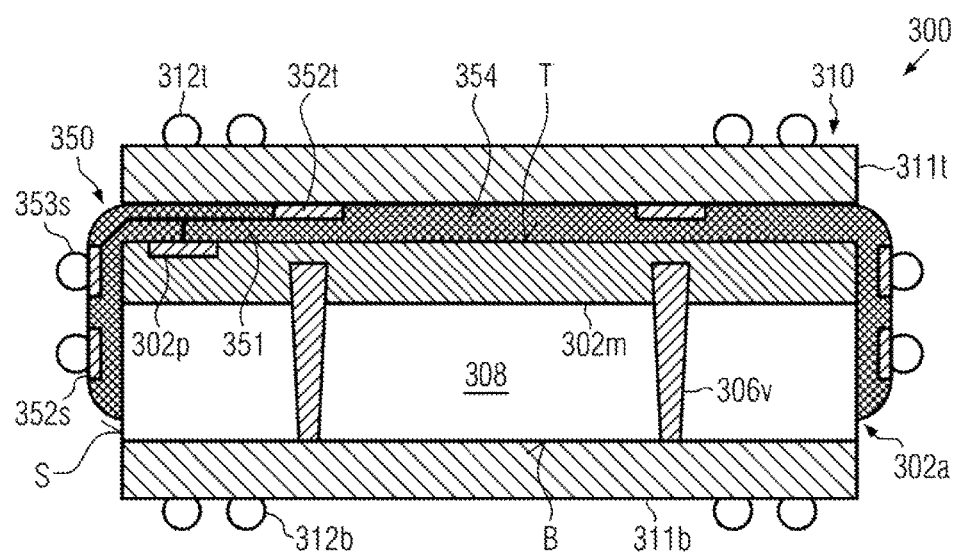
FIGS. 3-1 to 3-4 schematically illustrate cross-sectional views of an electronic system, in which lateral or horizontal communication is established on the basis of an insulating material including a communication structure and at least one communication pad formed above a side surface of an integrated-circuit chip, according to an embodiment.

FIG. 3-1 illustrates a cross-sectional view of an embodiment, in which an IC 302a of an electronic system 300 is considered, which is able to couple to other ICs and packages via all its surfaces. In the embodiment shown, the electronic system 300 may include the IC 302a so as to include a substrate 308 defining a bottom surface B, while a top surface T of the IC 302a may be defined by the metallization system 302m, which may establish the electrical and/or optical couplings to components (not shown) of the IC 302a formed in and above the substrate 308 in any appropriate configuration. Moreover, a communication mechanism 350 is provided in combination with the IC 302a, which is appropriately adapted to implement horizontal communication so as to couple to other ICs or packages (not shown) of the system 300. To this end, the communication mechanism 350 includes a dielectric material 354, which is embedded in a communication structure 351 and a plurality of communication pads 352s, 352t. Consequently, the communication mechanism 350 includes at least one communication pad 352s that is positioned above a side surface S of the IC 302a.

In the embodiment shown, the IC 302a may be sandwiched between two substrates, one of which is a lower substrate or bottom substrate 311b and the other one is an upper substrate or top substrate 311t. The substrates 311t and 311b may represent parts of a package 310 of the system 300. Thus, a vertical communication in the system 300 based on the IC 302a may be established by the communication mechanism 350, i.e., the communication pads 352t and the communication structure 351, which may appropriately couple to any contact areas of the metallization system 302m, for instance provided in the form of contact pads 302p. Furthermore, the vertical communication from the IC 302a to the bottom substrate 311b may be established by an appropriate contact structure, for instance provided in the form of TSV 306v insulated from the substrate 308. Furthermore, the vertical communication may be conveyed by a contact structure 312b provided at the bottom substrate 311b and a contact structure 312t provided on the top substrate 311t. On the other hand, horizontal communication, as for instance generally described with reference to FIGS. 2a and 2b, may be established by the mechanism 350 on the basis of the contact structure 351 that couples one or more of the communication pads 352s with device internal components of the IC 302a by the pads 302p and the metallization system 302m. Hence, in the embodiment shown, the coupling to other ICs and packages is accomplished by means of bumps 353s formed on the communication pads 352s and by respective bumps formed in the contact structures 312p, 312t. In this respect, bumps should be considered as protruding contact elements formed of any appropriate material, such as highly conductive materials in combination with the solder material, and the like.

In particular, above the side surfaces S, intercouplings are present which are arranged along one or more rows. The conducting paths start from the pad 302p of the IC 302a and extend to the side surface S of the IC 302a for the horizontal communication. Thus, the horizontal communication paths and in particular the communication pads 352s are electrically insulated from the substrate 308 and the metallization system 302m by the insulating material 354 so as to avoid leakages and short circuits with the substrate or portions of circuits to be arranged laterally adjacent to the IC 302a, such as test structures exposed due to the dicing of the wafer, as discussed above.

Figures 2, 3:
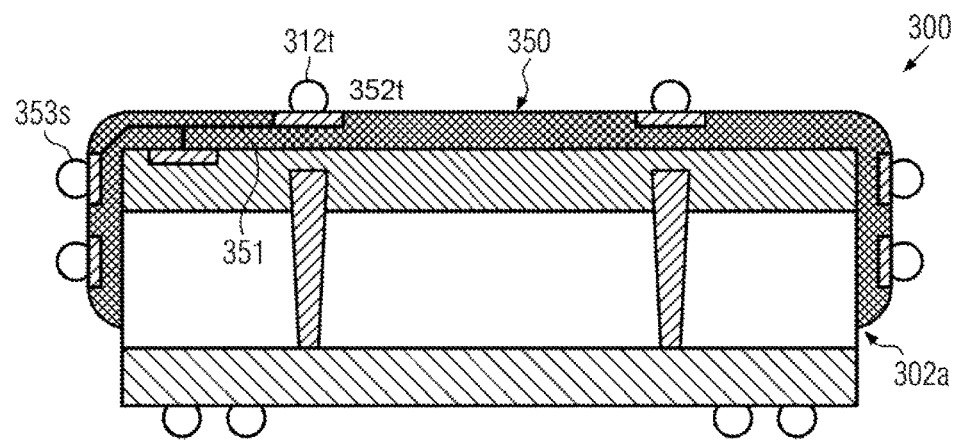
Figure 3:
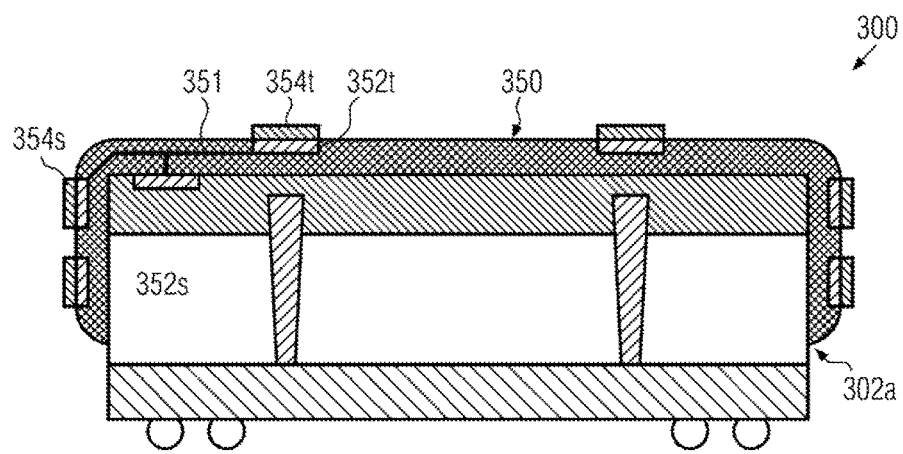

FIG. 3-2 schematically illustrates a modification, in which the top substrate may be omitted, according to an embodiment. Thus, appropriate contact elements, such as bumps 312t, may be arranged on the pads 352t so as to allow vertical coupling to other components, such as packages, ICs, and the like.

FIG. 3-3 schematically illustrates the system 300, in which contact elements of different configuration may be provided in combination with the communication mechanism 350, according to an embodiment. In the embodiment shown, instead of the bumps, a layer of soldering material 354s and 354t, respectively, may be provided on the various pads of the communication mechanism 350.

Figures 3, 4:
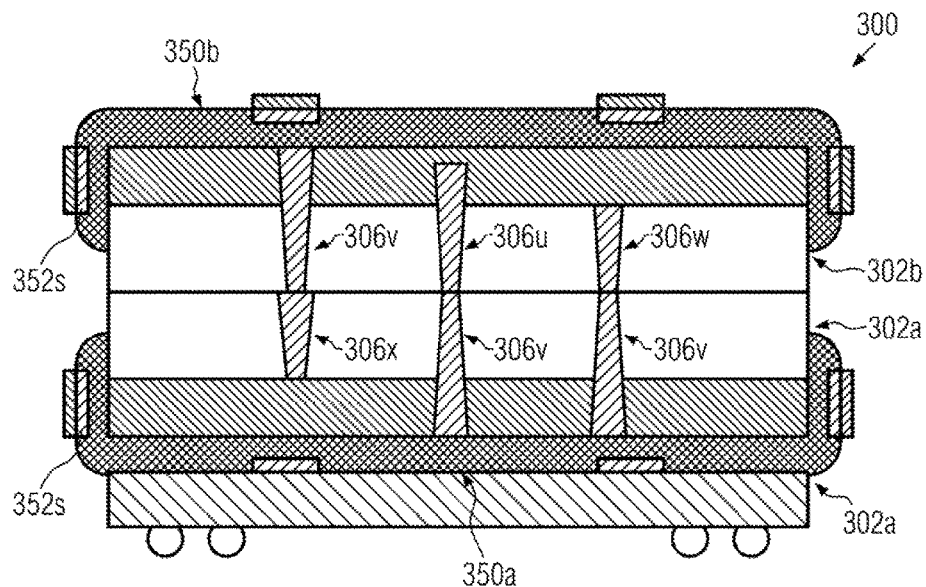

FIG. 3-4 schematically depicts the system 300, in which a plurality of ICs may be combined into a single package (not shown) so as to allow a complex yet highly volume-efficient configuration of the system 300, according to an embodiment. In the embodiment shown, the various ICs may be arranged with respect to each other in a stacked configuration and coupled with each other by means of through-hole vias, also referred to as TSV (through silicon via or through substrate via). To this end, any appropriate technology may be applied in order to form the vertical intercouplings in the ICs so as to allow a direct coupling, as for instance shown for the IC 302a and a second IC 302b, which are thus coupled back to back. The vertical intercouplings, i.e., the TSVs, may be provided at any appropriate manufacturing stage, for instance forming a TSV 306v in a final manufacturing stage so as to extend through the metallization system and the substrate of a respective IC, while the TSV 306u may be formed at an intermediate manufacturing stage, i.e., during the fabrication of the multilevel metallization system, whereas the TSV 306w may be formed prior to fabricating the metallization system of a respective IC. In other cases, the TSV 306x may be formed from the back side of the corresponding IC, thereby providing increased flexibility in appropriately adapting the contact structures of the various ICs so as to allow a direct coupling, as for instance shown in FIG. 3-4. Consequently, in this configuration, vertical communication may be established by a communication mechanism 350b associated with the IC 302b and the communication mechanism 350a associated with the IC 302a, as is also described above. If required, one or more substrates may couple to one or both of the communication mechanisms, as for example also discussed above with reference to the IC 302a. On the other hand, the horizontal communication is established by the corresponding laterally positioned communication pads 352s.

In the following, some generic fabrication techniques will be described in order to form the communication mechanism as discussed above, according to an embodiment.

Figure 1A:
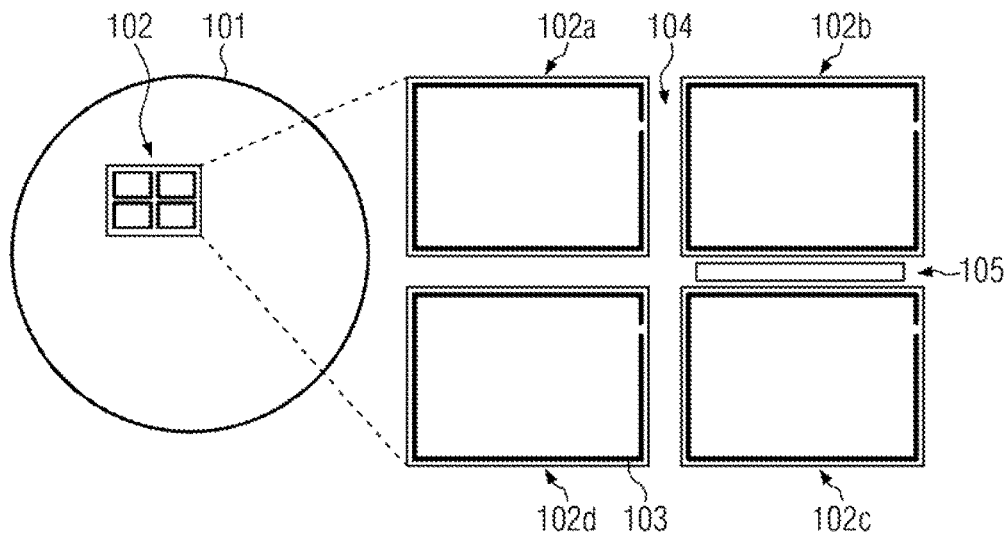
FIG. 1a schematically illustrates a top view of a semiconductor wafer and integrated-circuit chips or dies formed thereon as an array separated by scribe lines, which may include test structures.
Figures 3, 4, 5:
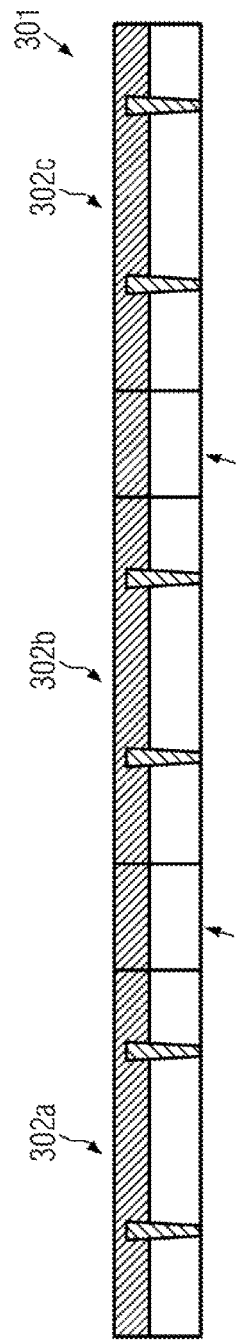
Figures 3, 4, 5, 6:
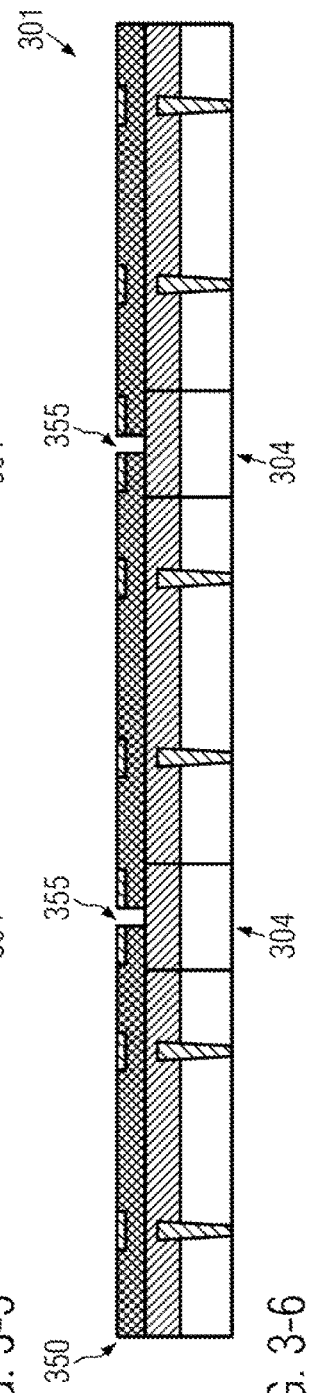
Figures 3, 4, 5, 6, 7:
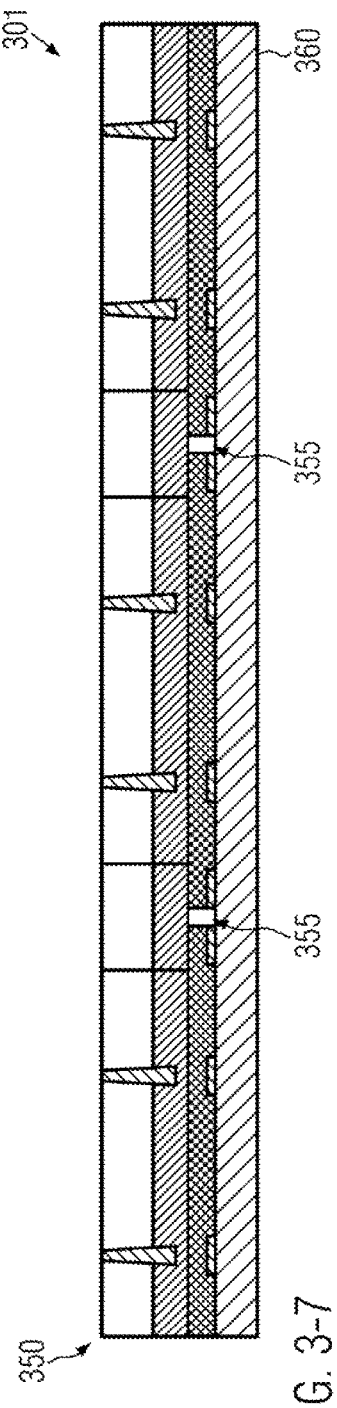
Figures 3, 4, 5, 6, 7, 8:
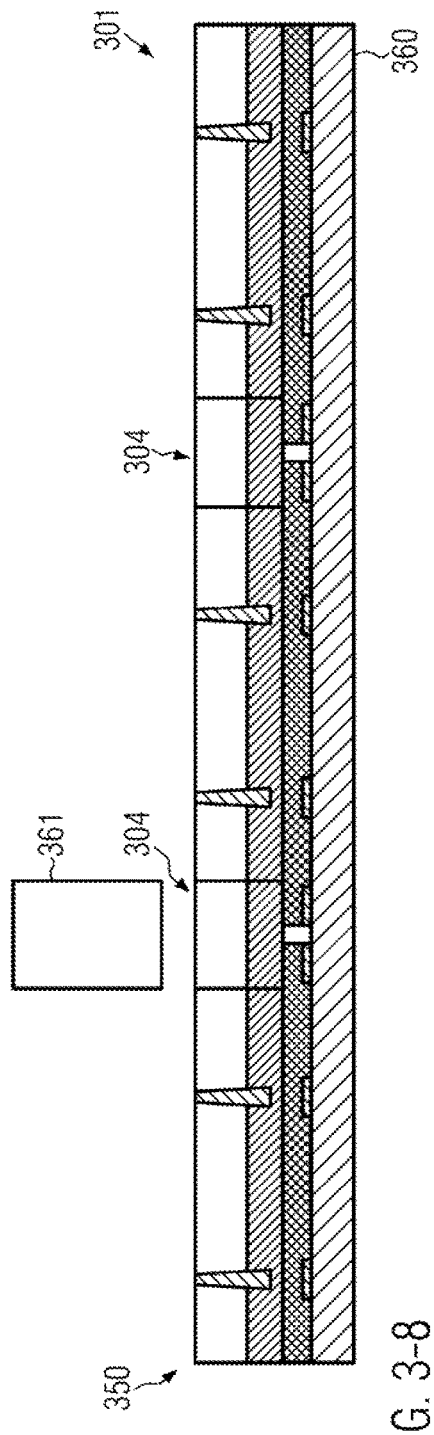
Figures 3, 4, 5, 6, 7, 8, 9:
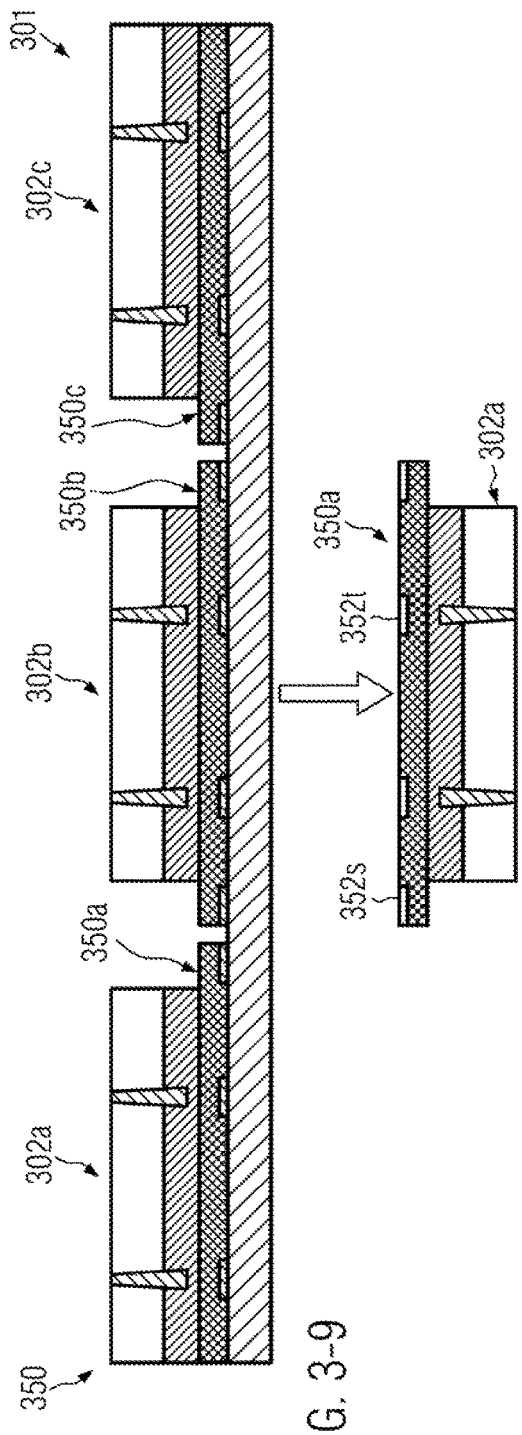
Figures 3, 4, 5, 6, 7, 8, 9, 10:
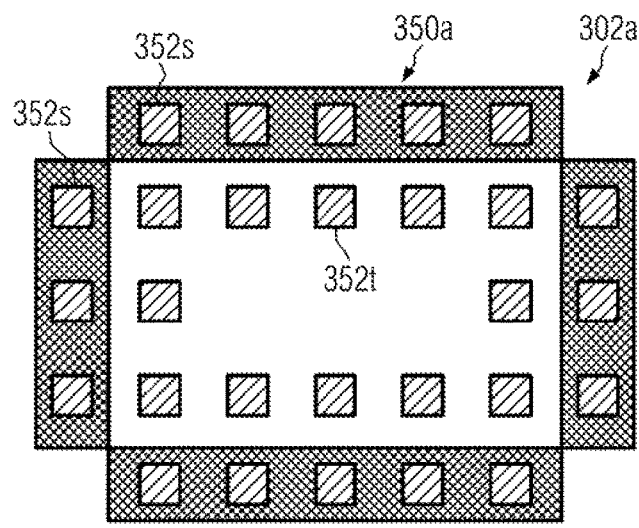
Figures 3, 4, 5, 6, 7, 8, 9, 10, 11:
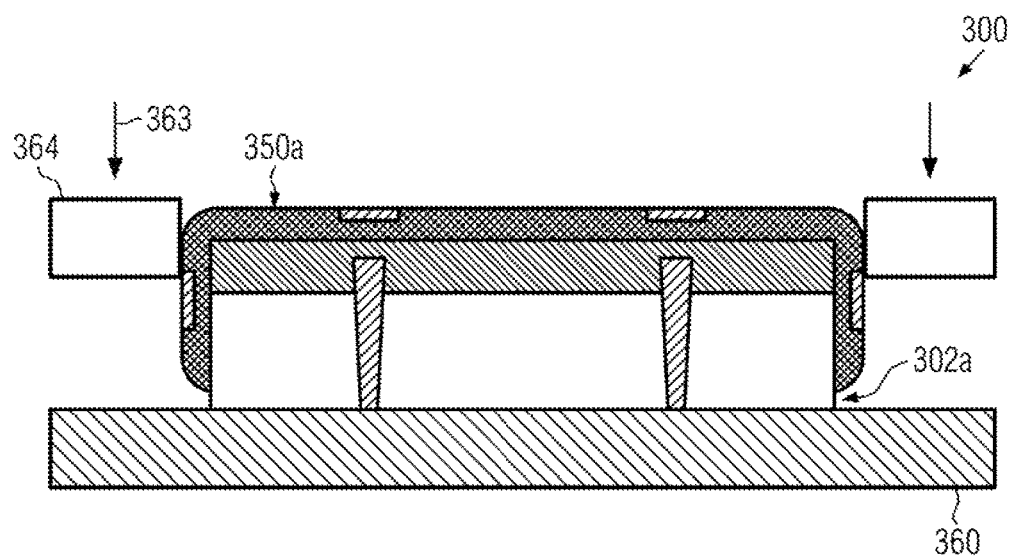
Figures 3, 4, 5, 6, 7, 8, 9, 10, 11, 12:
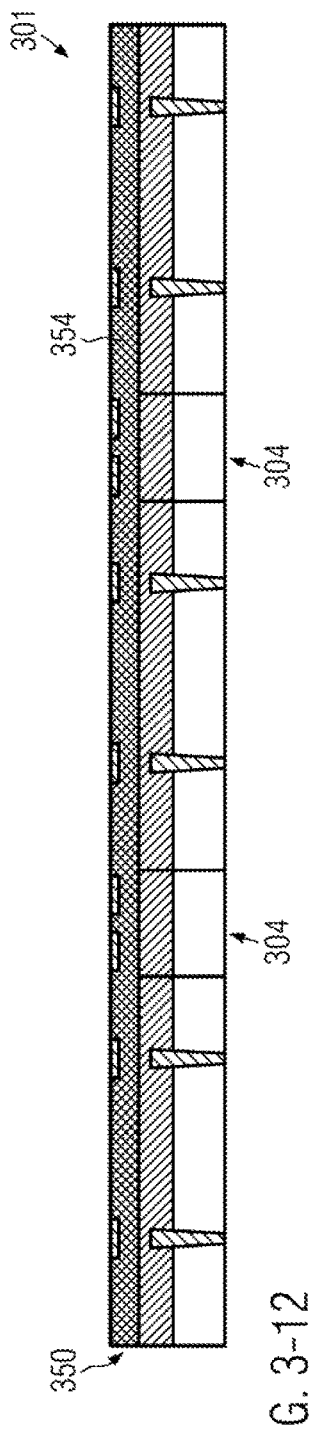
Figures 3, 4, 5, 6, 7, 8, 9, 10, 11, 12, 13:
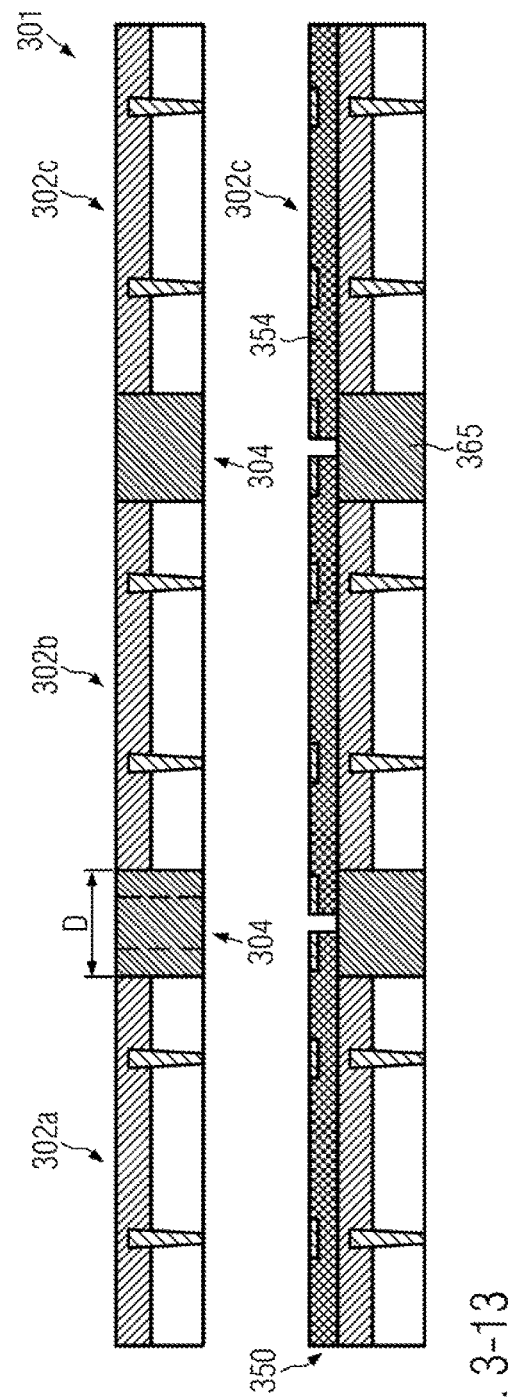
Figures 3, 4, 5, 6, 7, 8, 9, 10, 11, 12, 13, 14:
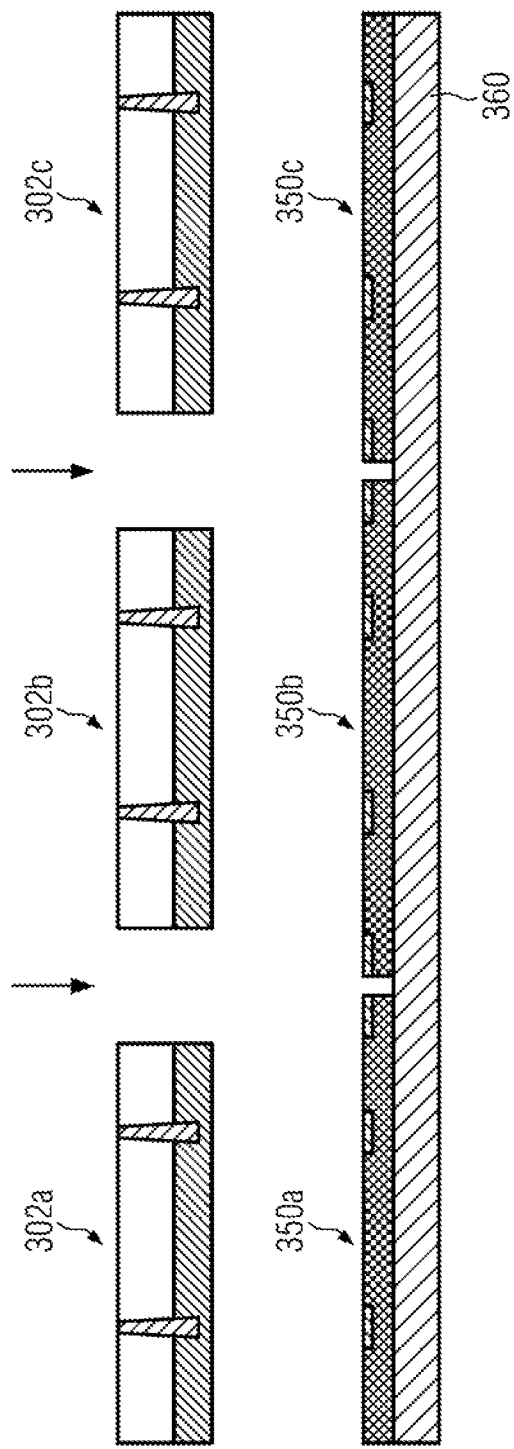
Figures 3, 4, 5, 6, 7, 8, 9, 10, 11, 12, 13, 14, 15:
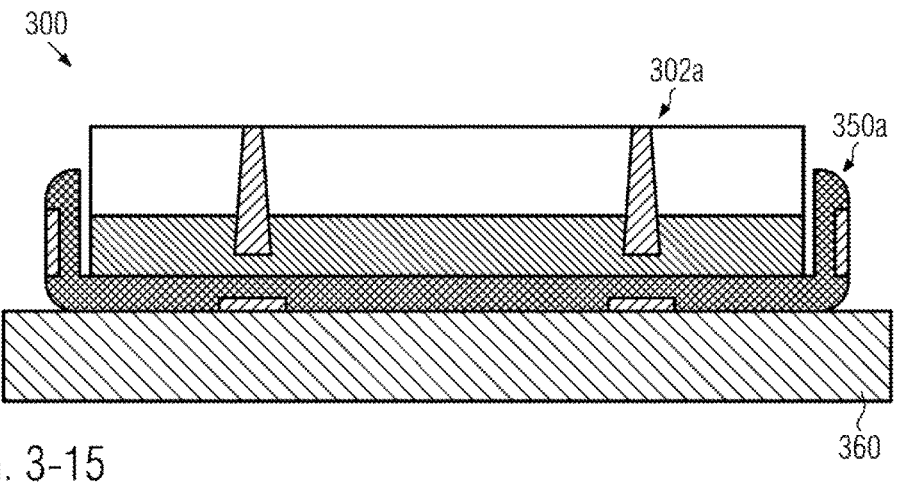
Figures 3, 4, 5, 6, 7, 8, 9, 10, 11, 12, 13, 14, 15, 16:
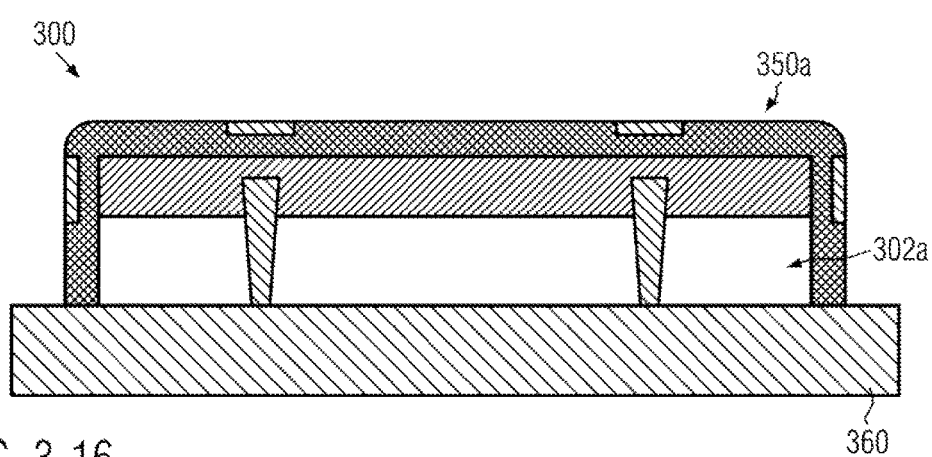
Figures 3, 4, 5, 6, 7, 8, 9, 10, 11, 12, 13, 14, 15, 16, 17:
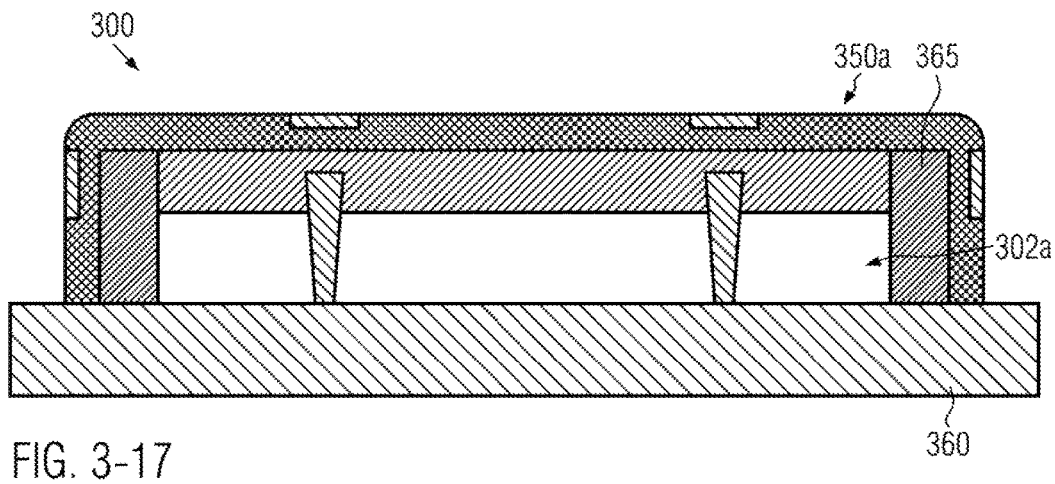
Figures 3, 4, 5, 6, 7, 8, 9, 10, 11, 12, 13, 14, 15, 16, 17, 18:
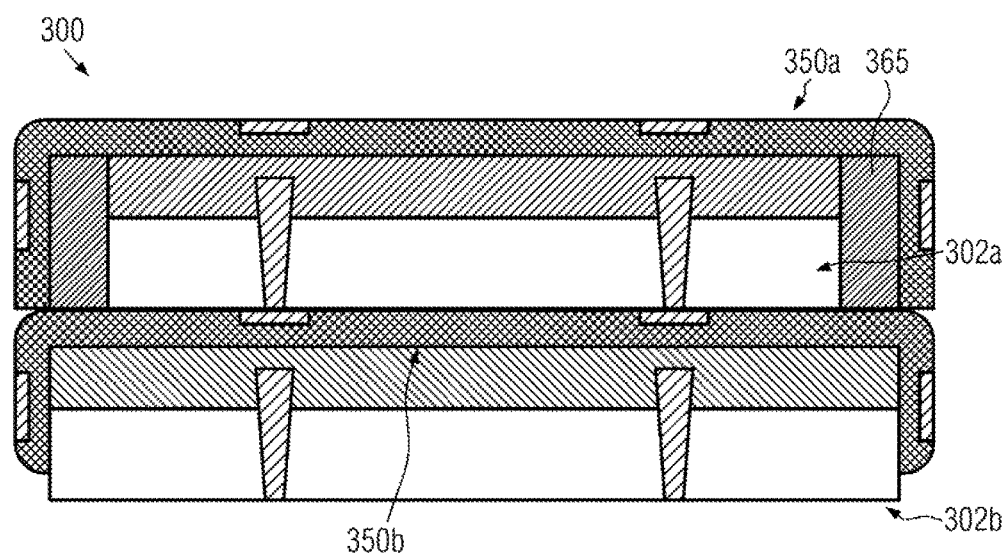
Figures 3, 4, 5, 6, 7, 8, 9, 10, 11, 12, 13, 14, 15, 16, 17, 18, 19:
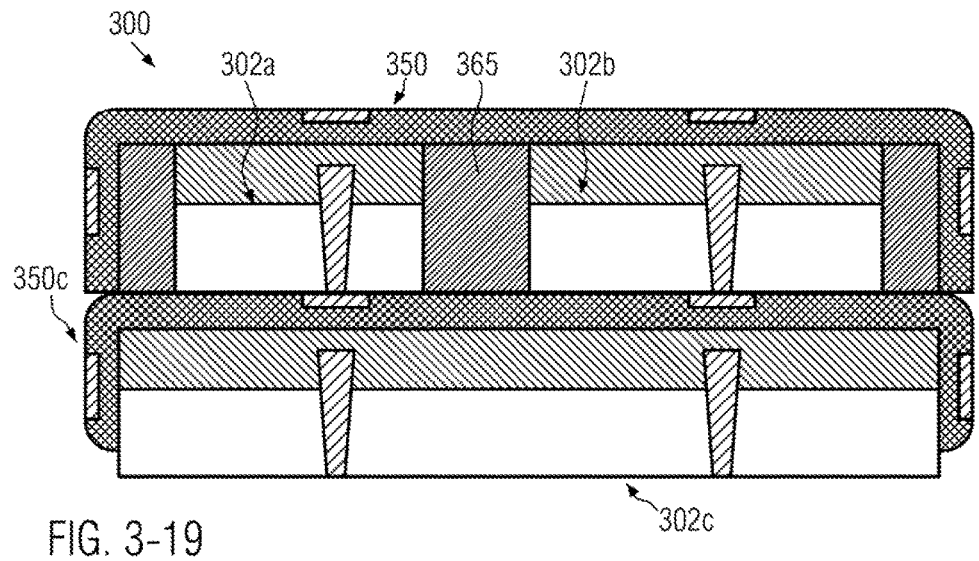
Figures 3, 4, 5, 6, 7, 8, 9, 10, 11, 12, 13, 14, 15, 16, 17, 18, 19, 20:
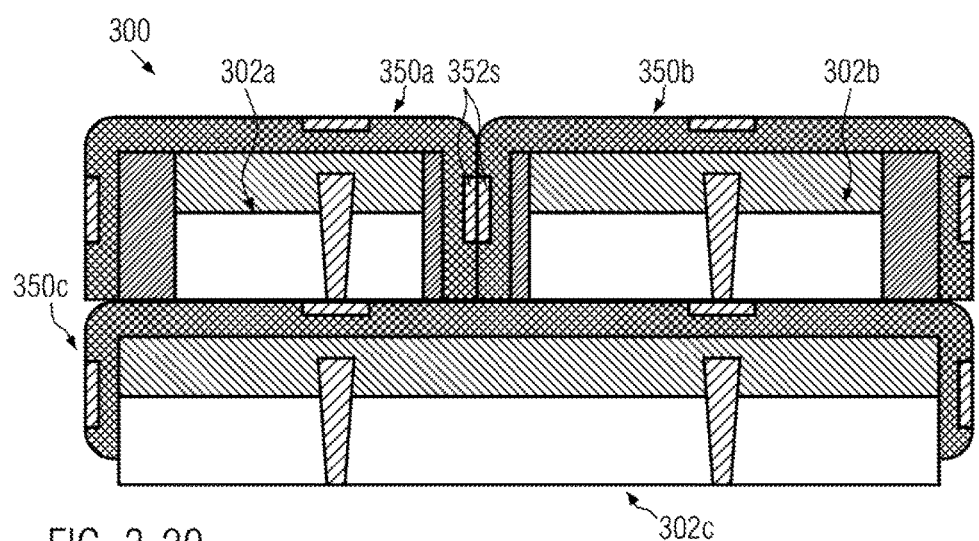
Figures 3, 4, 5, 6, 7, 8, 9, 10, 11, 12, 13, 14, 15, 16, 17, 18, 19, 20, 21:
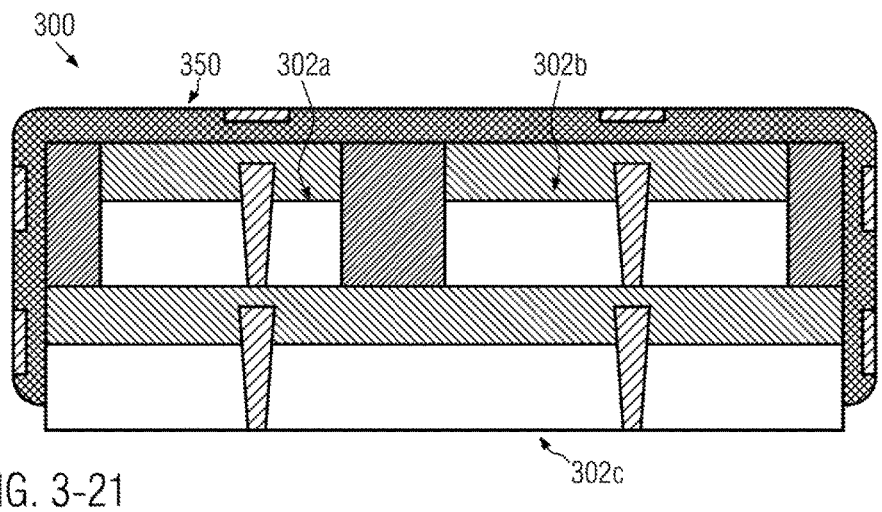
Figures 3, 4, 5, 6, 7, 8, 9, 10, 11, 12, 13, 14, 15, 16, 17, 18, 19, 20, 21, 22:
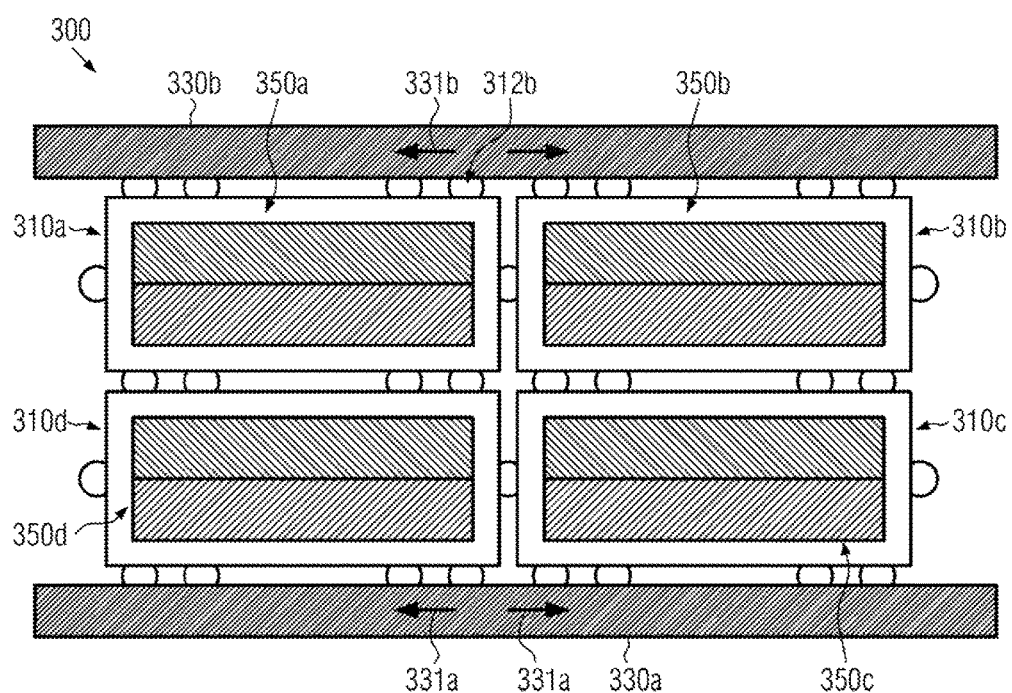
Figures 3, 4, 5, 6, 7, 8, 9, 10, 11, 12, 13, 14, 15, 16, 17, 18, 19, 20, 21, 22, 23:
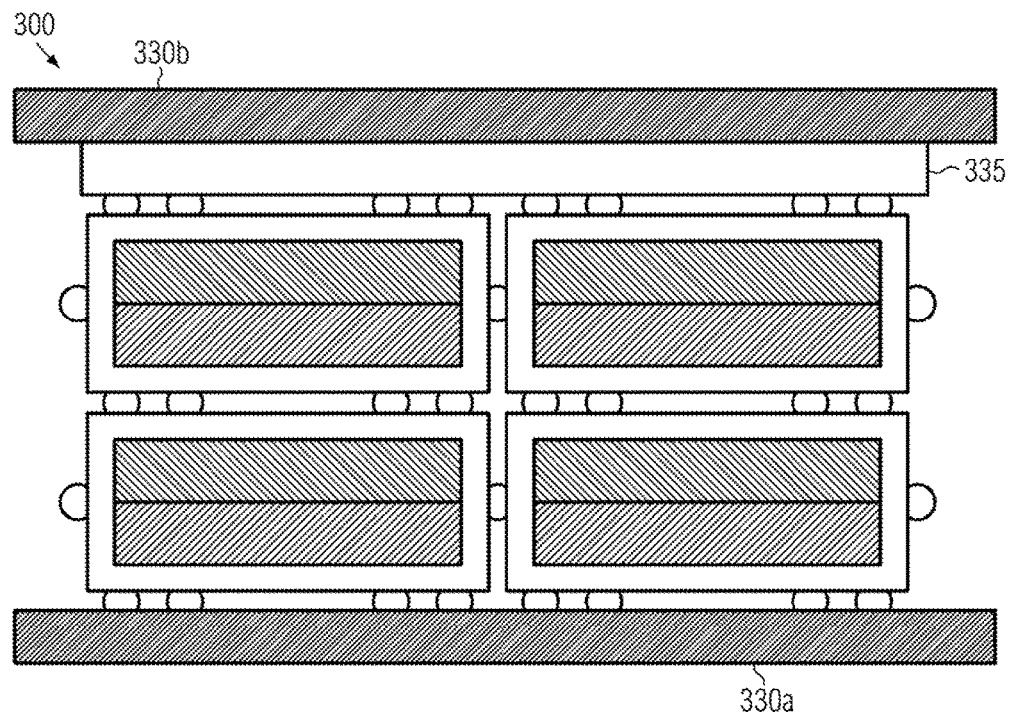
Figures 3, 4, 5, 6, 7, 8, 9, 10, 11, 12, 13, 14, 15, 16, 17, 18, 19, 20, 21, 22, 23, 24:
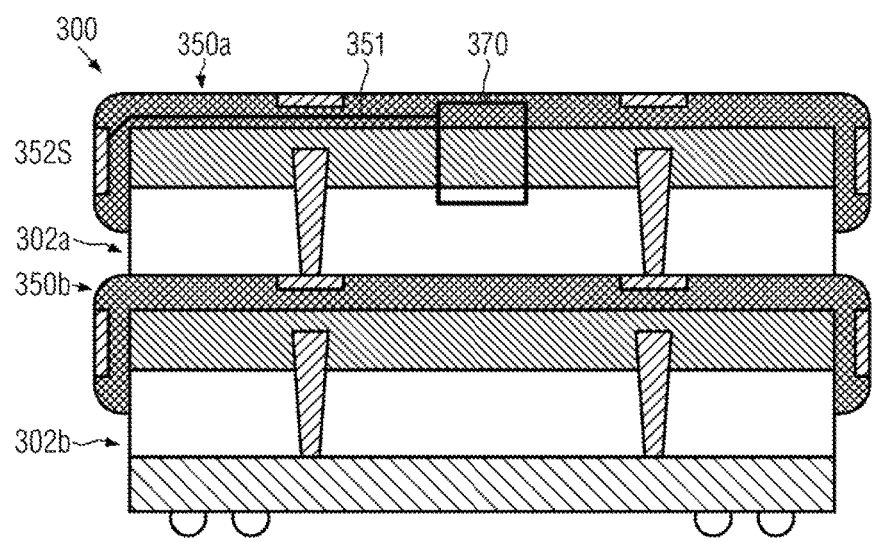
Figures 3, 4, 5, 6, 7, 8, 9, 10, 11, 12, 13, 14, 15, 16, 17, 18, 19, 20, 21, 22, 23, 24, 25:
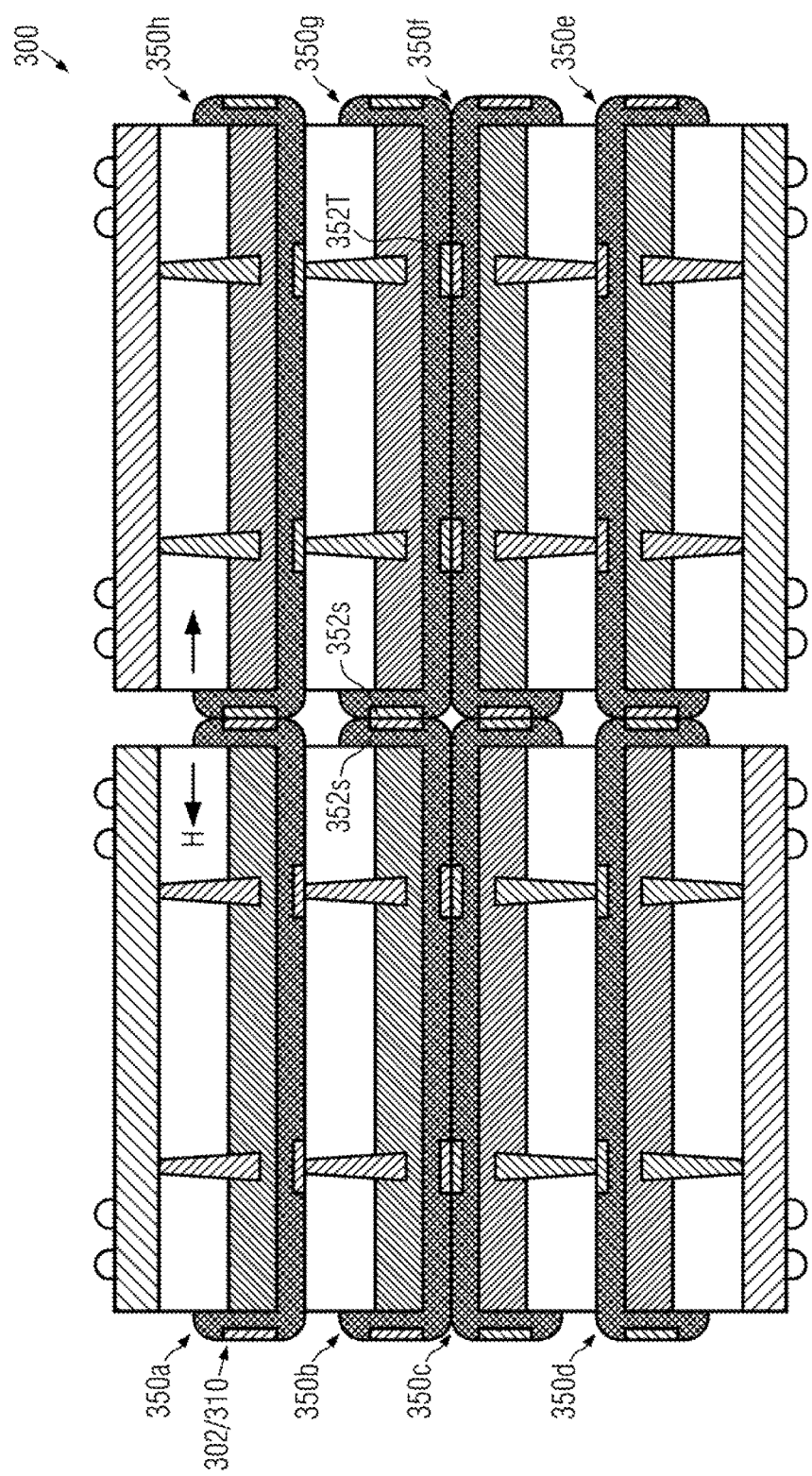
Figures 3, 4, 5, 6, 7, 8, 9, 10, 11, 12, 13, 14, 15, 16, 17, 18, 19, 20, 21, 22, 23, 24, 25, 26:
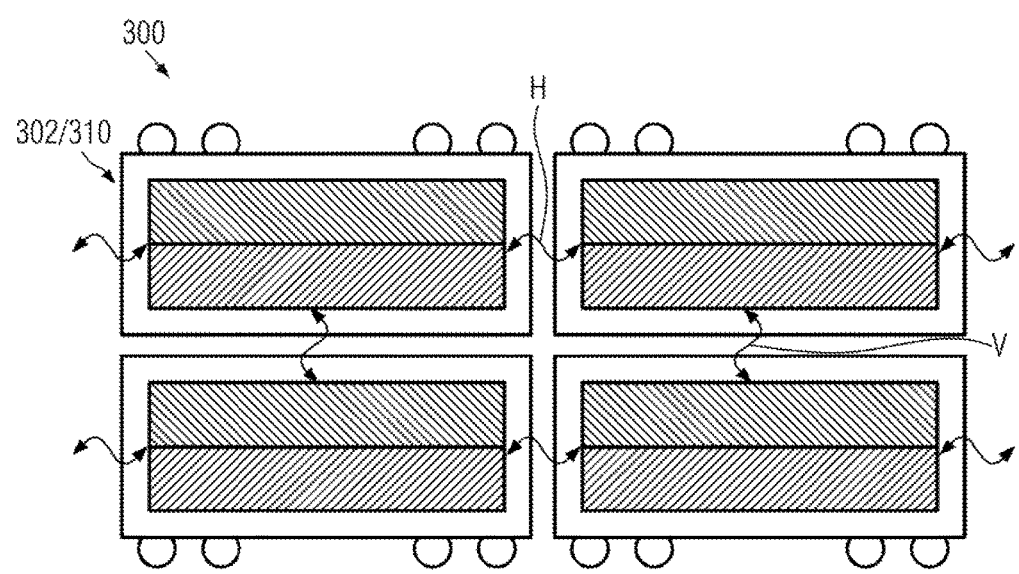
Figures 3, 4, 5, 6, 7, 8, 9, 10, 11, 12, 13, 14, 15, 16, 17, 18, 19, 20, 21, 22, 23, 24, 25, 26, 27:
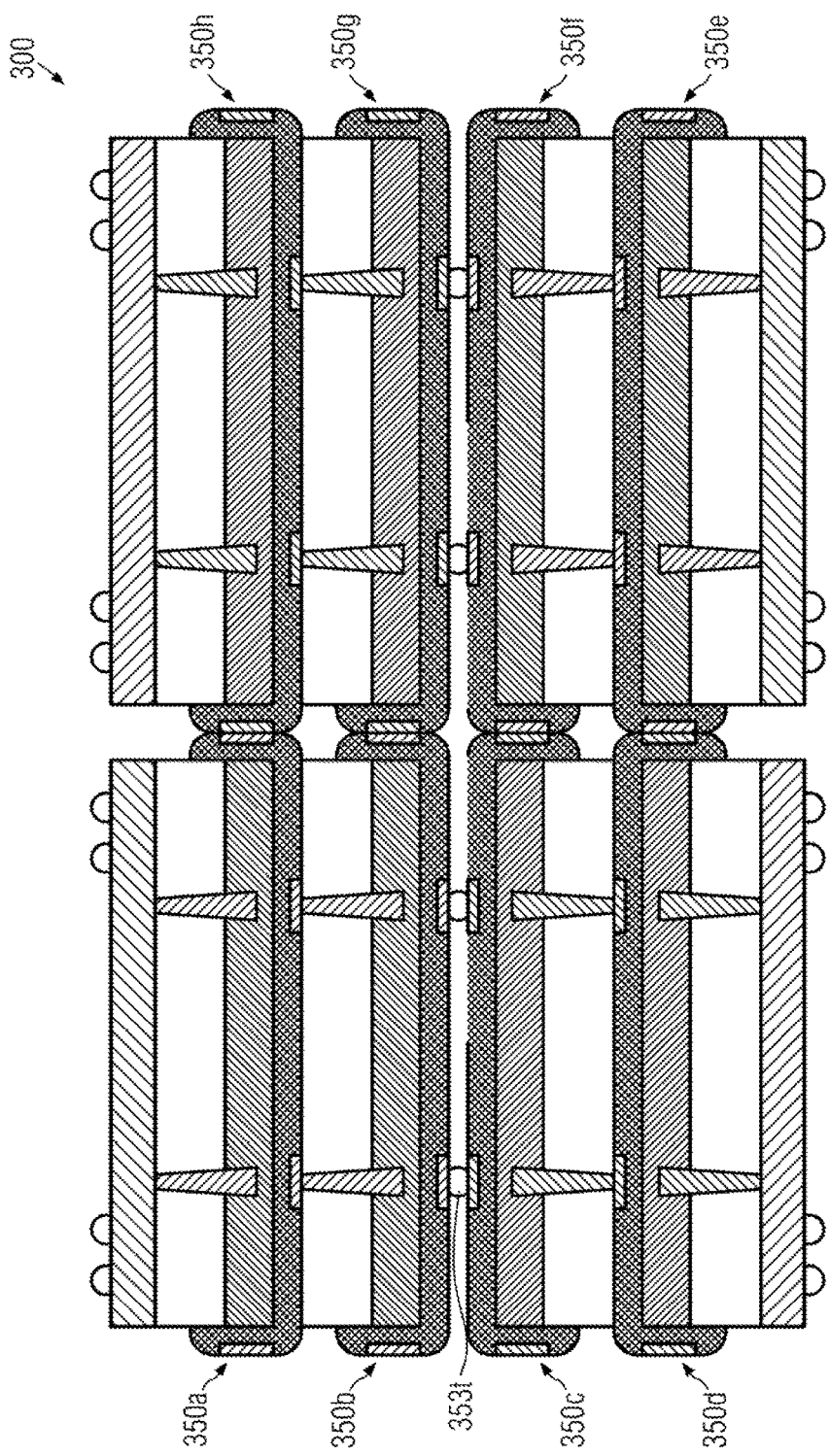
Figures 3, 4, 5, 6, 7, 8, 9, 10, 11, 12, 13, 14, 15, 16, 17, 18, 19, 20, 21, 22, 23, 24, 25, 26, 27, 28:
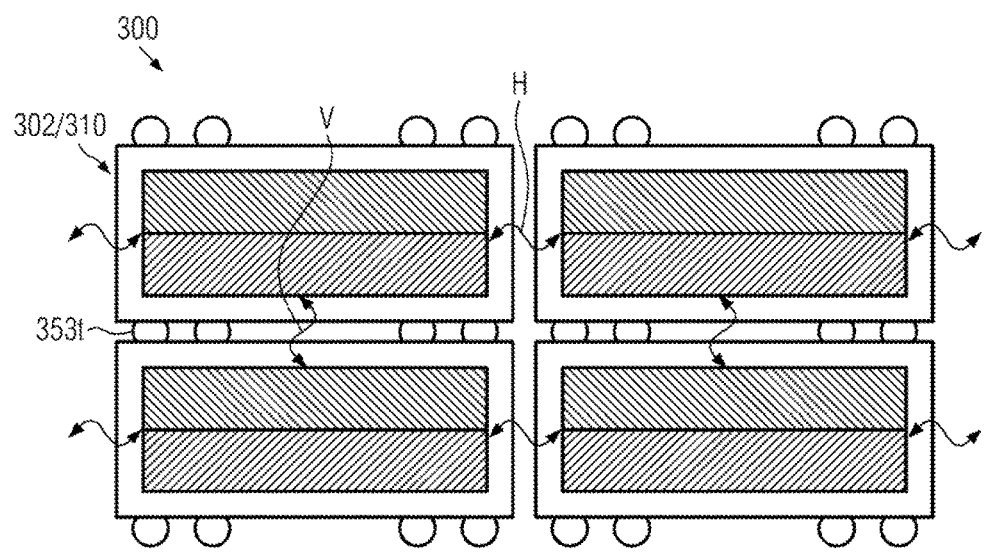
Figures 3, 4, 5, 6, 7, 8, 9, 10, 11, 12, 13, 14, 15, 16, 17, 18, 19, 20, 21, 22, 23, 24, 25, 26, 27, 28, 29:
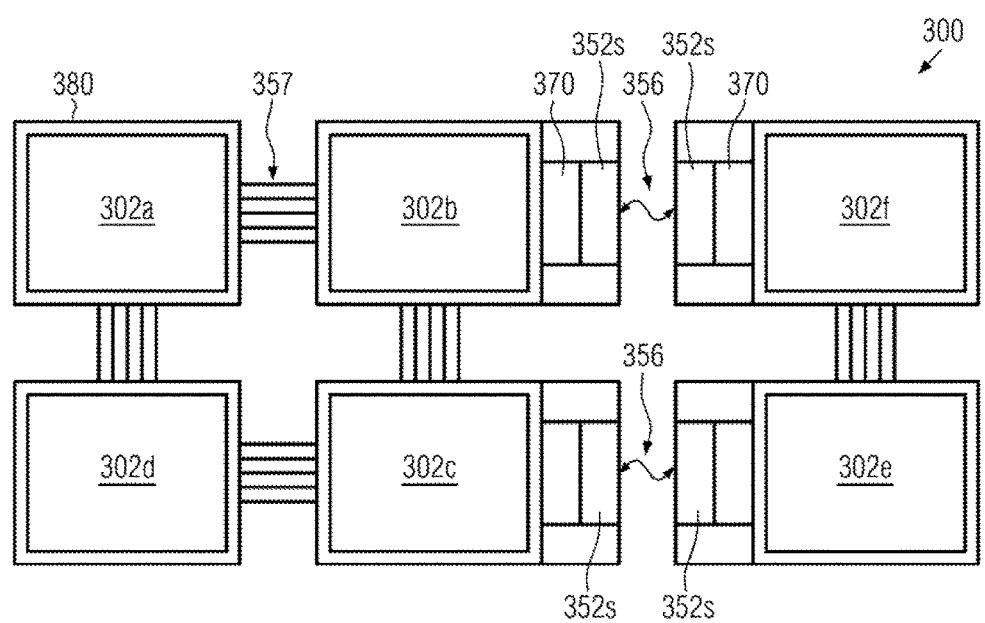
Figures 3, 4, 5, 6, 7, 8, 9, 10, 11, 12, 13, 14, 15, 16, 17, 18, 19, 20, 21, 22, 23, 24, 25, 26, 27, 28, 29, 30:
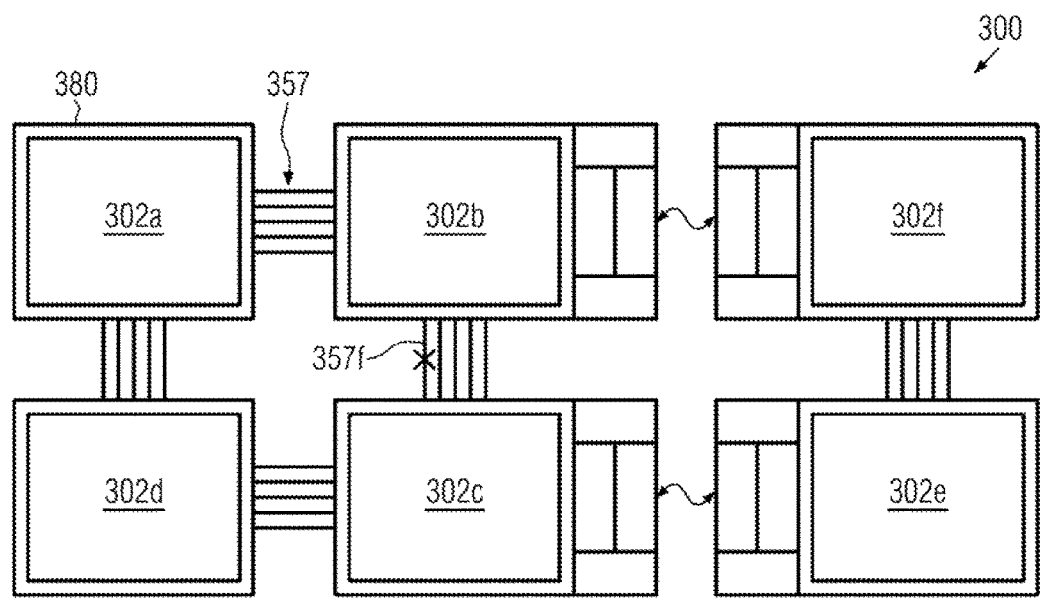
Figures 3, 4, 5, 6, 7, 8, 9, 10, 11, 12, 13, 14, 15, 16, 17, 18, 19, 20, 21, 22, 23, 24, 25, 26, 27, 28, 29, 30, 31:
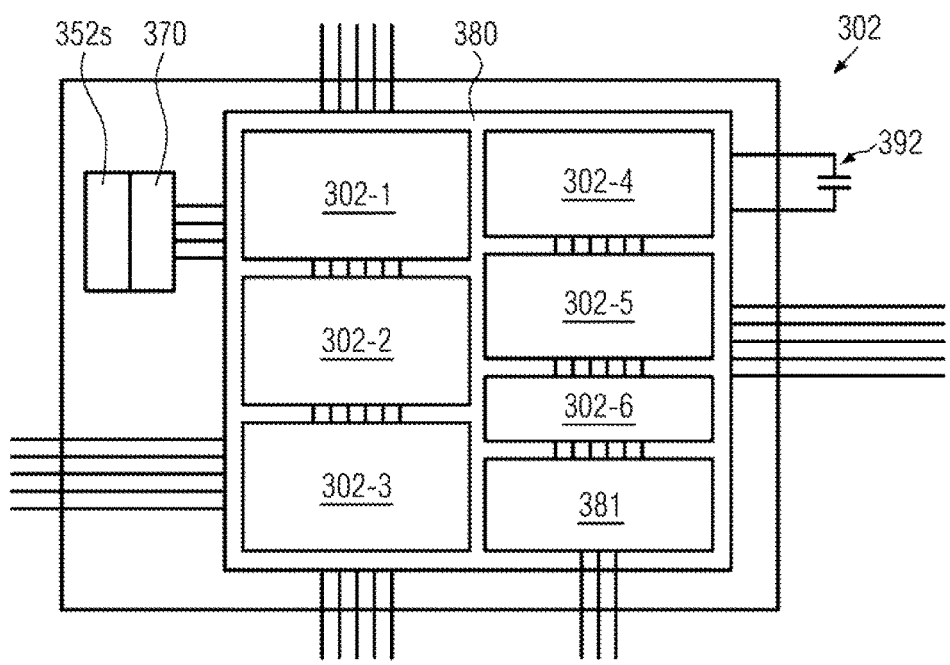
Figures 3, 4, 5, 6, 7, 8, 9, 10, 11, 12, 13, 14, 15, 16, 17, 18, 19, 20, 21, 22, 23, 24, 25, 26, 27, 28, 29, 30, 31, 32:
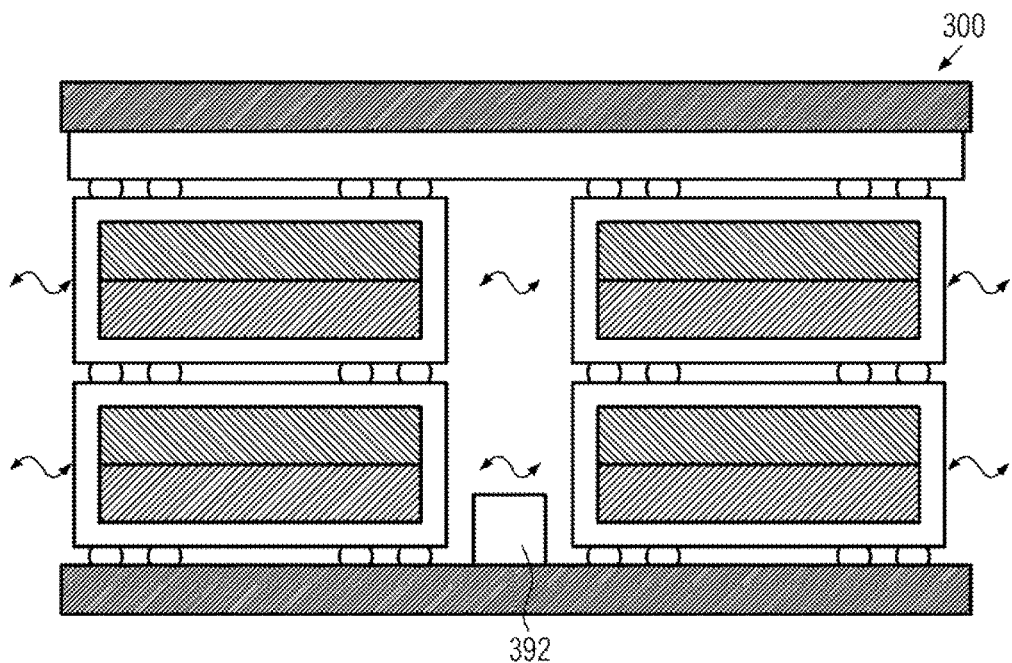
Figures 3, 4, 5, 6, 7, 8, 9, 10, 11, 12, 13, 14, 15, 16, 17, 18, 19, 20, 21, 22, 23, 24, 25, 26, 27, 28, 29, 30, 31, 32, 33:
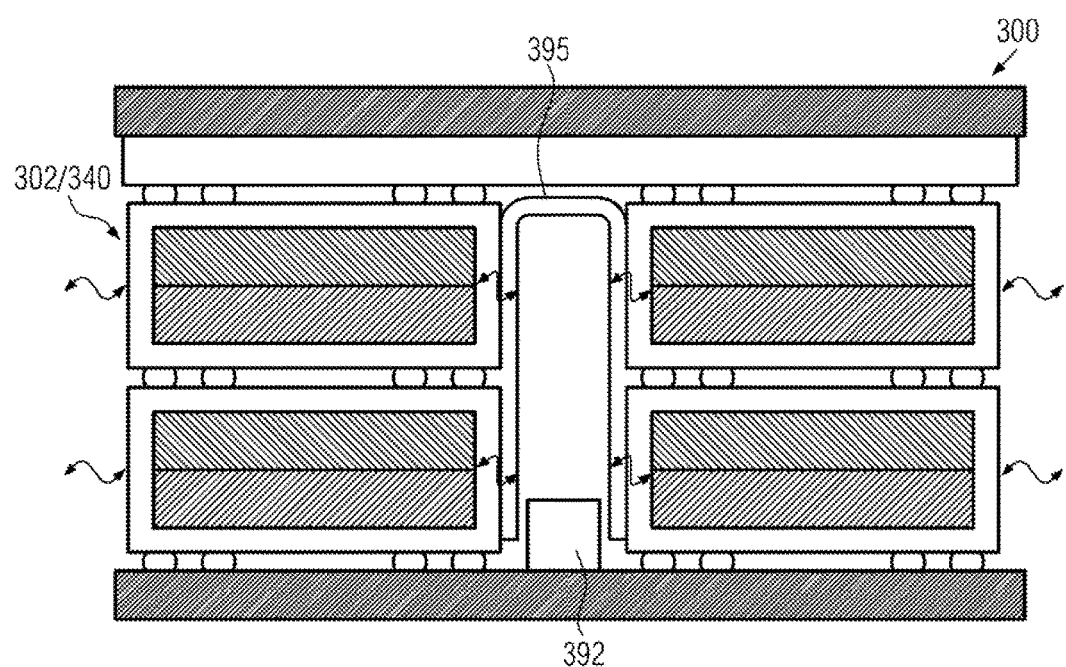

FIG. 3-5 schematically illustrates a cross-sectional view of a wafer 301 including a plurality of ICs 302a, 302b, 302c, as is for instance also discussed above with reference to FIG. 1a, according to an embodiment. Hence, the various ICs provided in the form of the wafer or substrate 301 may have formed thereon any appropriate circuitry and intercoupling mechanism as is required for configuring a complex three-dimensional electronic system. In particular, the respective electrical and/or optical and/or wireless intercoupling infrastructure of the individual ICs may be appropriately adapted so as to receive an additional communication mechanism, which enables the implementation of horizontal and vertical communication with other components of a complex electronic system, as discussed above.

FIG. 3-6 schematically illustrates the substrate 301 in a further advanced manufacturing stage, according to an embodiment. By means of a further process or post processing, for example, further conducting layers (not shown) intercoupled by vias (not shown) may be grown on the substrate 301 by any appropriate manufacturing techniques. These conductive regions are buried in an insulating, flexible material, such as for example a polymer. In other approaches, the insulating material may be provided first and may subsequently be patterned so as to receive trenches and openings, which may subsequently be filled with any appropriate conductive material, such as metal, and the like. After providing any conductive regions so as to establish the communication structure and the communication pads within the insulating material of the communication mechanism 350a, a patterning process may be applied so as to form respective gaps 355 in the mechanism 350, thereby defining an appropriate lateral size for individual communication mechanisms. As shown, the resulting gaps 355 are positioned above scribe lines 304, which separate the individual ICs, as discussed above. The patterning process for forming the gaps 355 may be performed on the basis of any well-established lithography and etching techniques.

FIG. 3-7 schematically illustrates the substrate 301 having formed thereon the patterned communication mechanism 350, which is brought into contact with an appropriate supported substrate 360, according to an embodiment. Consequently, the substrate of the individual ICs and the corresponding scribe lines are exposed for further processing, i.e., for separating the substrate 301 into individual integrated circuit chips.

FIG. 3-8 schematically illustrates the substrate 301 when subjected to a process for separating the substrate 301 into individual semiconductor chips, according to an embodiment. To this end, an appropriate mechanism 361, such as a saw or a laser or chemical-etch process, may be applied so as to remove the material of the scribe lines 304, wherein the mechanism 361 is controlled such that undue damage of any materials in the communication mechanism 350 is avoided.

FIG. 3-9 schematically illustrates the substrate 301 after removing the scribe lines while preserving the patterned communication mechanism 350, thereby enabling a subsequent separation into individual components, according to an embodiment. For example, as shown in this figure, the IC 302a may be obtained so as to include the mechanism 350a including an appropriate communication structure (not shown) and the required communication pads 352t, 352s. In this manufacturing stage, therefore, the IC 302a includes lateral appendices, which represent a portion of the communication mechanism 350a to be formed above the respective side surfaces of the IC 302a in order to impart horizontal communication capabilities to the IC 302a.

FIG. 3-10 schematically illustrates a top view of the IC 302a in this manufacturing stage, according to an embodiment. That is, the communication mechanism 350 includes a plurality of the communication pads 352t for providing the vertical-communication capabilities, while the communication pads 352s, which are still positioned in the same plane as the pads 352t, are formed in the insulating material at positions beyond the lateral dimensions of the IC 302a. It should be appreciated that for convenience, the communication structure that is appropriately configured to couple to the various communication pads and to the metallization system of the IC 302a is not shown.

FIG. 3-11 schematically illustrates the IC 302a as a part of an electronic system 300, wherein the mechanism 350a may be further processed so as to actually impart the horizontal-communication capabilities, according to an embodiment. To this end, known techniques may be used so as to appropriately fold the flexible material, thus defining the final shape of the communication mechanism 350a.

For example, one such technique may be implemented by heat forming 363, in which the lateral appendices are folded by means of a mechanical apparatus 364 with an appropriate shape. The process 363 is carried out at a temperature that results in a plastic deformation of the flexible material, which is later allowed to cool. According to this strategy, for example, materials based on polyester or polyimide may be used. Alternatively, materials with low elasticity may be used which can then be easily and permanently deformed, such as for example PTFE or FEP.

FIG. 3-12 schematically illustrates the substrate 301 having formed thereon the insulating material 354 of the mechanism 350, wherein the patterning of the material 354 is applied after separating the individual ICs by removing the material in the scribe lines 304, according to an embodiment. In this case, the insulating material 354 may be provided in the form of an elastic material, which may be cut after the separation of the individual ICs, thereby acting as a support member during the separation process.

FIG. 3-13 schematically illustrates the substrate 301 according to further illustrative embodiments, in which the substrate is cut in a traditional way, without the layer of insulating material of the communication mechanism. The various ICs 302a, . . . , 302c may then be arranged in a known way on a support (not shown), thereby defining a desired lateral distance D between the laterally adjacent ICs. For example, the final distance D may be greater compared to the width of the scribe lines 304, thereby providing for superior process conditions during the subsequent processing in forming and patterning the communication mechanism. Thereafter, a molding material 365 may be applied so as to fill the space between the various ICs and provide appropriate surface conditions for forming the conductive regions and the insulating material 354 of the communication mechanism 350. Thereafter, the conductive and insulating materials of the communication mechanism 350 may be applied on the basis of any appropriate deposition and patterning technique, followed by the patterning of the mechanism 350, wherein the molding material 365 may provide superior process conditions so as to preserve integrity of the integrated circuit chips, while also providing the possibility of adjusting a desired lateral size of the patterned mechanism 350. Furthermore, by means of the molding material 365 also a desired lateral size of the individual chips 302a, . . . , 302c may be adjusted, when the molding material is not completely removed but is patterned when forming the individual ICs having formed thereon the corresponding communication mechanisms with appropriate appendices, as is described above. Thereafter, the final configuration may be obtained by any appropriate processing, such as heat forming, as discussed above.

FIG. 3-14 schematically illustrates a further modification, in which the ICs 302a, . . . , 302c, after being singled out from the wafer, may then be coupled to a communication mechanism including an insulating material and a communication structure and communication pads, wherein the coupling may be accomplished on the basis of any appropriate contact structure (not shown) provided in the form of bumps, and the like, according to an embodiment. In other illustrative embodiments, as shown in the figure, the communication mechanism may be provided in the form of individual mechanisms 350a, . . . , 350c including the infrastructure so as to impart the desired vertical and horizontal communication capabilities to the respective ICs received thereon, as is already discussed above. Thereafter, the components may be removed from the support 360 and the communication mechanisms 350a, . . . , 350c may be brought into the final shape by any of the above-discussed process techniques.

FIG. 3-15 schematically illustrates the combination of the IC 302a and the associated communication mechanism 350a on the basis of the above-described technique, wherein, however, the mechanism 350a may be provided in its final configuration prior to actually coupling the IC 302a, according to an embodiment. To this end, any appropriate technique may be used for preforming the mechanism 350a.

FIG. 3-16 illustrates the formation of the mechanism 350a on the IC 302a according to a further variation, according to an embodiment. In this case, after the traditional wafer processing for providing the individual ICs, the various material layers of the mechanism 350a may be formed by means of a post-processing, such as, for example, aerosol jet printing. In this manner, the conductive regions and the insulating material may be grown on the IC 302a, wherein the insulating material may not necessarily be provided in the form of a flexible material. As already discussed above, in some illustrative embodiments in any of the above-discussed techniques a molding material may be provided so as to allow the various ICs in the electronic system to have appropriate dimensions for forming a desired configuration of ICs and packages in the electronic system. For example, the molding material may be used to impart similar lateral dimensions to the various ICs, irrespective of the initial dimensions of these components. In this manner, integrated-circuit chips of initially different lateral dimensions may efficiently be combined as a stacked configuration while still providing for desired vertical and horizontal coupling.

FIG. 3-17 schematically illustrates the IC 302a as a part of the electronic system 300, which is still positioned on a support member 360 in order to form the mechanism 350a according to any appropriate technique, as discussed above, according to an embodiment. Furthermore, prior to or after forming the mechanism 350a, the molding material 365 may be provided adjacent to at least some side surfaces of the IC 302a in order to obtain desired lateral dimensions of the combined component 350a, 302a for being integrated into the system 300. The molding material 365 may be formed on the basis of well-established deposition and patterning techniques. For example, the mechanism 350a may be provided in its final configuration prior to insulating the IC 302a and may then be filled with the molding material 365. However, any other approach may be applied in order to form the molding material 365 with desired dimensions. It should be appreciated, however, that the mechanism 350a is to be formed so as to take into consideration the final lateral dimensions of the combined component 350a, 302a.

FIG. 3-18 schematically illustrates an example of a composite configuration in the system 300, wherein the IC 302a and the associated communication mechanism 350a have been modified on the basis of the molding material 365 so as to have lateral dimensions that match with the lateral dimensions of a combined component including the IC 302b and the associated communication mechanism 350b, according to an embodiment. Hence, a stacked configuration may be provided, although the ICs 302a, 302b have initially different lateral dimensions. Furthermore, vertical and horizontal communication capabilities are obtained by means of the communication mechanisms 350a, 350b. It should be appreciated, however, that any other configurations may be realized, as will also be discussed below.

FIG. 3-19 schematically illustrates an embodiment, in which a common communication mechanism 350 may be provided for two or more laterally adjacently positioned ICs.

In the embodiment shown, the electronic system 300 includes the IC 302a positioned laterally adjacent to the IC 302b, wherein desired lateral dimensions of a combination of these ICs may be adjusted on the basis of a molding material 365, as is, for instance, also discussed above. Moreover, by providing the molding material 365, a reliable mechanical coupling between the laterally adjacent ICs may be accomplished. Furthermore, the system 300 may include a further IC 302c, which is particularly coupled to the ICs 302a, 302b. In this example, the vertical communication from the IC 302c to one or both of the ICs 302a, 302b may be established on the basis of a dedicated communication mechanism 350c, while in other cases, any other coupling strategy may be used, if, for instance, a lateral or horizontal communication capability is not required for the IC 302c. Moreover, a common communication mechanism 350 is provided for the ICs 302a, 302b, wherein the communication structure (not shown) is appropriately adapted to the chip internal contact mechanisms, such as a metallization system, in order to transfer any signals and/or power from each of the ICs 302a, 302b into the common communication mechanism 350, which thus endows the ICs 302a, 302b with horizontal and vertical communication capabilities.

FIG. 3-20 illustrates a further variant, in which each of the ICs 302a, 302b has formed thereon a dedicated communication mechanism 350a and 350b, respectively, according to an embodiment. In this case, horizontal communication between the IC 302a, 302b may be established on the basis of corresponding communication pads 352s facing each other.

FIG. 3-21 schematically illustrates a further variant of the electronic system 300, wherein a complex configuration of a plurality of ICs, such as the ICs 302a, 302b, 302c, may be combined to form a stacked configuration by any appropriate contact mechanism without requiring a communication mechanism as discussed above, according to an embodiment. To this end, the ICs may be coupled by direct mechanical and electrical contact and/or by wireless communication channels, and the like, wherein, however, a mechanically fixed configuration is ensured. Thus, vertical communication between the IC 302c and the ICs 302a, 302b is established without a communication mechanism, while the vertical and horizontal communication is imparted to the combination of the ICs 302a, . . . , 302c by providing a common communication mechanism 350, which thus is formed above the top surface of the resulting stack and extends at least a significant portion along the side surfaces.

Figure 1B:
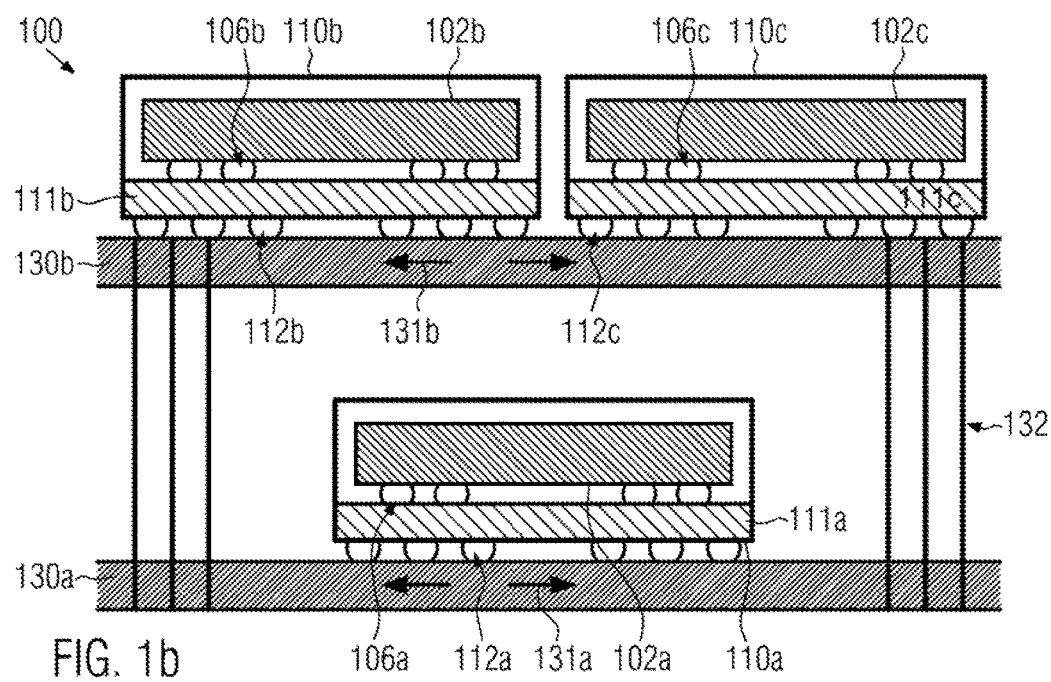
FIGS. 1b and 1c schematically illustrate cross-sectional views of conventional electronic systems including a plurality of packaged integrated-circuit chips in combination with stacked PCBs.
Figure 1C:
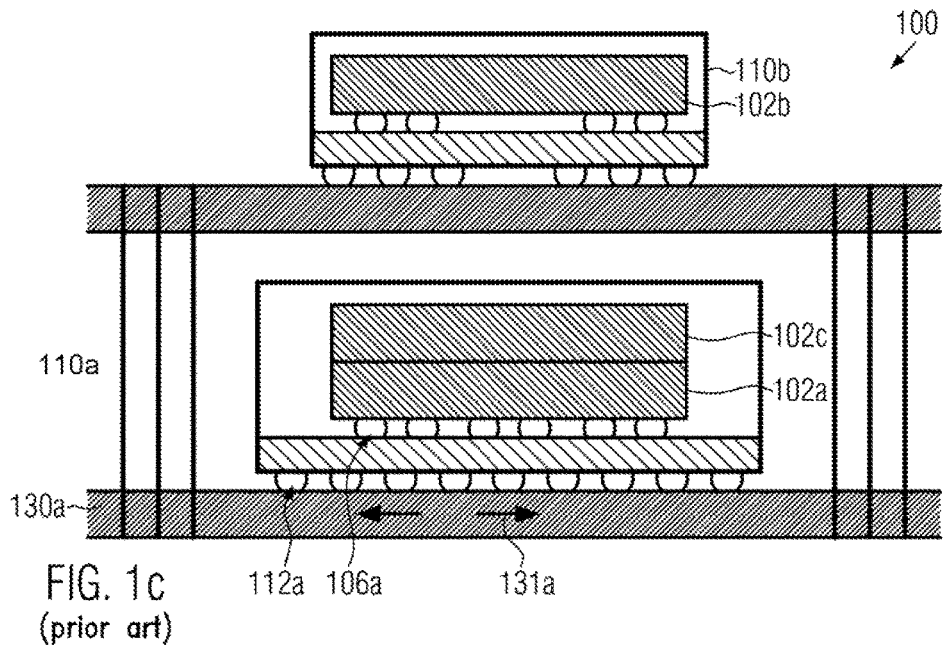
Figure 1D:
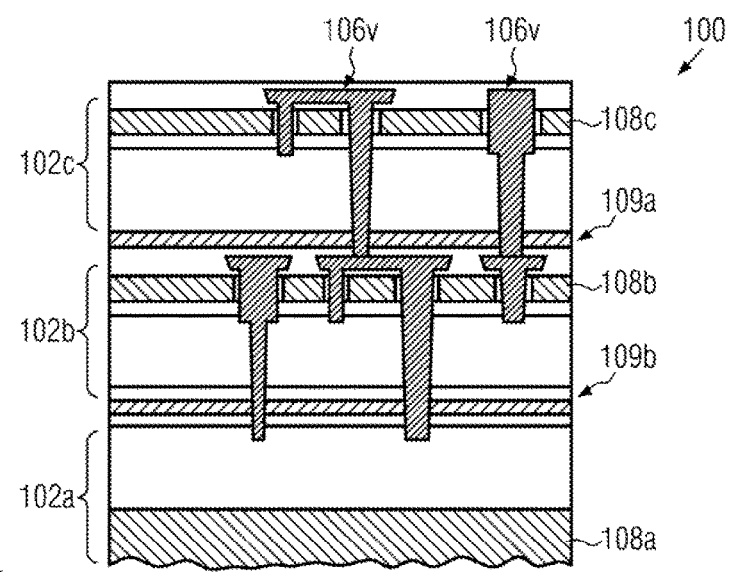
FIG. 1d schematically illustrates a three-dimensional configuration, i.e., a stacked configuration, of a plurality of integrated-circuit chips formed on the basis of appropriate through-hole vias.

FIG. 3-22 schematically illustrates a complex electronic system 300, in which a plurality of packages 310a, . . . , 310d are combined on the basis of respective communication mechanisms 350a, . . . , 350d so as to provide vertical and horizontal communication within the system 300, according to an embodiment. Furthermore, the system 300 may include a plurality of PCBs, such as a PCB 330a, as a bottom PCB, and a PCB 330b as a top PCB. Due to the three-dimensional communication capabilities within the electronic system 300, wherein, in particular, horizontal communication capabilities are provided by the corresponding communication mechanisms 350a, . . . , 350d, superior coupling may be established in the system 300 while at the same time reducing the dimensions of the total system. For example, the routing at the PCB level, as indicated by 331a, 331b, is reduced, thereby also allowing a reduction in the horizontal area in the corresponding PCBs as well as a reduction in the overall complexity in terms of the number of layers in the PCBs. Furthermore, compared to vertical couplings of different PCBs, for instance as discussed above with reference to FIGS. 1b and 1c in the form of the couplings 132, which are typically provided in the form of wireless or conductive couplers, also a significant reduction in complexity may be achieved due to the vertical and horizontal communication capabilities of the system 300.

FIG. 3-23 schematically illustrates a variant of the system 300, in which one or more PCBs, for instance the PCB 330b, may be separated from the remaining components of the system 300 by providing a coupling interface or socket 335, according to an embodiment.

FIG. 3-24 schematically illustrates the system 300, in which one or more of the communication mechanisms may include an antenna for providing a wireless communication channel, according to an embodiment. For example, the communication mechanism 350a may include one or more of the communication pads 352s in an appropriate configuration so as to act as endpoint or antenna of the circuit 370, which may be appropriately configured to receive and transmit signals by the communication structure 351 so as to allow wireless communication with other components by means of the antenna 352s. The type of antenna is not limited to any specific type so that many types of antennas may be provided, such as antennas of the inductive type or of the capacitive type or still others. For example, pads 352s may be used as an antenna of the capacity type and, therefore, the corresponding pad may be considered as one of the plates of a capacitor. Hence, this capacitor electrode may be linked to the circuit 370, acting as a transceiver/transponder.

FIG. 3-25 illustrates an example of the electronic system 300, in which a plurality of ICs 302 and/or packages 310 include respective communication mechanisms 350a, . . . , 350h, wherein corresponding communication pads 352s are positioned close to each other so as to enable a capacitive coupling, according to an embodiment. Therefore, the various ICs and packages exchange information by means of their respective capacitive interfaces created by the various pads 352s. In some illustrative embodiments, the wireless exchange of information may also be established in the vertical direction between at least some of the ICs 302 and/or packages 310 by appropriately coupling the respective communication pads 352t.

In this manner, coupling of an electromagnetic type is provided, since the various ICs and packages exchange information through electromagnetic waves, or through an electric field or magnetic field only.

FIG. 3-26 schematically illustrates the electronic system 300, in which at least a part or the entire communication is established on the basis of electromagnetic interaction/communication, as indicated by H and V, according to an embodiment. On the other hand, the various ICs and packages may be supplied with energy in a conventional manner, for instance by using wired couplings in the form of TSV, and the like. It should be appreciated that the wireless communication may also be established on the basis of antennas of the inductive type or antennas enabling receipt and transmission of electromagnetic radiation, thereby providing for a high degree of flexibility in implementing appropriate circuitry and other infra-structure into the ICs and packages in order to establish the wireless communication channels. In other cases, the wireless communication may be established on the basis of optical signals, wherein the corresponding communication pads may be optically active windows for receiving and emitting optical signals, wherein appropriate optical components may be provided in the communication structure so as to enable deflection and guidance of light signals.

FIG. 3-27 schematically illustrates the electronic system 300 according to other illustrative embodiments, in which a mixed configuration is implemented. In this case, some of the ICs or packages are coupled by direct electric contact, in which the ICs are coupled with respective contact elements 353*t*, as is, for instance, shown for the vertical communication between the communication mechanisms 350*b*, 350*c* on the one hand and for the communication mechanisms 350*g* and 350*f* on the other hand.

FIG. 3-28 illustrates the system 300, which may represent a highly complex electronic system in which vertical and horizontal communication may be established by means of wireless communication channels in combination with wired channels, for instance indicated by 353*t*, thereby also allowing highly complex systems at reduced size, similarly as is explained for the system 300 discussed in FIG. 3-26, wherein the vertical and horizontal communication may substantially totally be established on the basis of wireless communication channels, according to an embodiment. Thus, systems with extremely high coupling may be obtained, thus greatly reducing the length of the links or couplings between the various ICs and packages and, therefore, enabling an increase in the frequency of transmission of the signals. Furthermore, due to high coupling, more degrees of freedom in the design of the systems may be achieved.

With reference to FIGS. 3-29 to 3-31, further illustrative embodiments will be described, in which the superior coupling may even further be enhanced by taking advantage of the vertical and horizontal communication capabilities by means of configurable or programmable circuits so as to create a flexible infra-structure belonging to at least a portion of a complex electronic system.

FIG. 3-29 schematically illustrates the electronic system 300, in which some ICs or packages 302*a*, . . . , 302*d* are coupled by wired communication channels 357, which may be established on the basis of, for instance, the communication mechanisms described above, according to an embodiment.

Furthermore, some of the ICs, such as ICs 302*f*, 302*e*, 302*b* and 302*c* may be coupled by wireless communication channels 356, which may be implemented by providing respective transceiver circuits 370 and by configuring the corresponding communication pads 352*s* in the form of antennas, optical windows, and the like, as discussed above, according to an embodiment.

Moreover, various ICs and packages have at least a part of their communication capabilities, i.e., cabled and/or wireless links, provided in the form of a configurable arrangement, thus allowing one to define and redefine the routing of the links among the various parts of the system, depending on the needs and the configuration of various parts forming the system 300, according to an embodiment. To this end, respective configurable/programmable circuit portions 380 may be provided in combination with the actual ICs in order to provide digital circuitry, analog circuitry, and the like, for establishing, activating, and deactivating at least some of the wired communication channels 357 and/or of the wireless communication channels 356. That is, these programmable/configurable circuits 380 may be arranged around the various circuits of the ICs and packages and may be programmed, for example, by means of digital signals. The configurable circuits 380 may also include analog circuits, such as electronic switches, so as to be able to process and handle analog and RF signals. In this manner, the final configuration of the communication capabilities of the system 300 may be adjusted in a very-late manufacturing stage, for instance, upon assembling the system 300, or may even be adjusted or altered upon completing the heart-gap configuration of the system 300, thereby providing for superior flexibility in assembling the system 300, testing the system 300, and operating the same. For example, even during operation of the system 300, the communication capabilities may be adjusted with respect to the requirements imposed by a corresponding application, in which the electronic system 300 is used. Hence, for a given hardware configuration of the system 300, the communication capabilities may be adjusted in a dynamic manner.

In still other embodiments, the configurable circuits 380 in combination with the communication channels 357, 356 or at least a portion thereof, may provide for a certain degree of redundancy with respect to the vertical and horizontal communication capabilities, thereby enabling a re-configuration of the system internal communication upon detecting a failure in one or more of the previously established communication channels.

FIG. 3-30 schematically illustrates the electronic system 300, in which one of the wired communication channels 357, indicated by 357*f*, may have been identified as a non-functioning channel during a corresponding test phase, which may be conducted after assembling the system 300 or during operation of the system 300, according to an embodiment. Consequently, due to the configurable nature of the communication channels, or at least a portion of, and due to a certain degree of redundancy due to the addition of communication resources to the system, the system can be repaired, so that the communication between the ICs 302*b*, 302*c* may still be operated in a fully functional manner and re-established, thereby extending the system's lifetime and improving the system's reliability.

FIG. 3-31 schematically illustrates an IC 302 according to embodiments, in which also the various parts of the IC 302 may be intercoupled with each other by means of cabled or wireless couplings, which are configurable or programmable so as to have further degrees of freedom when designing and implementing the final system, thus allowing the user to address each single circuit portion of each IC which make up the final system. For example the various portions of the IC 302, such as portions 302-1, . . . , 302-6 in the form of a memory, digital circuitry, analog circuitry, RF circuitry, mixed-signal circuitry, and other components, such as microelectromechanical components, optoelectronic components, and the like, may be intercoupled by configurable communication channels. To this end, the IC 302 may include the configurable circuit portion 380, which may include an appropriate interface 381 in order to allow external access to the chip internal communication structure and/or to enable chip internal re-configuration of the communication channels, for instance on the basis of a part of the IC 302. It is appreciated that the interface circuit 381 may be accessed, for example, by digital signals or by analog signals, depending on the overall application.

Since the various ICs may also include analog circuits, RF circuits, mixed signal circuits, and the like, they may use passive components 392 external to the package, for example a capacitor, as shown in the FIG. 3-31, according to an embodiment. Due to the high coupling of the system 300, such passive components 392 may be arranged in the most convenient way, for example, by distributing them on the various PCBs (not shown) to which the various ICs and packages are coupled.

FIG. 3-32 schematically illustrates the system 300 according to further illustrative embodiments, in which, due to the wireless communication capabilities, the passive components 392 may be also arranged between the various ICs and packages of the system 300 without reducing its coupling, thereby reducing the complexity of any PCBs.

FIG. 3-33 schematically illustrates a variant of the previous embodiment, in which a substrate of flexible material 395 may be provided so as to include antennas and transmission lines in order to enable wireless communication among the various ICs, while still enabling the incorporation of the "external" circuit component 392, according to an embodiment.

With reference to FIGS. 4a to 4g, further illustrative embodiments will now be described, in which the communication mechanism may be implemented on side surface areas of a package, according to an embodiment.

Figure 4A:
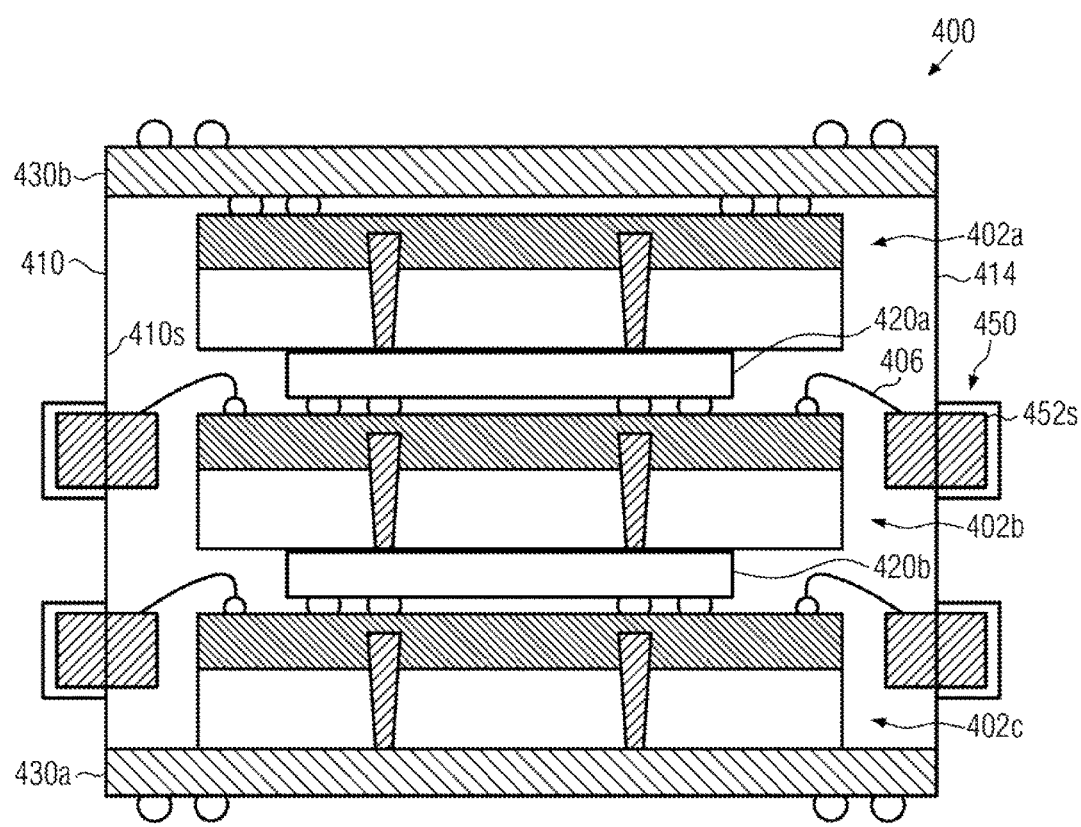
FIGS. 4a to 4c schematically illustrate cross-sectional views of an electronic system, in which superior coupling is achieved by providing one or more communication pads, according to an embodiment.

FIG. 4a schematically illustrates an electronic system 400 including a plurality of ICs 402a, . . . , 402c provided in a stacked configuration, thereby establishing the vertical communication between the individual ICs of the electronic system 400, according to an embodiment. For example, interposers 420a, 420b may be provided so as to increase the distance between the individual ICs and provide for communication channels in the vertical direction. Furthermore, a package 410 may be provided so as to accommodate the ICs and couple to respective PCBs 430a, 430b. Furthermore, a communication mechanism 450 is provided, which may implement horizontal communication capabilities for the package 410 by providing corresponding communication pads 452s, for instance in the form of appropriate contact elements such as leads, and the like. Consequently, the communication pads 452s may be formed in a dielectric material 414 of the package, thereby electrically insulating the pads from each other. Moreover, the communication pads 452s may be formed above respective side surfaces of at least some of the ICs of the system 400. Moreover, the pads 452s may be coupled to respective ICs by means of the wire bond structure 406, while on the other hand a coupling to the interposers 420a, 420b, respectively may be established by direct contact using any appropriate contact technique. In order to enhance overall contact reliability, the surface of the pads or leads 452s may be coated with any appropriate material, such as solder material, and the like.

FIG. 4b schematically illustrates the electronic system 400 according to some illustrative embodiments during various stages of assembly, wherein packages 410a and 410b are initially coupled to an external mechanical contact structure 496, for instance similar to a lead frame, which has one or more levels of leads or terminals to which the various pads are coupled through wire bonding as shown in the upper portion of FIG. 4b.

The lower portion of FIG. 4b illustrates the device 400 after providing an additional level in the packages, which may not require a coupling to the side surface of the packages. After a molding process, the mechanical structure 496 external to the packages is removed, for example by means of sawing, thus leaving the leads or pads only, which are here made of a conducting material, for example a metal.

Figure 4C:
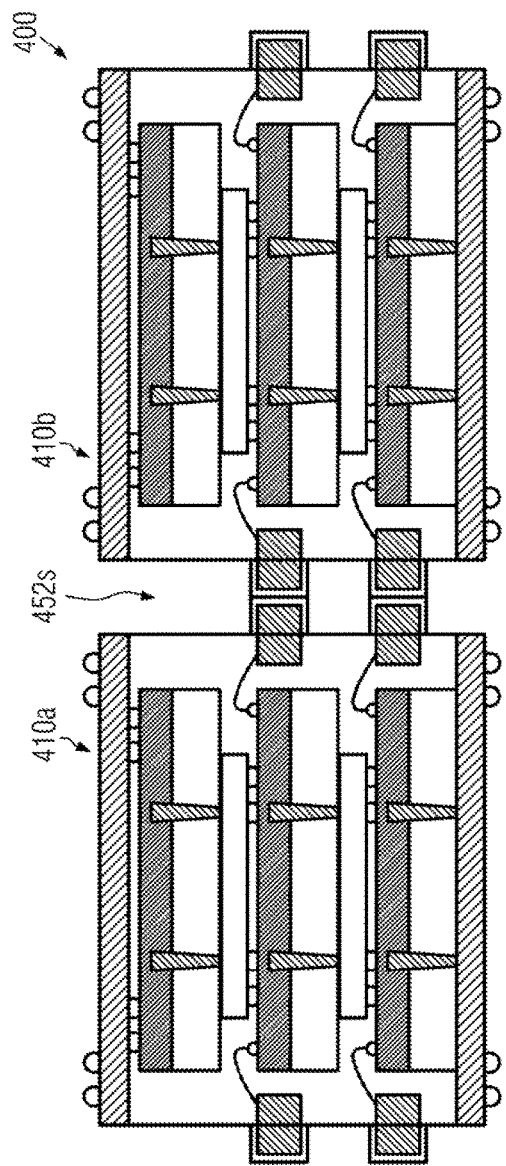

FIG. 4c illustrates the system 400 according to illustrative embodiments, in which various ICs and packages may be coupled with each other both in the vertical and in the horizontal direction, thus increasing the coupling and the complexity of the final system and reducing its volume.

Figure 4D:
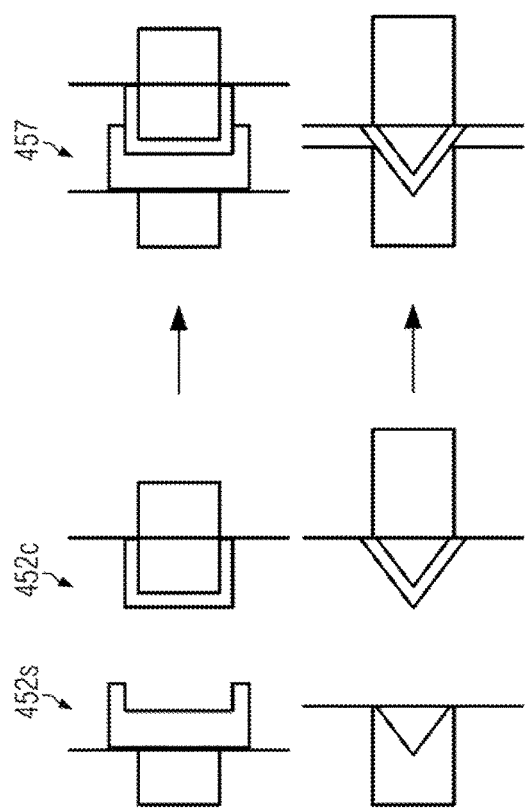
FIG. 4d schematically illustrates contact structures for horizontally coupling different packages on the basis of communication pads or contacts provided in the side surface of packages, according to an embodiment, FIGS. 4e to 4g schematically illustrate cross-sectional views of electronic systems, in which one or more communication pads are formed in the side surface of the package so as to provide for wireless-communication capabilities, according to an embodiment.

As shown in FIG. 4d, the communication pads or leads may have different geometrical shapes and/or appropriate surface coatings so as to create mechanical structures, which can be fit to each other in order to facilitate the creation of the whole system, according to an embodiment. For example, as illustrated, complementary geometric shapes for communication pads 452s, 452c may be provided so as to establish a reliable horizontal wired communication channel 457.

Figure 4E:
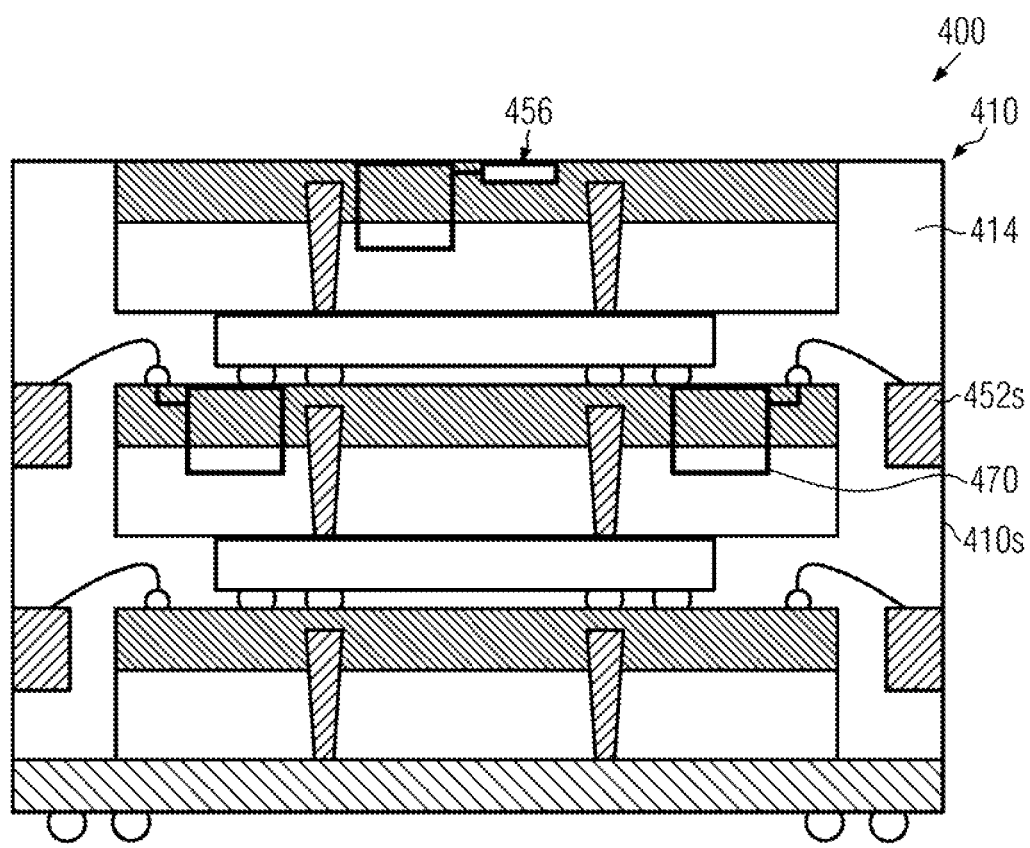

FIG. 4e schematically illustrates the system 400, in which wireless links or wireless couplings may also be implemented, according to an embodiment. For example, the system 400 may include the communication pads 452s with appropriate configuration so as to act as an antenna, which may be coupled to the corresponding transceiver circuit 470 in the associated IC. In this manner, the pads 452s may appropriately be embedded into the dielectric material 414 of the side surface 410s of the package 410. In this case, a substantially planar surface configuration may be obtained at the side surface 410s. Furthermore, other wireless communication channels may be implemented, as for instance indicated by 456 so as to provide for vertical wireless communication of the package 410. For example, as also previously discussed, the pads 452s may be used as a capacitive interface and may also not protrude from the surface of the package 410.

Figure 4F:
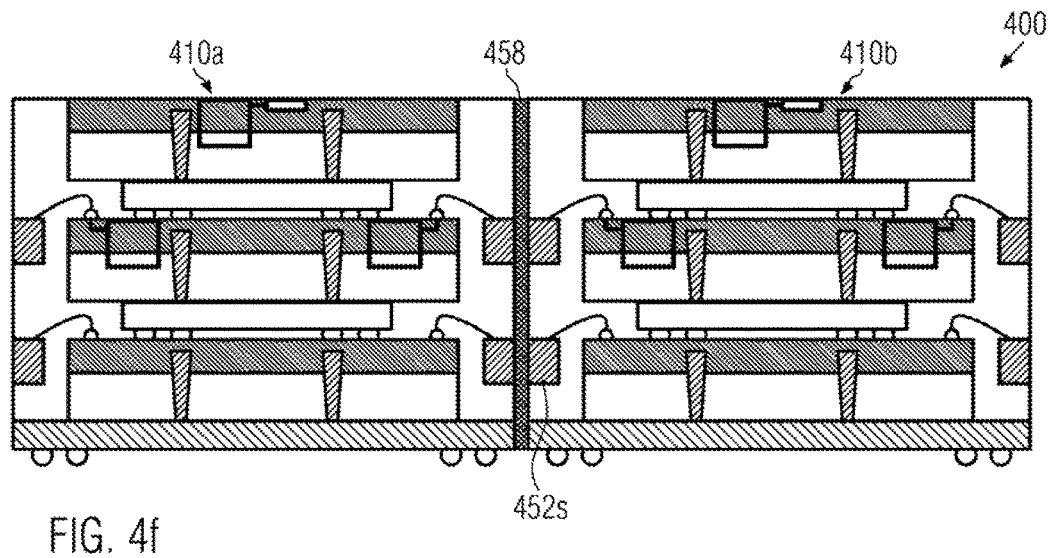

FIG. 4f schematically illustrates a further embodiment, in which an increase of the capacitive coupling among the pads 452s is achieved by providing a dielectric material 458 at the respective sides of the packages 410a, 410b, according to an embodiment.

Figure 4G:
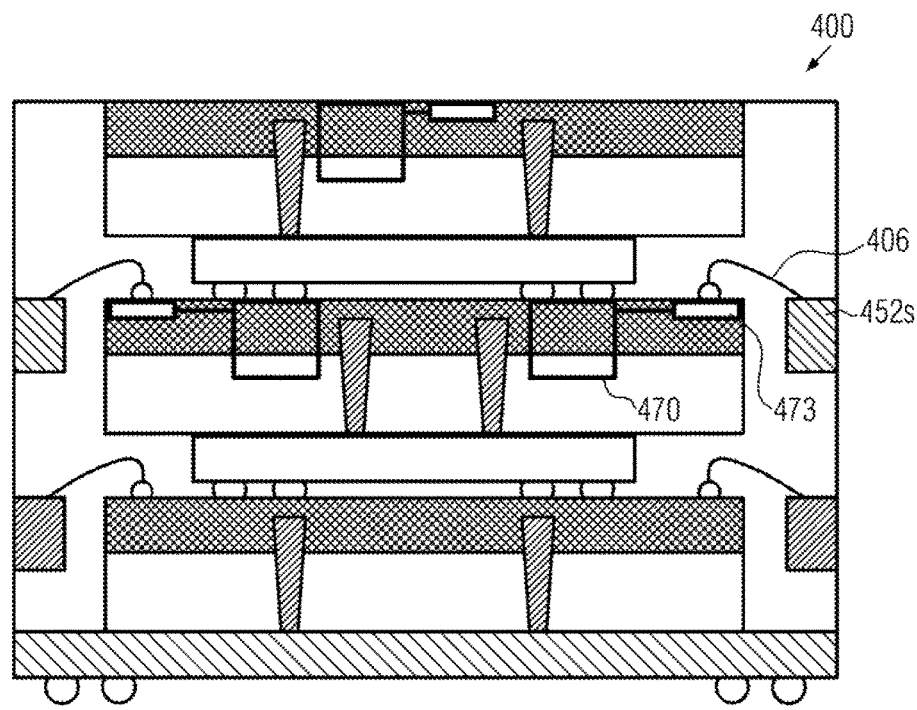

FIG. 4g schematically illustrates a further variant, in which at least some of the pads 452s may also be used as an interface of a magnetic type, according to an embodiment. To this end, the pads 452s are formed at least partly of materials with magnetic properties. For example, conductive soft-magnetic materials may be used. In this case, the associated wire-bond structure 406 is at least partly made of materials with magnetic properties and one of its ends is arranged in the vicinity of an antenna 473 of the inductive type, for example, by coupling such an end to a pad. The antenna 473, in turn, is coupled to the transceiver circuit 470.

With reference to FIGS. 5a to 5f, further illustrative embodiments will now be described, in which the communication mechanism is implemented in the form of a package including a flexible substrate material, in which respective components of the communication mechanism are implemented.

Figure 5A:
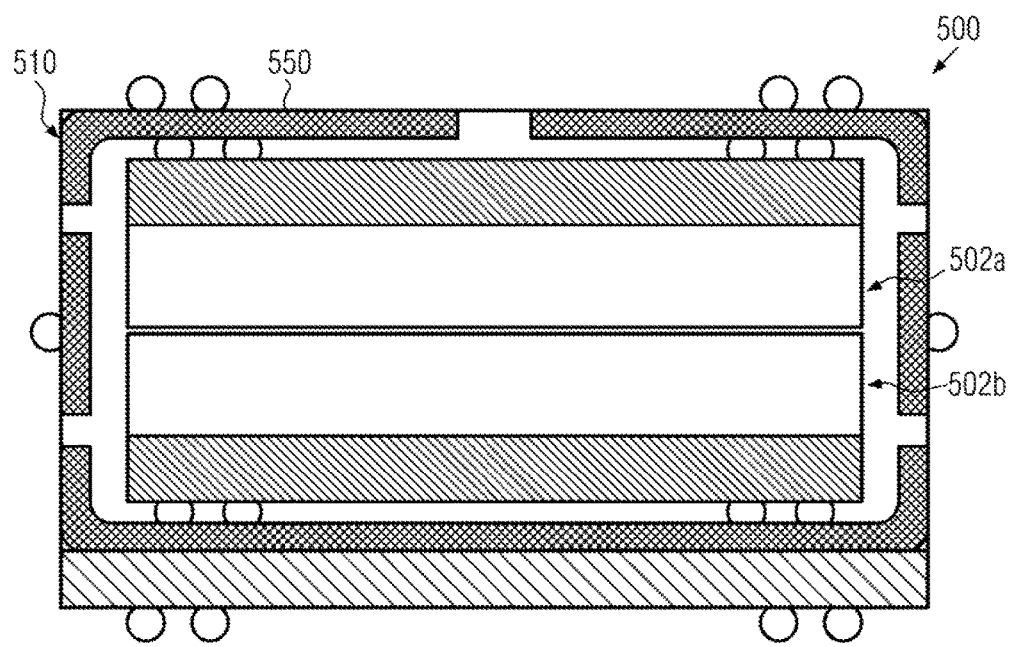
FIG. 5a schematically illustrates a cross-sectional view of a package of an electronic system including a flexible substrate including a communication structure and a communication pad, according to an embodiment.

FIG. 5a schematically illustrates an electronic system 500 including a plurality of ICs 502a, 502b, which may communicate in the vertical direction by using any appropriate mechanism, as for instance also discussed above, according to an embodiment.

Furthermore, a package 510 accommodates the ICs 502a, 502b and includes as a portion thereof or inside the corresponding package material a flexible substrate in the form of a flexible printed circuit which provides the lateral couplings of the package 510. The flexible printed circuit may represent the communication mechanism 550, which may impart horizontal communication capabilities to the package 510 and thus to the ICs 502a, 502b contained therein. The package 510 may include a single IC (not shown), while in other cases two or more ICs may be provided, wherein, instead of a direct-contact structure between the various ICs, the corresponding vertical coupling may be established via the communication mechanism 550 in the form of a flexible printed circuit. In other cases, each IC may individually be packaged on the basis of the flexible printed circuit, which in turn may appropriately be configured so as to allow direct or wireless communication with any adjacent package.

Figure 5B:
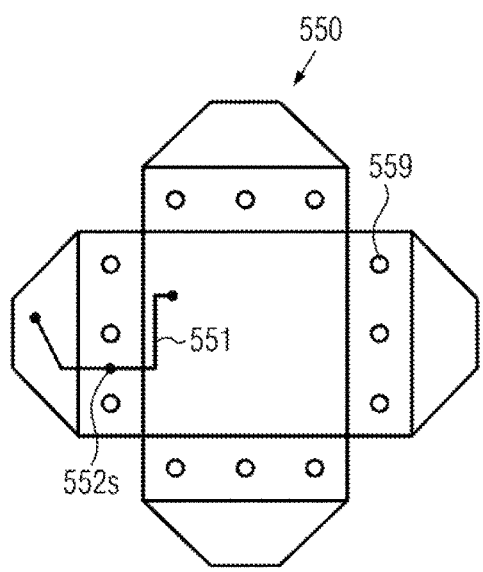
FIGS. 5b and 5c schematically illustrate top views of a flexible substrate, according to an embodiment.
Figure 5C:
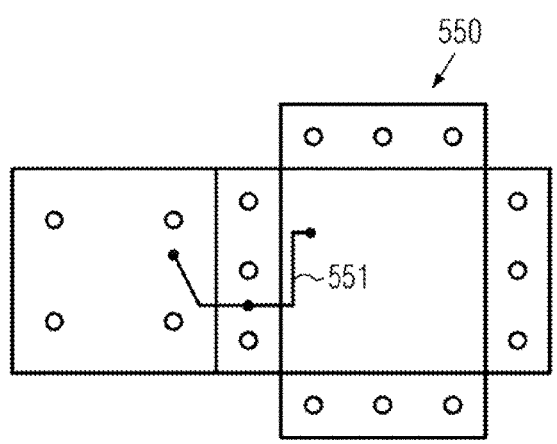

As shown in FIGS. 5b and 5c, the communication mechanism 550 in the form of the flexible printed circuit may have several shapes depending on the application and on the technique/assembly process used, according to an embodiment. As illustrated, the communication structure 551 coupling the various communication pads, such as lateral pads 552s, may have any appropriate configuration so as to provide for the desired coupling. The flexible printed circuits 550 may be provided with holes or with any other appropriate openings 559 so as to facilitate molding operations in order to provide for mechanical and electrical stability and integrity of the package.

Figure 5D:
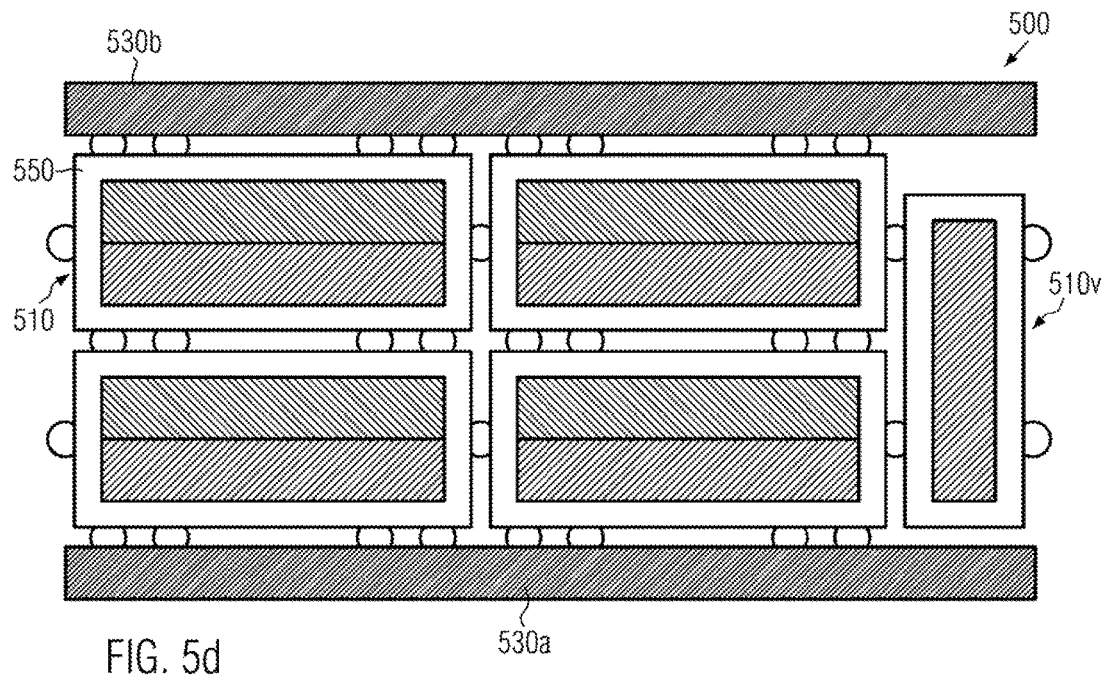
FIGS. 5d to 5f schematically illustrate cross-sectional views of electronic systems formed on the basis of a flexible substrate, according to an embodiment.
Figure 5E:
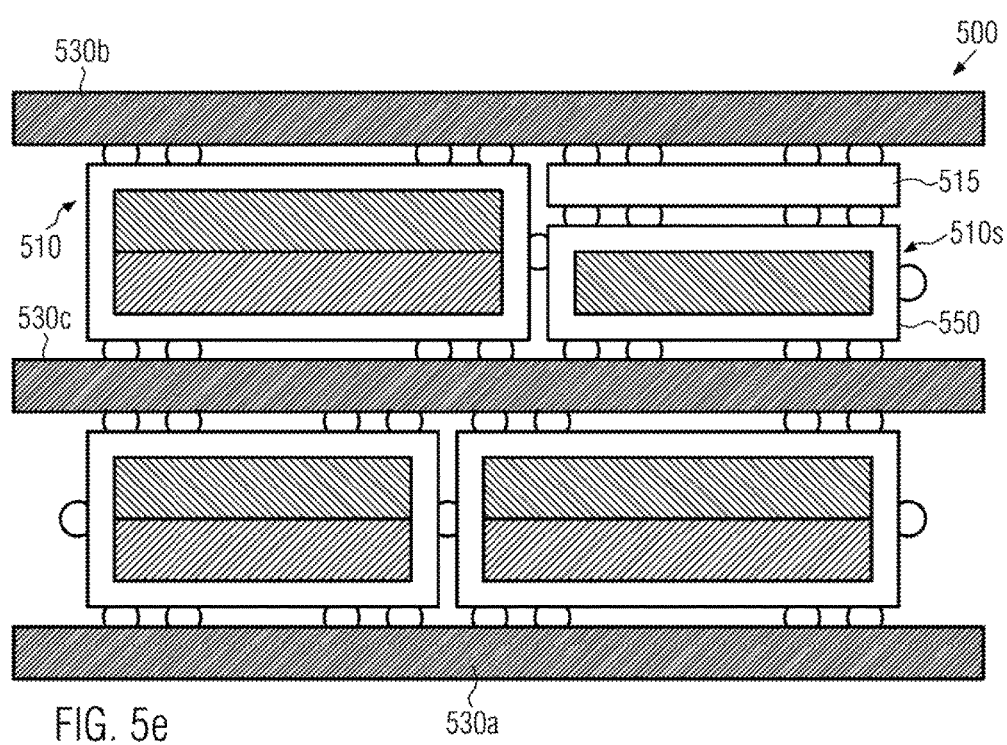

As shown in FIGS. 5d and 5e also in this case, the system 500 with a desired number of packages 510 may be implemented so as to have high coupling, and the packages 510 may be arranged with respect to each other in several ways, according to an embodiment. In the example shown in FIG. 5d, the packages 510 are arranged both in a horizontal and vertical direction, such as the package 510v with respect to the PCBs 530a, 530b.

In the embodiment shown in FIG. 5e, in addition to, or alternatively, an adapting substrate 515 may be implemented so as to enable the adaptation of the various packages 510 so as to comply with the configuration of the final system, according to an embodiment. For example, the package 510s of reduced height may be appropriately coupled to the PCB 530b by using the adapter 515.

Generally, it should be appreciated that due to communication mechanism 550 provided in the form of a flexible printed circuit for at least some of the packages 510, the desired vertical and horizontal communication capability is imparted to the electronic systems, thereby also providing advantages as discussed above, for instance by reducing the complexity of the routing in the corresponding PCBs of the system 500.

Figure 5F:
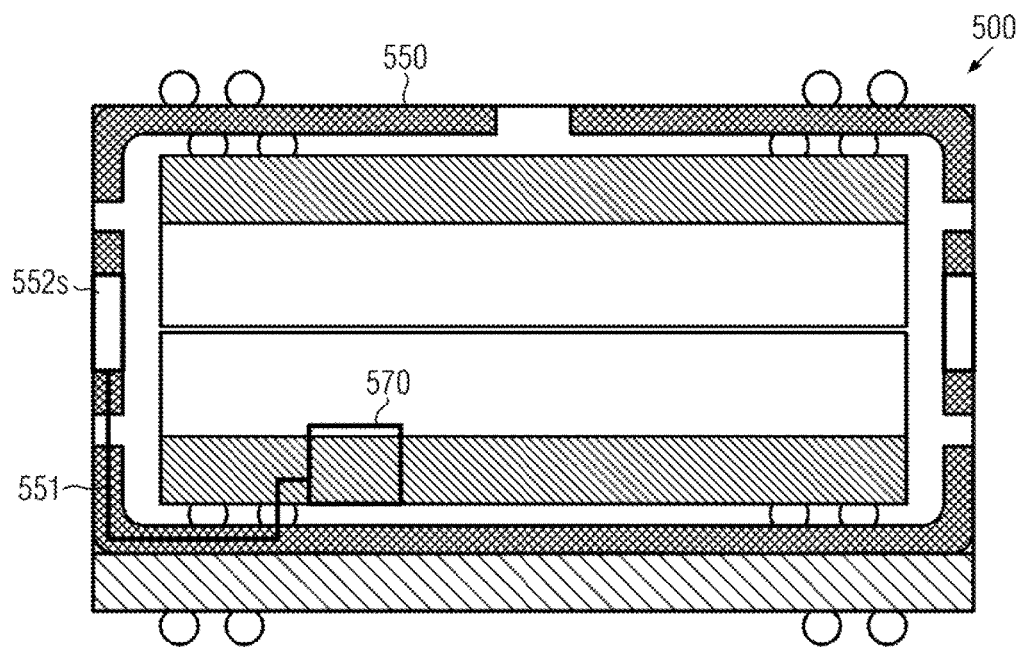

As shown in FIG. 5f, also wireless communication capabilities may be implemented in the mechanism 550 by configuring some of the pads 552s as appropriate antennas, which are coupled by the communication structure 551 with an appropriate transceiver circuit 570, according to an embodiment.

Figure 6A:
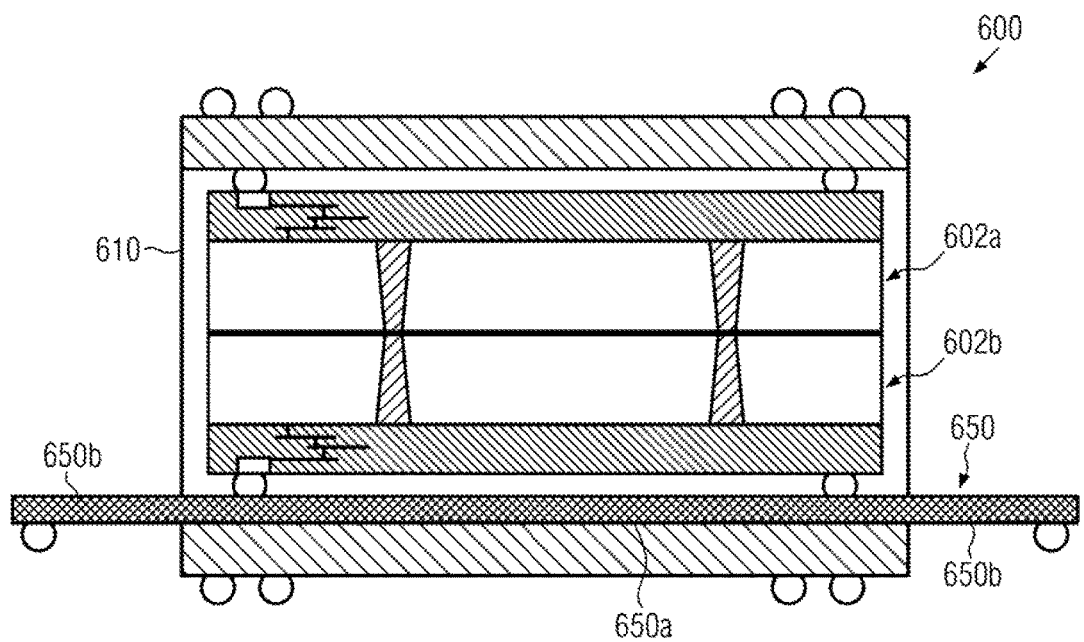
FIGS. 6a to 6l schematically illustrate cross-sectional views of electronic systems formed on the basis of an interface portion provided within and outside of a package in order to increase coupling in the horizontal direction, according to an embodiment.

FIG. 6a schematically illustrates a further embodiment, wherein in the system 600 communication mechanism 650 may be provided so as to be positioned partly within a package 610 and partly outside of the package 610. As shown, one or more ICs 602a, 602b may be provided in the package 610 and may be coupled via any appropriate communication mechanism in order to allow signal exchange between the one or more ICs within the package 610. Furthermore, the communication mechanism 650 is provided so as to have a first portion 650a that may be located within the package 610 and may couple to one or more of the ICs 602a, 602b. In the example shown, the first portion 650a may couple to the IC 602b, for instance, by providing an appropriate communication structure (not shown) within the material of the mechanism 650. For example, a flexible insulating material or any other appropriate material may be provided and may have incorporated therein corresponding conductive regions, as is also discussed above. Furthermore, a second portion 650b may extend to the outside of the package 610 and may thus form corresponding appendices, which may also include a portion of the communication structure and have formed thereon appropriate communication pads (not shown), as is for instance also discussed above in the previous embodiments.

Figure 6B:
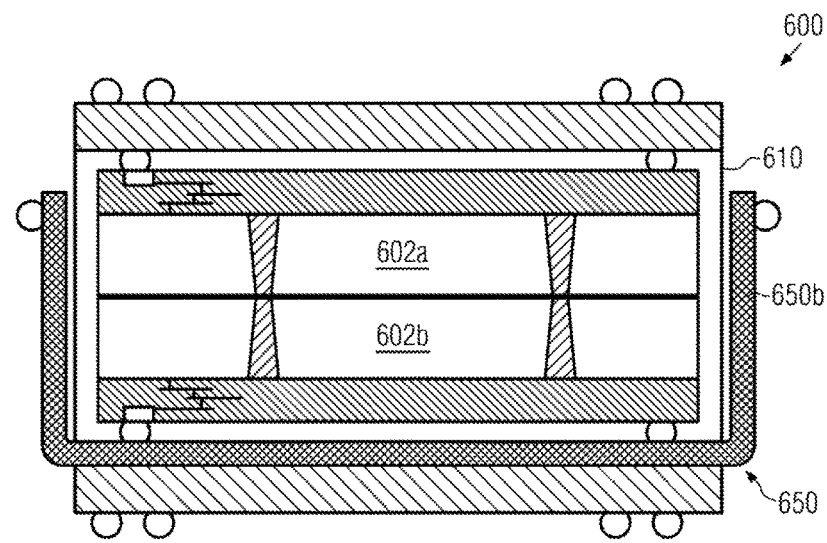

FIG. 6b schematically illustrates the system 600 after the second portion 650b has been treated in order to extend above side surfaces of the package 610 and thus also above side surfaces of at least some of the ICs 602a, 602b, according to an embodiment. The second portion 650b may be brought into the final configuration by any appropriate technique, for instance by heat forming, which may be applied prior to or after manufacturing the package 610. Consequently, the second portion 650b imparts horizontal communication capabilities to the package 610, thereby allowing appropriate combination of a plurality of packages 610 in order to form a complex electronic system.

Figure 6C:
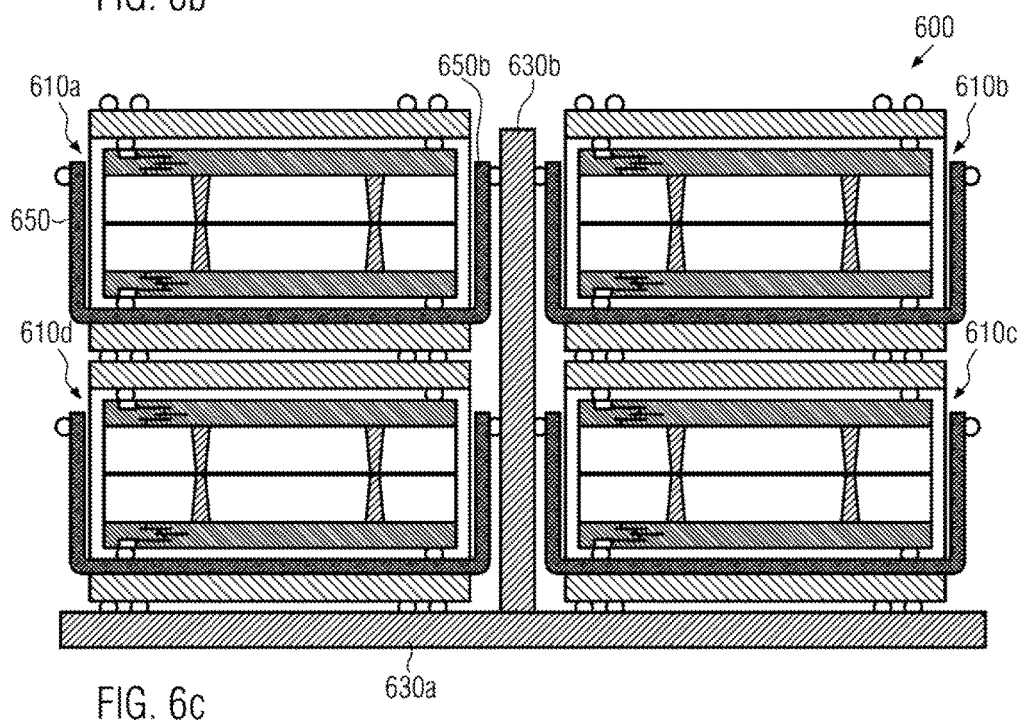

FIG. 6c schematically illustrates the electronic system 600, in which a plurality of packages 610a, . . . , 610d are combined by any appropriate contact type and are also coupled to PCBs 630a, 630b, respectively, according to an embodiment. For example, the horizontal communication capability provided by the communication mechanism 650, i.e., by the corresponding second portions thereof 650b, may enable a highly efficient coupling to the verticality arranged PCB 630b, while vertical communication capabilities of the individual packages 610a, . . . , 610d may enable a coupling to the PCB 630a.

In further embodiments, the PCBs 630b, 630a may also be provided with appropriate coupling so as to couple to each other, thus further increasing coupling of the system 600 and reducing the requirement for further external wired and wireless couplings.

Figure 6D:
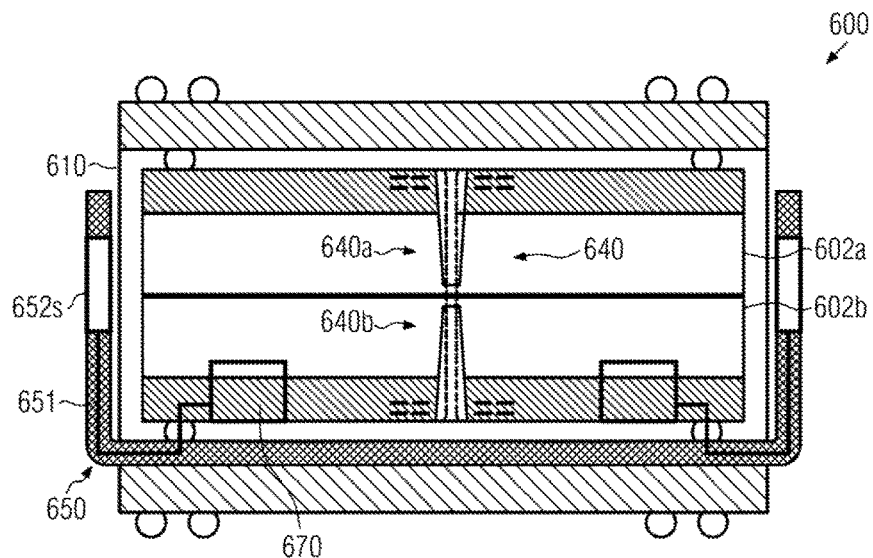

FIG. 6d schematically illustrates the system 600, in which the wireless communication structure 640 may provide for transfer of signals and/or energy between at least some of the ICs in the package 610, according to an embodiment. For example, the wireless communication structure 640 may include a first portion 640a formed in the IC 602a and an appropriately positioned portion 640b formed in the IC 602b. The structure 640 may be formed so as to facilitate energy transfer and/or signal exchange. To this end, for example, a magnetic TSV may be provided in the corresponding portions 640a, 640b, where inside the structure 640 an antenna of the inductive type may be provided close to the magnetic core of the magnetic TSV. In order to further enhance the wireless communication capabilities of the system 600, also the wireless communication channel may be established on the basis of the communication mechanism 650, for instance by coupling a transceiver circuit 670 to a communication pad 652s by means of a communication structure 651, thereby providing antennas positioned external to the package 610.

Figure 6E:
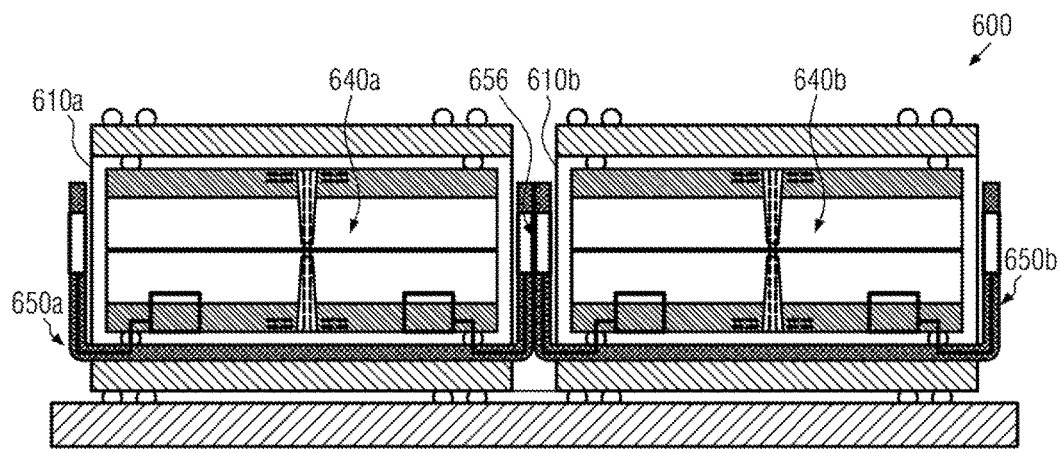

FIG. 6e schematically illustrates the system 600, wherein packages 610a, 610b are positioned laterally adjacent to each other, thereby enabling horizontal communication by means of the wireless communication path 656, according to an embodiment. In this manner, complexity of any PCBs may further be reduced, since a high degree of wireless communication and even energy transfer may be established within the system 600.

Figure 6F:
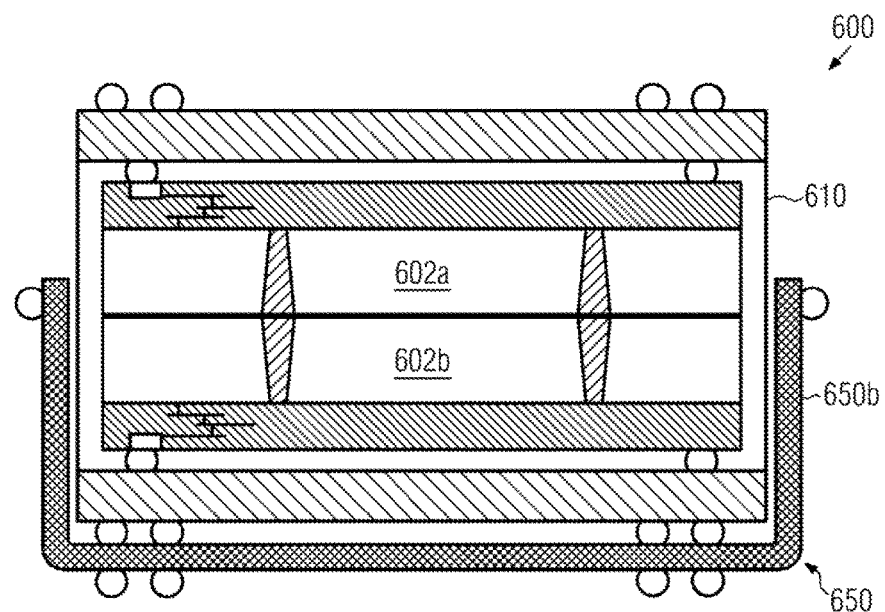

FIG. 6f schematically illustrates the system 600, wherein the communication mechanism 650 is entirely positioned outside of the package 610, according to an embodiment. Moreover, the ICs, for instance ICs 602a, 602b, may be coupled by any appropriate mechanism, for instance by direct bonding, as shown in FIG. 6f, or by any other appropriate contact regime, such as wireless communication, as discussed above. On the other hand, the horizontal communication capability of the package 610 is still provided by the portion 650b as also discussed above, but here the mechanism 650 is external to the package 610.

Figure 6G:
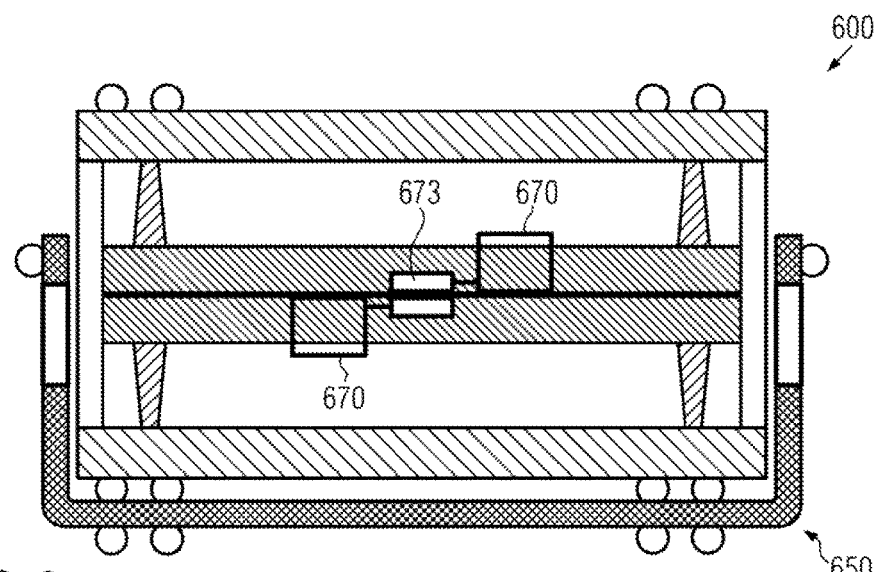

FIG. 6g schematically illustrates the system 600, which includes the external communication mechanism 650, while package-internal communication of the ICs may be accomplished by wireless communication paths established by respective antennas 673 and associated transceiver circuits 670, according to an embodiment.

Figure 6H:
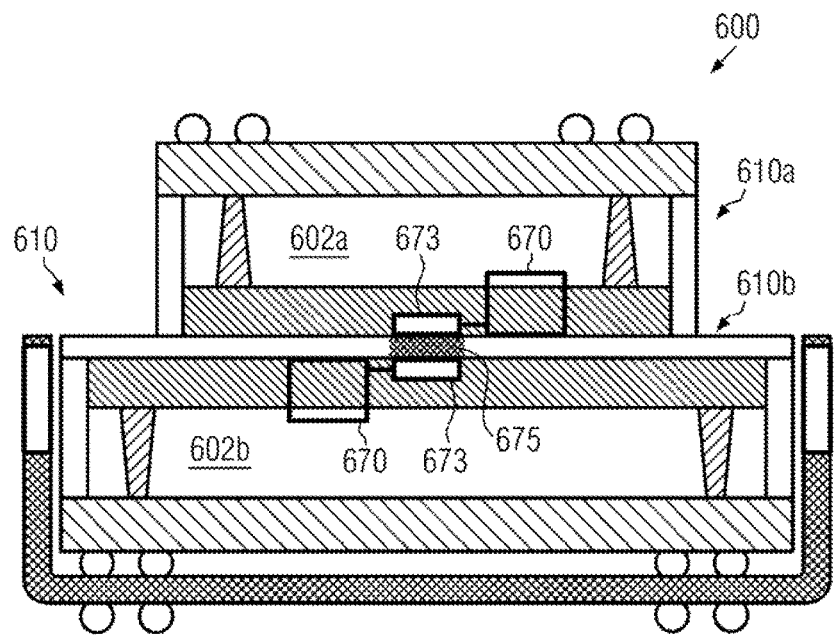

FIG. 6h schematically illustrates a generic package 610 of the system 600, in which the various ICs of different sizes are combined in a stacked configuration and communicate through wireless interfaces, according to an embodiment. To this end, the generic package 610 may be divided into at least two sub-packages 610a, 610b.

The ICs 602a, 602b communicating through wireless communication provided by respective transceiver circuits 670 and antennas 673 may have positioned the respective antennas 673 at an exposed surface area of the respective sub-package in order to promote the wireless signal exchange. In some illustrative embodiments, a material 675 may be present between the two sub-packages, which further improves the wireless communication. For example, the material 675 may include appropriate particles of a suitable type for improving the communication between the two antennas. For example, the particles may have magnetic properties if the antennas 673 are of the inductive type. On the other hand, the particles have conductive properties if the antennas 673 are of the capacitive type.

Figure 6I:
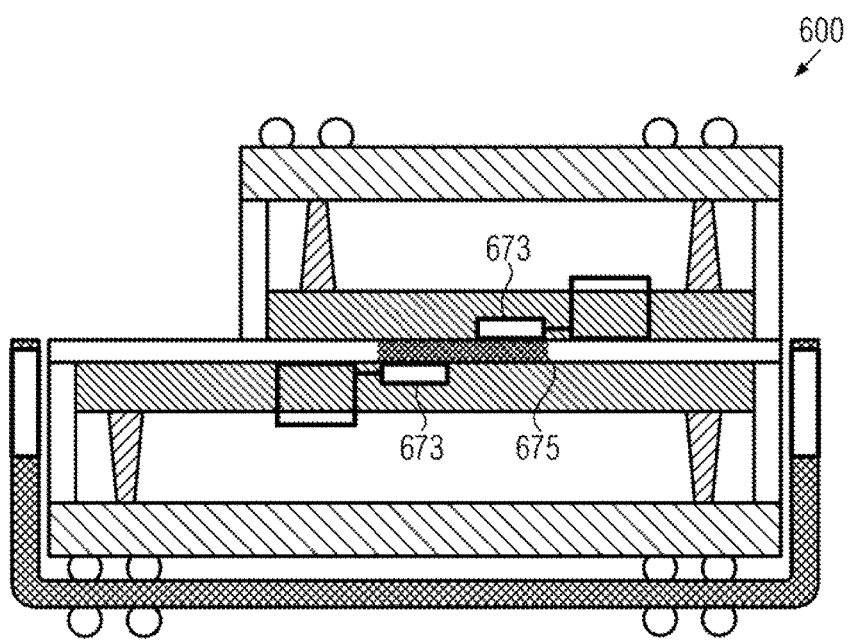

FIG. 6i schematically illustrates an embodiment, in which, for instance, the overall configuration of the system 600 dictates a non-aligned positioning of the antennas 673. For example, one of the ICs may be positioned laterally offset with respect to the other IC. In this case, the particles within the material 675 may be used to form strips inside the carrier material 675, thereby still providing for efficient wireless communication, even if the antennas are provided off axis. In this case, the appropriately configured material 675, for instance including specifically selected particles, may represent a communication mechanism that provides for vertical and horizontal communication.

Figure 6J:
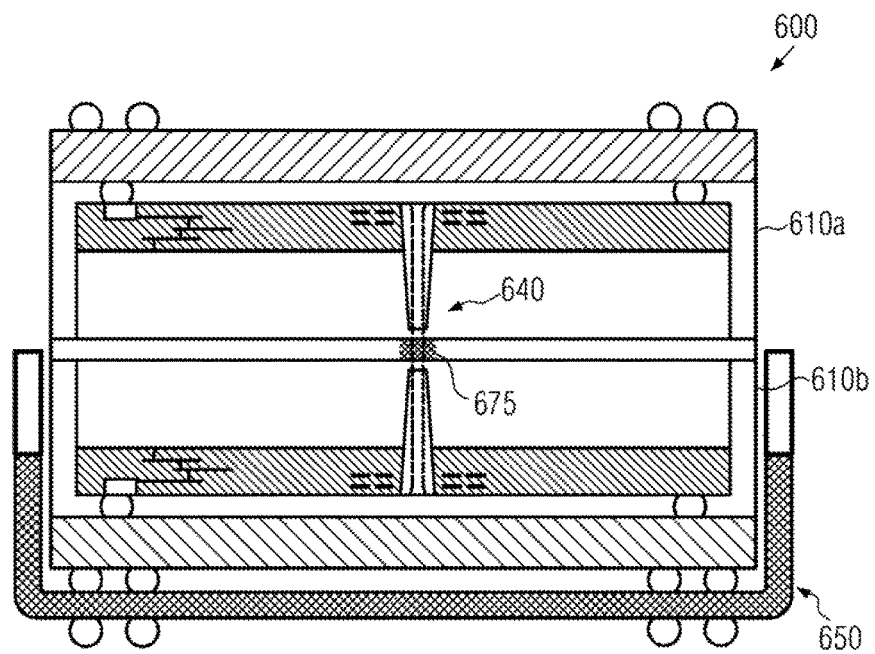

FIG. 6j schematically illustrates an embodiment of the system 600, in which the wireless communication between individual ICs may be established on the basis of very complex structures, such as the wireless communication structure 640, as discussed above. To this end, each of the associated ICs may have an appropriate portion, for instance in the form of magnetic TSV, so as to allow even energy transfer between the individual ICs. Also in this case, an appropriate material 675 may be provided at an interface, thereby providing for superior mechanical adhesion of respective packages without unduly deteriorating the efficiency of the wireless contact structure 640. For example, soft-magnetic particles may be incorporated into the material 675 in an appropriately spatially adjusted manner so as to improve the coupling between the various elements of the structure 640. Hence, by increasing the wireless communication and energy transfer capabilities of the various packages, an increased degree of modularity may be achieved.

Figure 6K:
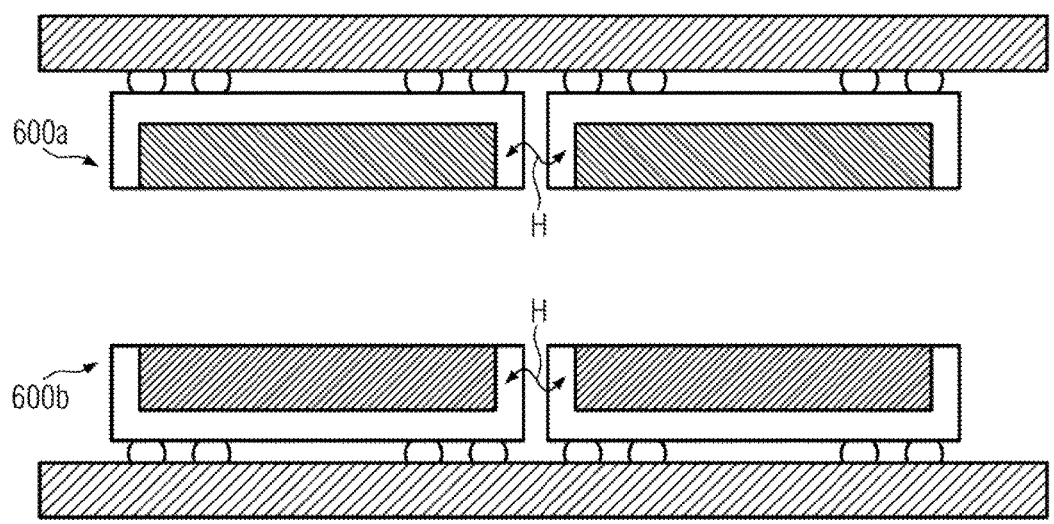

FIG. 6k schematically illustrates a system 600 in a non-assembled stage, according to an embodiment, wherein the first portion 600a may have any appropriate configuration, for instance a plurality of packages or ICs communicating with each other, for instance as indicated by the horizontal communication H. Similarly, the second portion 600b may be provided and may have an appropriate configuration, wherein also a desired communication may be established between the various components of the portion 600b. It should be appreciated that due to the modularity of the system 600 any appropriate components may be combined or may be replaced with other components so as to increase overall flexibility in designing complex electronic systems on the basis of a limited number of different components. In other cases, the modular nature of the system 600 may enhance the process of assembling the system 600.

Figure 6L:
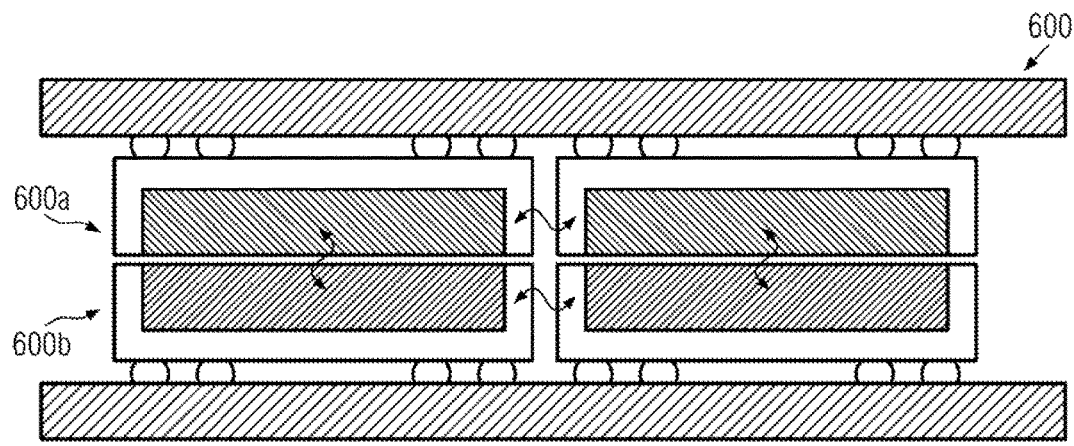

As shown in FIG. 6l, by bringing the various parts of the modular system close to each other, it is thus possible to establish and improve their wireless communication, thereby forming a compact, reliable, and easy-to-repair electronic system, according to an embodiment.

Figure 7A:
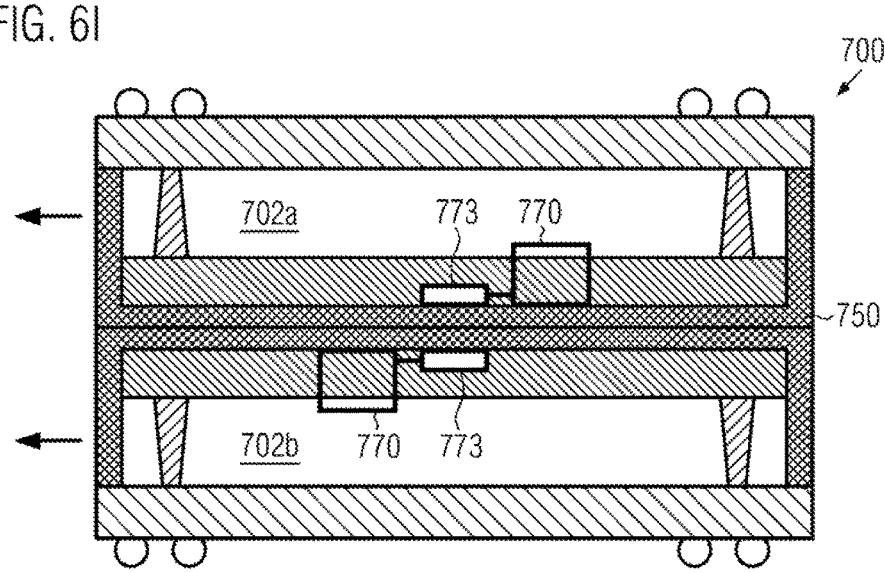
FIGS. 7a and 7b schematically illustrate cross-sectional views of an electronic system, in which the communication structure and the communication pad are provided in the form of a continuous material having appropriate characteristics for conveying signals, according to an embodiment.

FIG. 7a schematically illustrates an electronic system 700 according to further illustrative embodiments, in which vertical and horizontal communication may be established on the basis of the communication mechanism 750 including a continuous material that enables wireless communication in both the vertical and horizontal directions. As shown, the system 700 may include a plurality of ICs 702a, 702b including corresponding circuits 770 in combination with antennas 773 in order to provide for wireless communication. To this end, the communication mechanism 750 may be provided so as to be positioned at least partially above side surfaces and at least one major surface of the corresponding IC, thereby enabling the wireless contacting of the respective transceiver circuits 770 via the associated antenna 773. For example, the mechanism 750 may include an appropriate material including particles of an appropriate type, as previously discussed, that imparts the desired signal transmission properties to the carrier material. For example, the base material in the form of any appropriate dielectric material, such as the molding material, may appropriately be prepared by incorporating a desired type of particles so as to obtain continuous areas in the carrier material so as to cover significant portions of surface areas of the corresponding IC. For example, the particles, such as conductive particles, magnetic particles, and the like may be provided within a carrier material, such as the molding material, thereby providing for substantially continuous conductive or magnetic characteristics so that the mechanism 750 may appropriately couple to the associated antenna 773. Since any particles may be distributed in a substantially continuous manner within at least a significant and continuous portion of the mechanism 750, a corresponding coupling is established to any adjacent IC or package including appropriate mechanisms for coupling to the mechanism 750. In the example shown in FIG. 7a, the ICs 702a and 702b may include or may be associated with a corresponding communication mechanism 750, thereby providing for vertical wireless communication between these ICs, while also providing for horizontal communication capabilities, since the continuous material of the mechanism 750 is also provided above side surfaces of the ICs.

Figure 7B:
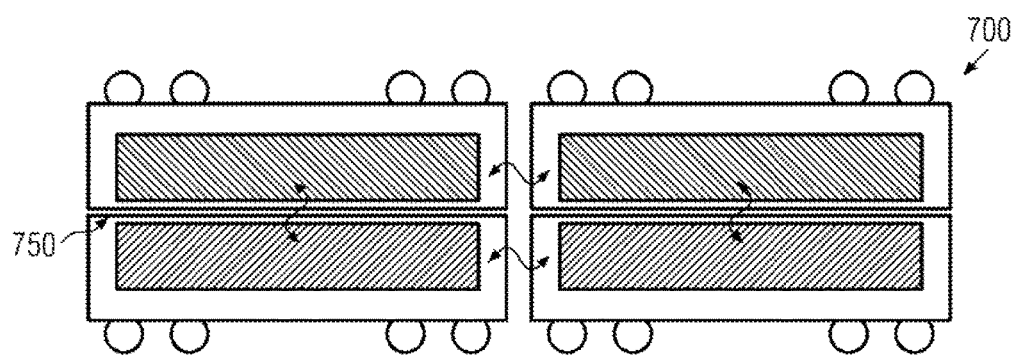

FIG. 7b schematically illustrates the system 700, in which horizontal and vertical communication may be established on the basis of the communication mechanisms 750, as discussed above, according to an embodiment.

As a result, an embodiment provides electronic systems, in which coupling is enhanced by using a communication mechanism that at least provides for horizontal communication capabilities without deteriorating electrical integrity of integrated-circuit chips. The illustrative embodiments described above may be modified and varied according to requirements of complex electronic systems, for instance, by selecting any appropriate number of integrated-circuit chips of the same or different type. Furthermore, different types of communication mechanisms may be implemented in the same electronic system, if considered appropriate. For example, any such hybrid configuration may include the communication mechanism 350, as discussed above, in combination with one or more of the communication mechanisms 450, 550, 650, and 750. Furthermore, the degree of wireless communication may be selected in accordance with the overall requirements, for instance in terms of complexity of individual ICs, the compatibility with manufacturing techniques for providing certain types of circuit portions as may be required for wireless communication channels, and the like. Furthermore, the electronic systems including one or more of the above-identified communication mechanisms may also readily be combined with any conventional contact regimes in order to obtain the desired high degree of coupling within a complex electronic system.

Hence, coupling of ICs and packages may be considerably increased, thus reducing the dimensions of the electronic systems, while also reducing complexity of the routing in PCBs and reducing the requirement for complex external wired and wireless couplings for coupling PCBs of the electronic system, according to an embodiment.

Due to the superior coupling, the electronic systems may be designed so as to operate at high frequencies, while nevertheless a high reliability is guaranteed, according to an embodiment.

Furthermore, the level of standardization among the various ICs, packages and systems is thus increased, thereby resulting in a highly efficient manufacturing and assembling techniques, according to an embodiment.

Moreover, ICs as described above may be coupled to each other or to one or more other components to form an electronic system, such as a computer system, according to an embodiment. One or more of the ICs may be, or may include, a computing circuit such as a microprocessor or a microcontroller.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A system, comprising:
   a first integrated circuit, including:
     a first integrated circuit die;
     a first metallization layer mounted to a top surface of the first integrated circuit die;
     a first dielectric layer having a first side portion disposed in contact with a peripheral side surface of both the first integrated circuit die and the first metallization layer and further having a first non-side portion disposed in contact with a top surface of the first metallization layer, and
     a first communication pad disposed along the first side portion; and
   a second integrated circuit, including:
     a second integrated circuit die;
     a second metallization layer mounted to a top surface of the second integrated circuit die;
     a second dielectric layer having a second side portion disposed in contact with a peripheral side surface of both the second integrated circuit die and the second metallization layer that is facing the first side portion and further having a second non-side portion disposed in contact with a top surface of the second metallization layer, and
     a second communication pad disposed along the second side portion and coupled to the first communication pad.

2. The system of claim 1 wherein one of the first and second integrated circuits includes a computing circuit.

3. The system of claim 1, further comprising a package within which the first and second integrated circuits are disposed.

4. The system of claim 1, further comprising a circuit board disposed between the first side portion of the first dielectric layer and the second side portion of the second dielectric layer.

* * * * *